United States Patent
Yamamoto et al.

(10) Patent No.: US 7,076,867 B2
(45) Date of Patent: Jul. 18, 2006

(54) PRESSURIZING METHOD

(75) Inventors: Akihiro Yamamoto, Kobe (JP); Sakae Kobayashi, Hirakata (JP); Yoshikazu Yoshimura, Kyoto (JP); Naoto Hosotani, Osaka (JP); Kenji Takahashi, Suita (JP); Hiroshi Nasu, Neyagawa (JP); Naomi Kaino, Hirakata (JP); Hidenobu Nishikawa, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 312 days.

(21) Appl. No.: 10/327,176

(22) Filed: Dec. 24, 2002

(65) Prior Publication Data
US 2003/0145459 A1   Aug. 7, 2003

(30) Foreign Application Priority Data
Dec. 28, 2001  (JP)  .............................. 2001-400758
Dec. 28, 2001  (JP)  .............................. 2001-400789

(51) Int. Cl.
*H05K 3/30*  (2006.01)
(52) U.S. Cl. ............................ 29/832; 29/833; 29/834; 29/854; 29/738; 156/269; 156/310; 228/106; 228/180.22; 228/234.1
(58) Field of Classification Search .................. 29/729, 29/731, 738, 739, 830–840, 843, 564.6, 566, 29/566.1; 228/8, 28, 102, 234.1, 235.2, 245, 228/246, 106, 180.22; 156/251, 310, 269
See application file for complete search history.

(56) References Cited

U.S. PATENT DOCUMENTS

| | | | | |
|---|---|---|---|---|
| 4,913,336 A | * | 4/1990 | Yamazaki | 228/106 |
| 5,478,006 A | * | 12/1995 | Taguchi | 228/180.21 |
| 5,600,359 A | * | 2/1997 | Kikuchi | 347/171 |
| 5,716,687 A | * | 2/1998 | Chumbley et al. | 428/41.8 |
| 6,269,999 B1 | * | 8/2001 | Okazaki et al. | 228/110.1 |
| 6,458,237 B1 | * | 10/2002 | Tsunoi et al. | 156/310 |
| 6,755,930 B1 | * | 6/2004 | Fukuda et al. | 156/251 |

FOREIGN PATENT DOCUMENTS

| | | |
|---|---|---|
| JP | 01-117285 | 5/1989 |
| JP | 02-293721 | 12/1990 |
| JP | 2001-24032 | 1/2001 |
| JP | 2001-294361 | 10/2001 |
| KR | 1998-20107 | 6/1998 |
| KR | 2000-42743 | 7/2000 |

* cited by examiner

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

A pressurizing method for pressurizing a second component arranged on a first component, against the first component by using a pressurizing apparatus having a stage on which the first component is mounted, a tool, and a protection sheet supplying section. The tool is disposed so as to face the stage and moved between a first position at which the tool faces the first and second components while spaced therefrom, and a second position at which the tool is biased toward the stage to pressurize the second component against the first component. When the tool is at the second position, the protection sheet supplying section supplies a protection sheet so that the protection sheet is placed between the second component and the tool.

16 Claims, 35 Drawing Sheets

PRESSURIZING METHOD

BACKGROUND OF THE INVENTION

The present invention relates to a pressurizing apparatus and a pressurizing method for pressurizing bonding sheets including anisotropic conductive film tape (ACF tape), film-like components including flexible printed circuit boards (FPC boards), electronic components, optical components, and the like against a first component, such as a plasma display panel board (PDP board) or a liquid crystal display board (LCD board). The pressurizing apparatus comprises a bonding tape applying apparatus, such as an anisotropic conductive film applying apparatus (ACF applying apparatus), and a final-press bonding apparatus.

A component mounting apparatus for mounting film-like components, such as FPC boards, onto a plate-like component, such as a PDP board or an LCD board, comprises an ACF applying apparatus, a pre-press bonding apparatus and a final-press bonding apparatus. In the ACF applying apparatus, an anisotropic conductive film layer (ACF layer) of an ACF tape is applied to a plate-like component. In the pre-press bonding apparatus, after a film-like component is positioned with respect to the plate-like component, the film-like component is pressurized by a predetermined pressurizing force while being heated. As a result, the film-like component is pre-press bonded to the plate-like component by the ACF layer. In the final-press bonding apparatus, the film-like component is pressurized by a pressurizing force larger than that of the pre-press bonding apparatus while being heated. As a result, the film-like component is fixed to the plate-like component by the ACF layer.

As shown in FIG. 35, in the ACF applying apparatus, an ACF tape 5 is supplied to a plate-like component 3 mounted on a stage 1. Since a cover layer (not shown) of the ACF tape 5 has been stripped beforehand, ACF layer 5b of the ACF tape 5 is exposed and faces the plate-like component 3. In addition, on the left side (as shown in the figure) of the ACF tape 5, only the ACF layer 5b is cut and a slit 6 is formed so that base layer 5a of the ACF tape 5 remains uncut. This slit 6 corresponds to a left fringe 7a (as shown in the figure) of a tool 7. The tool 7 is provided with a cover layer 8 made of an elastic material, such as silicone, at a portion making contact with the base layer 5a of the ACF tape 5. In addition, the tool 7 is provided with a heater (not shown) for heating. The ACF layer 5b is pressurized against the plate-like component 3 by the tool 7 while being heated, whereby the ACF layer 5b is applied to the plate-like component 3. After the tool 7 is moved upward and withdrawn from the stage 1, the base layer 5a is stripped from the plate-like component 3 by a stripping mechanism (not shown), and only the ACF layer 5b is left on the plate-like component 3.

The above-mentioned final-press bonding apparatus comprises a stage on which a plate-like component with a film-like component having already been pre-press bonded by the pre-press bonding apparatus, and a tool for pressurizing the film-like component against the plate-like component. Just like the tool of the ACF applying apparatus, the tool of the final-press bonding apparatus is equipped with a cover layer, made of an elastic material, for making distribution of a pressurizing force uniform, and a heater for heating. The tool is used to pressurize the film-like component against the plate-like component.

Problems caused when attaining appropriate application of the ACF layer 5b to the plate-like component 3 by using the ACF applying apparatus are divided mainly and broadly into the following two problems.

A first problem relates to the cover layer 8 of the tool 7. In the ACF applying apparatus, while work for applying the ACF layer 5b is repeated, the cover layer 8, deteriorated owing to influence of heat and pressure, is stripped from the tool 7. If this stripping of the cover layer 8 occurs, distribution of a pressurizing force applied to the ACF layer 5b becomes non-uniform, whereby the ACF layer 5b cannot be applied accurately to the plate-like component 3. Since stress concentration occurs at the fringe 7a of the tool 7 during pressurizing, the cover layer 8 is apt to be stripped in particular. If the cover layer 8 is stripped at the fringe 7a, the ACF layer 5b may be torn in the vicinity of the slit 6 as shown in FIG. 36, and this torn portion 9 may protrude from the slit 6. In addition, while work for applying the ACF layer 5b by the tool 7 is repeated, dust generated from materials and the like of a binder of the ACF layer 5b and protruding from the base layer 5a adheres to the tool 7. This dust also impairs appropriate application of the ACF layer 5b.

Tool exchange required in a case of stripping of the cover layer and adhesion of dust may cause some problems. First, when exchanging the tool, it is necessary to stop operation of the component mounting apparatus and to wait until a temperature of the tool lowers to such an extent that the tool can be handled with hands of an operator. In addition, it is necessary to accurately adjust parallelism between the tool and the stage after this exchange. This adjustment is complicated and takes a long time. In a case of a large-size component mounting apparatus for PDP boards in particular, an operator must enter the component mounting apparatus and exchange the tool. This exchange work is complicated.

Just as in the case of the ACF applying apparatus, even in the case of the final-press bonding apparatus, final-press bonding of the film-like components to plate-like components is repeated, whereby stripping of the cover layer from the tool and adhesion of dust to the tool are caused, resulting in impairing accurate fixing of the film-like components with respect to the plate-like components.

A second problem relates to a temperature of the ACF layer 5b. In the conventional ACF applying apparatus, the base layer 5a is stripped immediately after the ACF layer 5b is heated and pressurized by the tool 7. Since the ACF layer 5b is softened by a temperature rise immediately after this heating, a joining force applied to the plate-like component 3 lowers. Therefore, at a time when the base layer 5a is stripped, a joining force between the ACF layer 5b and the plate-like component 3 may become lower than a joining force between the ACF layer 5b and the base layer 5a. As a result, the ACF layer 5b may be stripped partially from the plate-like component 3, or the ACF layer 5b in its entirety may be stripped completely from the plate-like component 3.

Since the slit 6 corresponds to the fringe 7a of the tool 7, a pressurizing force applied by the tool 7 in the vicinity of the slit 6 becomes non-uniform, whereby sufficient joining strength may not be obtained between the ACF layer 5b and the plate-like component 3. Hence, at this portion of the slit 6, the ACF layer 5b is apt to be stripped from the plate-like component 3, or the ACF layer 5b is apt to be torn.

In addition, since an end of the ACF tape 5 is held during pressurizing and heating performed by the tool 7, relatively high tension is applied to the ACF tape 5. Hence, if a temperature of a portion in the vicinity of the slit 6 rises excessively, the ACF tape 5 becomes longer, whereby a position of the slit 6 changes. Owing to this change in the position of the slit 6, a position of a front end of the ACF layer 5b changes at a time of a next application thereof.

Hence, the ACF layer 5b cannot be applied to a predetermined accurate position with respect to the plate-like component 3.

Accordingly, the present invention is intended to solve the problems encountered in the conventional ACF applying apparatus and the conventional final-press bonding apparatus described above. More specifically, one object of the present invention is to perform highly accurate pressurizing while significantly reducing a frequency of tool exchange in a pressurizing apparatus for pressurizing one component against another component by using a tool, such as an ACF applying apparatus and a final-press bonding apparatus of a component mounting apparatus. In addition, another object of the present invention is to securely apply a bonding layer (ACF layer) of a bonding sheet (ACF tape) to an object without being stripped.

SUMMARY OF THE INVENTION

A first aspect the present invention provides a pressurizing method for pressurizing a second component against a first component, comprising: arranging the second component on the first component; and repeatedly moving a heated tool between a first position, at which the tool faces the first and second components with space therebetween, and a second position, at which the tool pressurizes the second component against the first component via a protection sheet.

More specifically, each time the tool reciprocates between the first position and the second position, the first and second components are exchanged, and a number of times the tool is moved to the second position is counted. When the number of times reaches a predetermined number of times, the protection sheet is fed. Hence, before the protection sheet deteriorates, a new and unused portion of the protection sheet can face the tool, whereby the second component can be pressurized against the first component by applying a pressurizing force having a uniform distribution without exchanging the tool.

The protection sheet is made of a material having elasticity, high heat conductivity and heat resistance. An insulated rubber sheet having high heat conductivity and containing, for example, silicone or Teflon®, can be used as the protection sheet.

It is preferable that the protection sheet faces the tool with space provided therebetween when the tool is at the first position. By providing the space between the protection sheet and the tool placed at the first position, the protection sheet is naturally cooled by heat exchange with surrounding air. As a result, a temperature of the protection sheet is prevented from rising excessively.

In addition, it is preferable that the protection sheet is cooled by spraying gas thereto when the tool is at the first position. This can effectively prevent the temperature of the protection sheet from rising excessively.

The first component is a plate-like component, and the second component is a bonding sheet having at least a base layer and a bonding layer, for example.

In this case, it is preferable that the protection sheet and the bonding sheet are supplied from rolls and that a direction of supplying the protection sheet and a direction of supplying the bonding sheet are opposite to each other. By this setting of these supplying directions, the bonding sheet is prevented from being pulled by the protection sheet and displaced.

It is preferable that, when the tool is at the first position, the tool cuts only a bonding layer of the bonding sheet and a slit is formed so that a base layer remains uncut and that, when the tool is at the second position, the protection sheet is guided in a direction away from a stage so as to make close contact with a fringe of the tool corresponding to the slit. The protection sheet can thus securely make close contact with the fringe of the tool, whereby distribution of a pressurizing force at this portion can be made uniform securely.

When the tool is at the second position, the portion of the protection sheet corresponding to the slit may be cooled by spraying gas. Since the fringe of the tool makes contact with a portion of the protection sheet corresponding to the slit, a relatively large pressurizing force is applied to the portion in comparison with other portions, whereby the portion is apt to deteriorate. Hence, by cooling the portion by spraying air thereto, deterioration of the protection sheet can be prevented effectively.

The first component may be a plate-like component, and the second component may be a film-like component.

A second aspect of the present invention provides a pressurizing apparatus for pressurizing a second component onto a first component, comprising: a stage on which the first component is arranged; a tool disposed so as to face the stage; a tool driving section for moving the tool between a first position, at which the tool faces the first and second components with space therebetween, and a second position, at which the tool is biased toward the stage to pressurize the second component against the first component; a protection sheet storage section for storing a protection sheet so as to be able to feed the protection sheet, a protection sheet recovery section for recovering the protection sheet, a protection sheet guide section for guiding the protection sheet from the protection sheet storage section to the protection sheet recovery section through a lower side of the tool, and a protection sheet feeding section for feeding the protection sheet to the protection sheet recovery section along the protection sheet guide section.

A third aspect of the present invention provides a pressurizing method for pressurizing a bonding sheet against a plate-like component, comprising: supplying the bonding sheet so that a bonding layer of the bonding sheet faces the plate-like component; cutting the bonding layer of the bonding sheet to form a slit; heating the bonding layer divided by the slit while pressurizing the bonding layer against the plate-like component by use of a tool; cooling a portion of the bonding layer of the bonding sheet adhering to the plate-like component by a bonding force of the bonding layer during or after pressurizing and heating the bonding layer, or thereafter; and stripping a base layer from the plate-like component.

It is preferable that a portion of the bonding layer of the bonding sheet adhering to an object by virtue of the joining force of the bonding layer is cooled by spraying gas. By cooling the bonding layer of the bonding sheet, a joining strength between the bonding layer and the plate-like component increases. For this reason, at a time when the base layer is stripped from the plate-like component, a problem of resulting in partial or entire stripping of the bonding layer from the object, because a joining force between the bonding layer and the plate-like component becomes lower than a joining force between the base layer and the bonding layer, can be prevented.

The above-mentioned cooling may be performed by spraying gas. In this case, ions may be included in the gas. In a case where the ions are included, static electricity is eliminated, by action of the ions, from the object to be joined, whereby static damage to the object to be joined can be prevented.

In a case where the plate-like component is equipped with conductors and an electrode section formed on first ends of the conductors, and when a bonding sheet is pressurized against the electrode section, it is preferable that gas is sprayed to the plate-like component in a direction from other ends of the conductors to the first ends thereof. In a case where the plate-like component is an LCD board, for example, it is preferable that gas is sprayed from ends of driver voltage supply lines, on a side of an LCD section, to ends thereof on a side of the electrode section. In this case, waste on the plate-like component can be eliminated by blowing it off by using sprayed gas. The waste of this kind is waste generated from the ACF tape, glass chips generated from the LCD board, and the like.

Instead of gas, a refrigerant may be supplied to the tool to cool the bonding sheet via the tool. It is preferable that heating of the tool is stopped when the refrigerant is supplied, in particular. In this case, a cooling efficiency of the tool by using the refrigerant is improved, whereby a cooling speed of the bonding layer can be increased.

Gas may be sprayed toward the slit of the bonding sheet to perform cooling. Since the slit corresponds to the fringe of the tool, a pressurizing force applied by the tool may become non-uniform, whereby sufficient joining strength may not be obtained between the bonding layer and the plate-like component. Hence, when the base layer is stripped, the bonding layer is apt to be stripped from the plate-like component or the bonding layer is apt to be torn at a portion of the slit, because a joining force between the bonding layer and the plate-like component becomes lower than a joining force between the base layer and the bonding layer. However, by cooling the portion of the slit of the bonding sheet by spraying gas, the joining force between the bonding layer and the plate-like component is improved, whereby stripping or tearing of the bonding layer at the portion of the slit can be prevented.

In addition, high tension is applied to the bonding sheet when pressurizing and heating are performed by the tool. Hence, if a temperature of the portion in the vicinity of the slit rises excessively, the bonding sheet becomes longer, whereby a position of the slit changes. Owing to the change in the position of the slit, a position of a front end of the bonding layer changes at a time of a next application thereof. Hence, the bonding layer cannot be applied to a predetermined accurate position with respect to a plate-like component. However, by performing cooling by spraying gas to the portion of the slit of the bonding sheet, a temperature of the portion is prevented from rising excessively. As a result, a change in the position of the slit owing to elongation of the bonding sheet is prevented, whereby the bonding layer can be applied to a predetermined accurate position with respect to the plate-like component.

A fourth aspect of the present invention provides a pressurizing apparatus for pressurizing a bonding sheet against a plate-like component, comprising: a stage on which the plate-like component is arranged; a tool disposed so as to face the stage; a tool driving section for moving the tool between a first position, at which the tool faces the plate-like component and the bonding sheet with space therebetween, and a second position at which the tool is biased toward the stage to pressurize the bonding sheet against the plate-like component; a bonding sheet storage section for storing the bonding sheet so as to be able to feed the bonding sheet; a bonding sheet recovery section for recovering the bonding sheet; a bonding sheet guide section for guiding the bonding sheet from the bonding sheet storage section to the bonding sheet recovery section through a lower side of the tool; a bonding sheet feeding section for feeding the bonding sheet to the bonding sheet recovery section along the bonding sheet guide section; and a bonding sheet cooling section for cooling the bonding sheet.

BRIEF DESCRIPTION OF THE DRAWINGS

Other objects and features of the present invention will be apparent from the following descriptions taken in connection with preferred embodiments referring to the accompanying drawings.

FIGS. 30A–30C are perspective views illustrating operation of a bonding sheet applying apparatus in accordance with the fourth embodiment; wherein FIG. 30A is a view showing a state of pressurizing and heating by using a tool, FIG. 30B is a view showing a state before stripping of a base layer after completion of pressurizing and heating by using the tool, and FIG. 30C is a view showing a state after completion of the stripping of the base layer;

DETAILED DESCRIPTION OF THE PREFERRED EMBODIMENTS

First Embodiment

Figure 1:
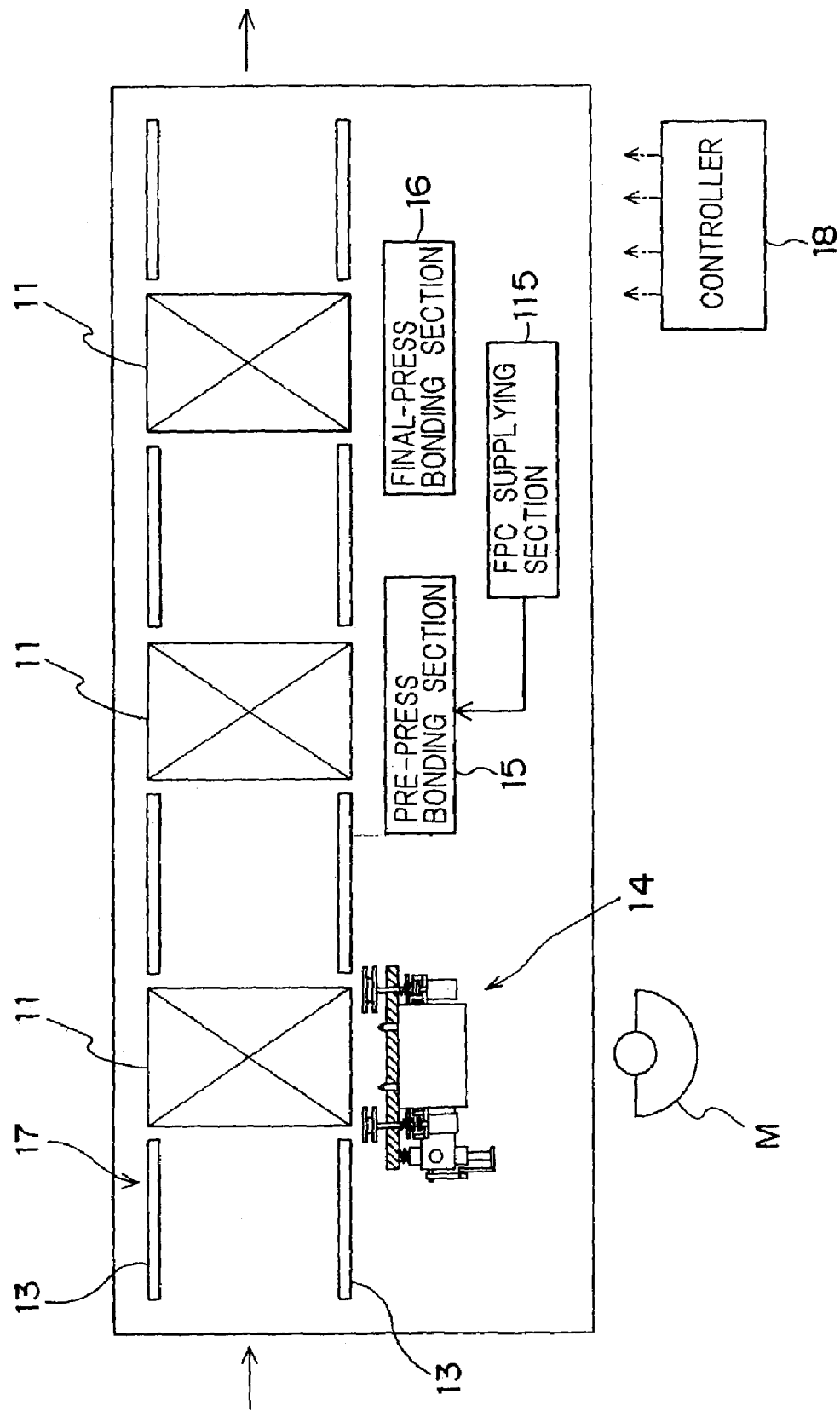
FIG. 1 is a partial plan view showing a component mounting apparatus in accordance with a first embodiment of the present invention.
Figure 32:
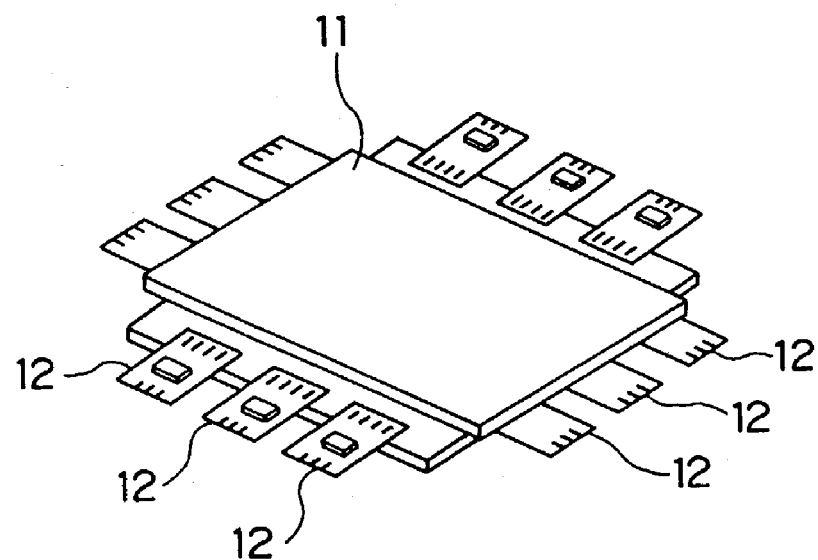
FIG. 32 is a perspective view showing a PDP board and FPC boards mounted thereon.

Next, embodiments in accordance with the present invention will be described referring to the accompanying drawings. FIG. 1 is a component mounting apparatus in accordance with an embodiment of the present invention. As shown in FIG. 32, this component mounting apparatus is intended to mount flexible printed circuit boards (FPC boards) 12 on a plasma display panel board (PDP board) 11, driver circuits of which are formed in the FPC boards. The component mounting apparatus comprises a transfer apparatus 17 for transferring the PDP board 11 to an ACF applying apparatus 14, a pre-press bonding apparatus 15 and a final-press bonding apparatus 16 in this order along a pair of guide rails 132. Among the ACF applying apparatus 14, the pre-press bonding apparatus 15 and the final-press bonding apparatus 16, the ACF applying apparatus 14 and the final-press bonding apparatus 16 are apparatuses to which the present invention is applied. A controller 18 controls operations of the ACF applying apparatus 14, the pre-press bonding apparatus 15 and the final-press bonding apparatus 16 on a basis of inputs from sensors 51 described later and commands from an operation panel (not shown).

Figure 4:
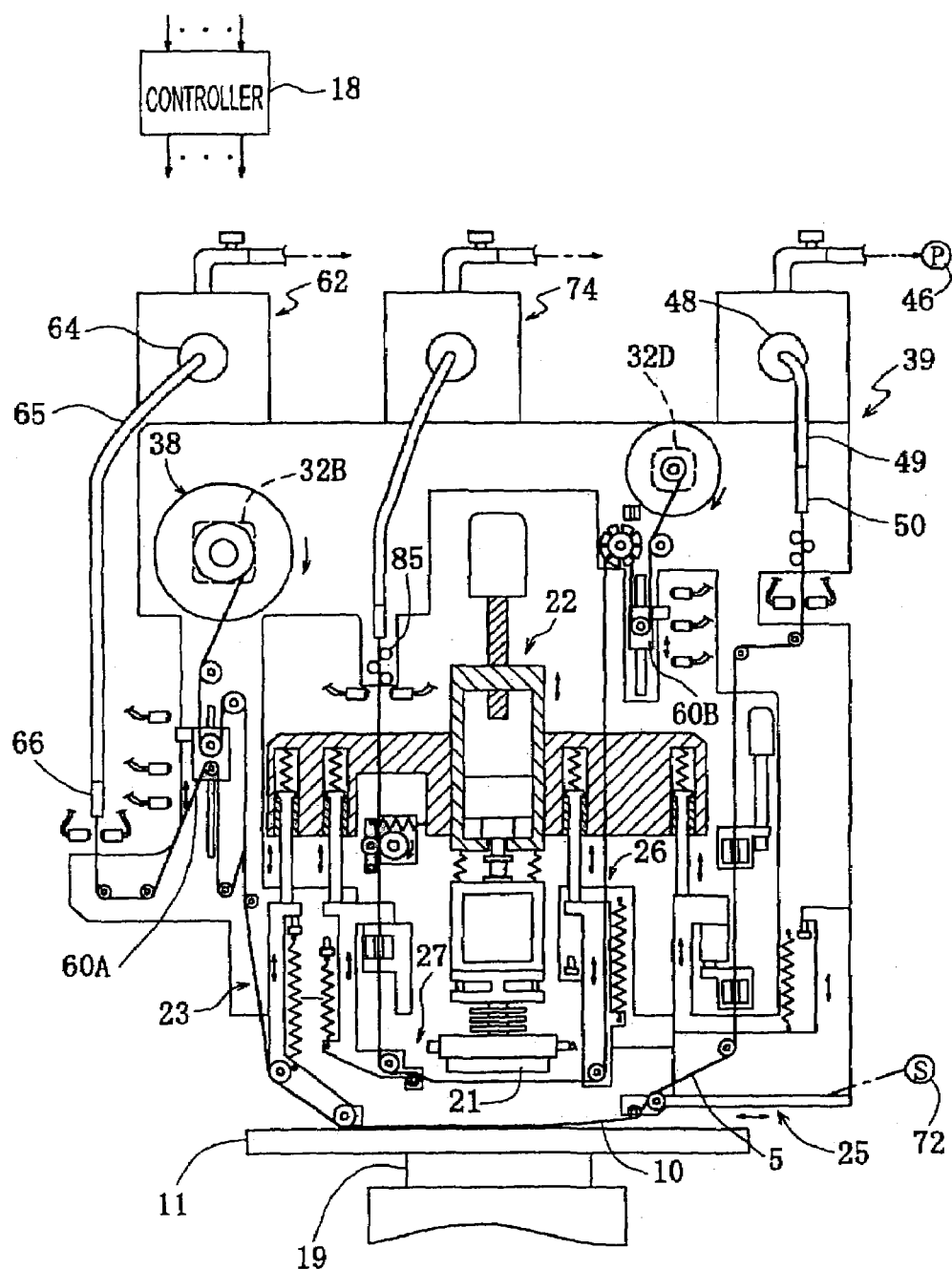
FIG. 4 is a front view showing the ACF applying apparatus at a time when an ACF layer is applied to a PDP board.
Figure 5:
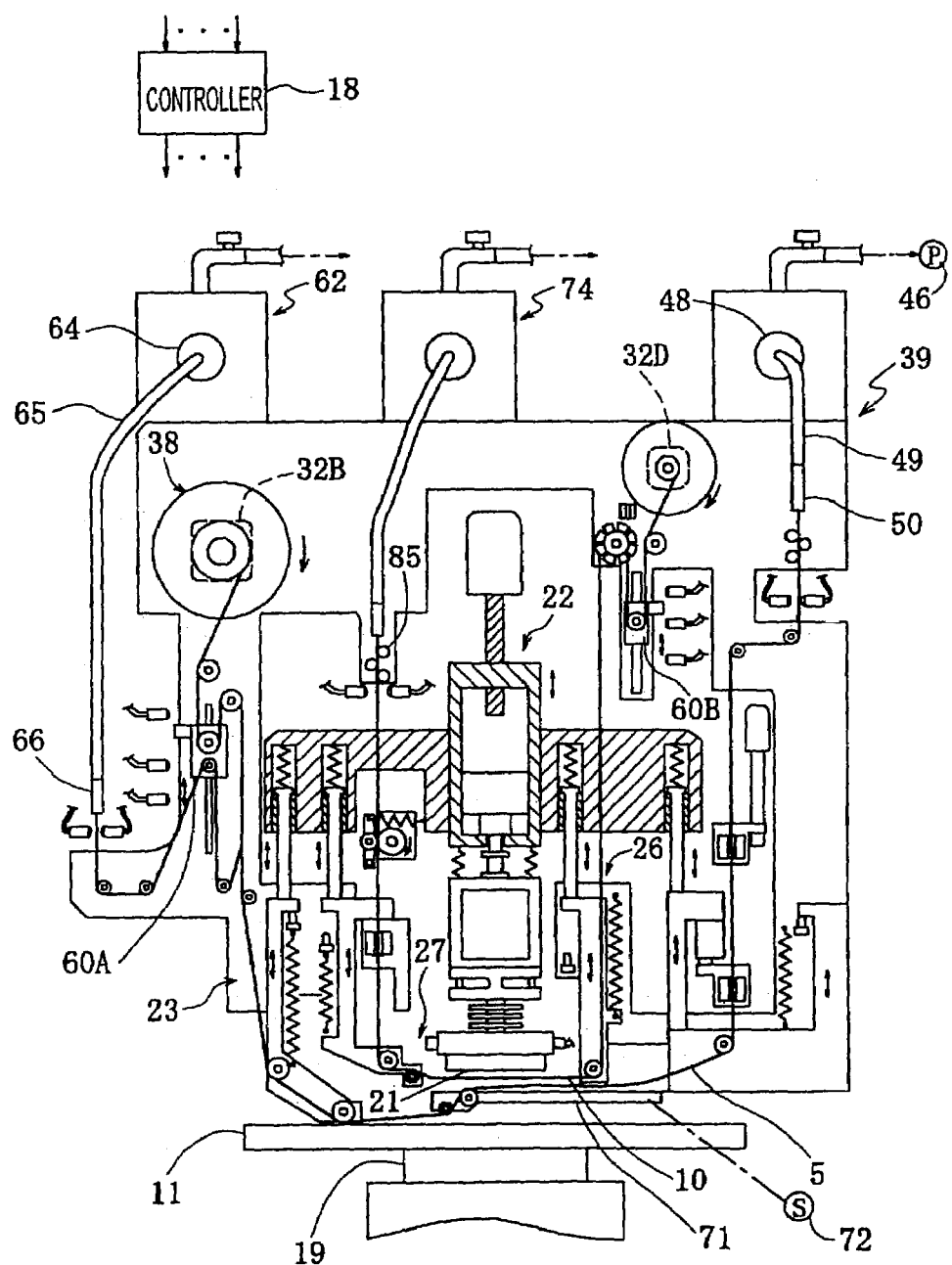
FIG. 5 is a front view showing the ACF applying apparatus at a time when a base layer is stripped from the PDP board.
Figure 6:
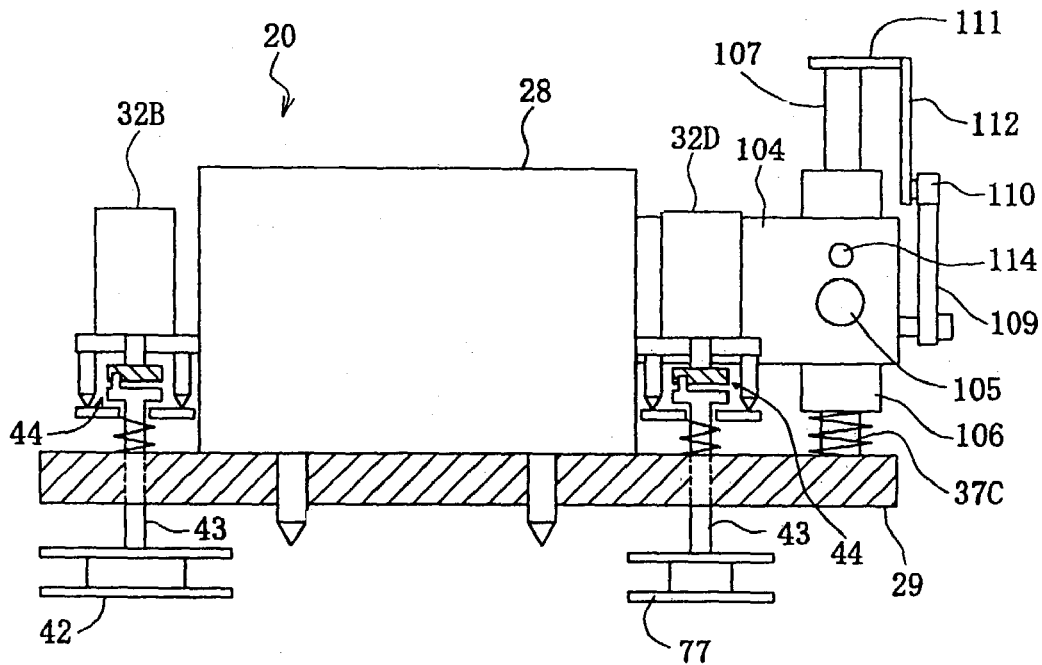
FIG. 6 is a plan view showing the ACF applying apparatus.
Figure 7:
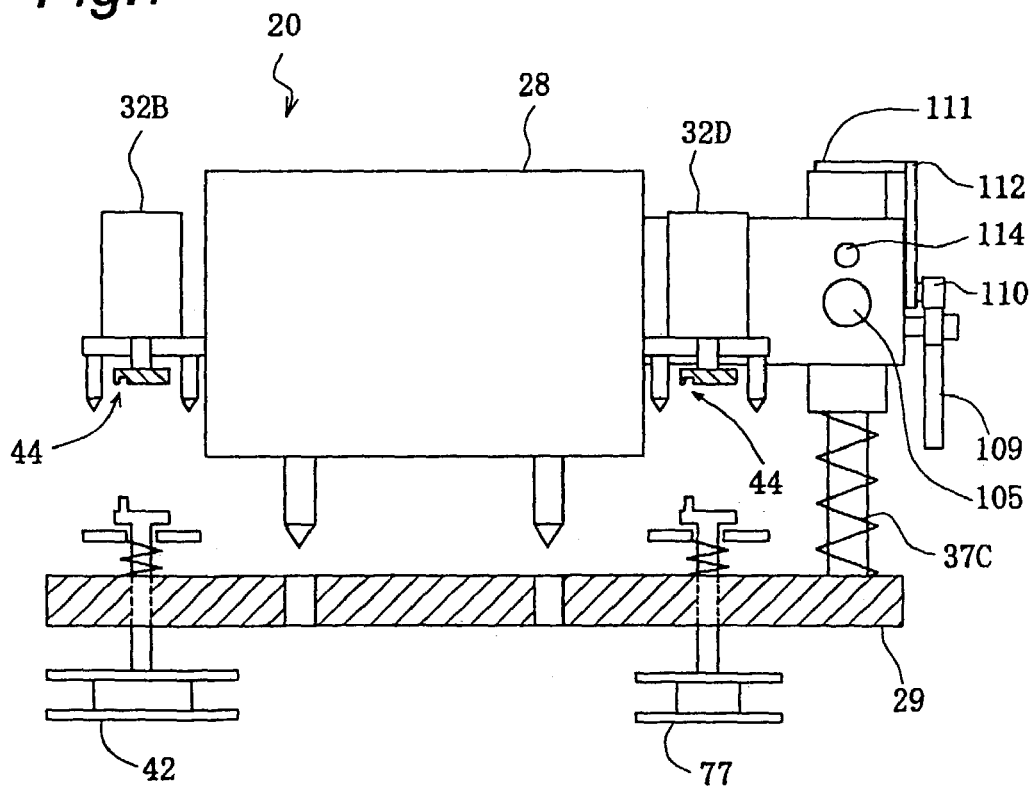
FIG. 7 is a plan view showing the ACF applying apparatus in a state wherein a movable section of a frame is away from a fixed section.
Figure 8:
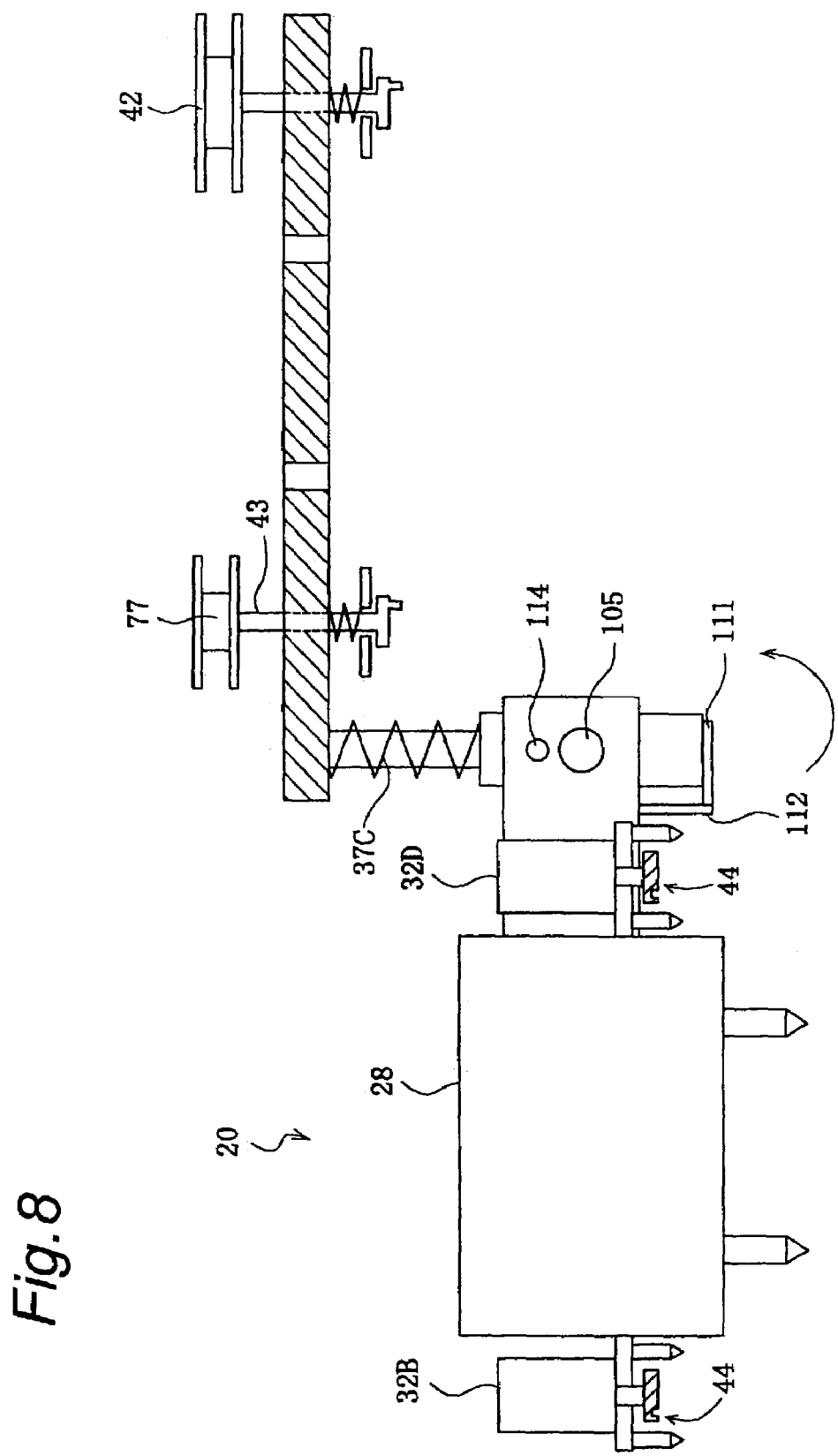
FIG. 8 is a plan view showing the ACF applying apparatus in a state wherein the movable section of the frame is turned with respect to the fixed section.
Figure 9:
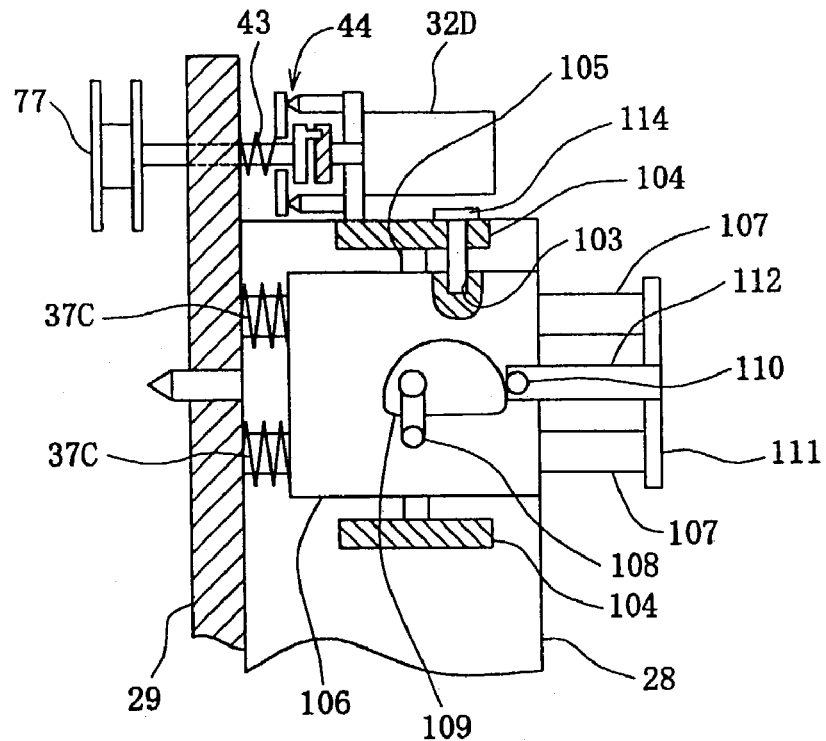
FIG. 9 is a right side view showing the ACF applying apparatus.
Figure 10:
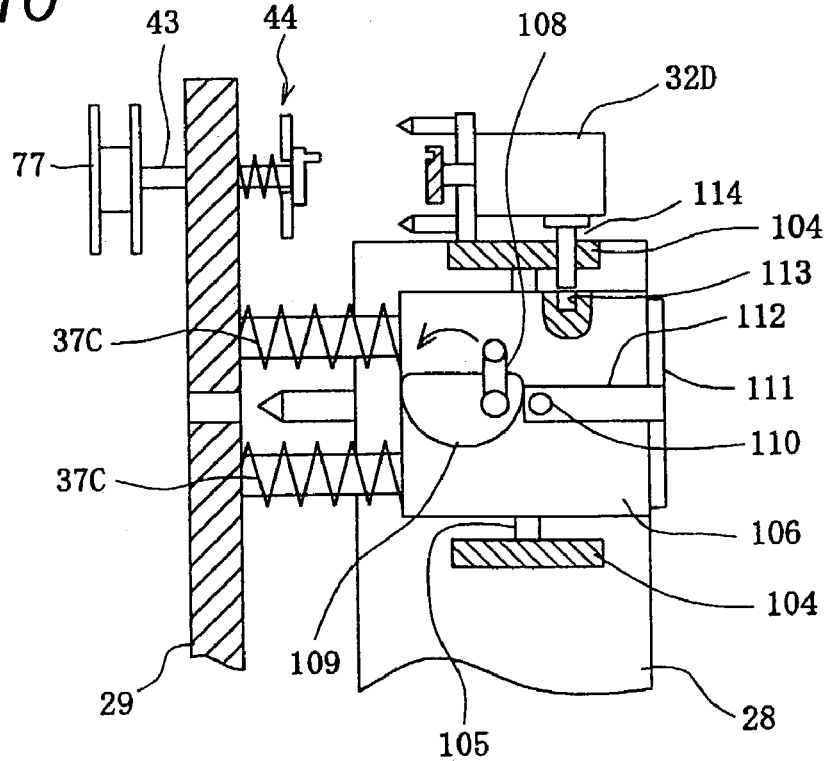
FIG. 10 is a right side view showing the ACF applying apparatus in a state wherein the movable section of the frame is away from the fixed section.
Figure 11:
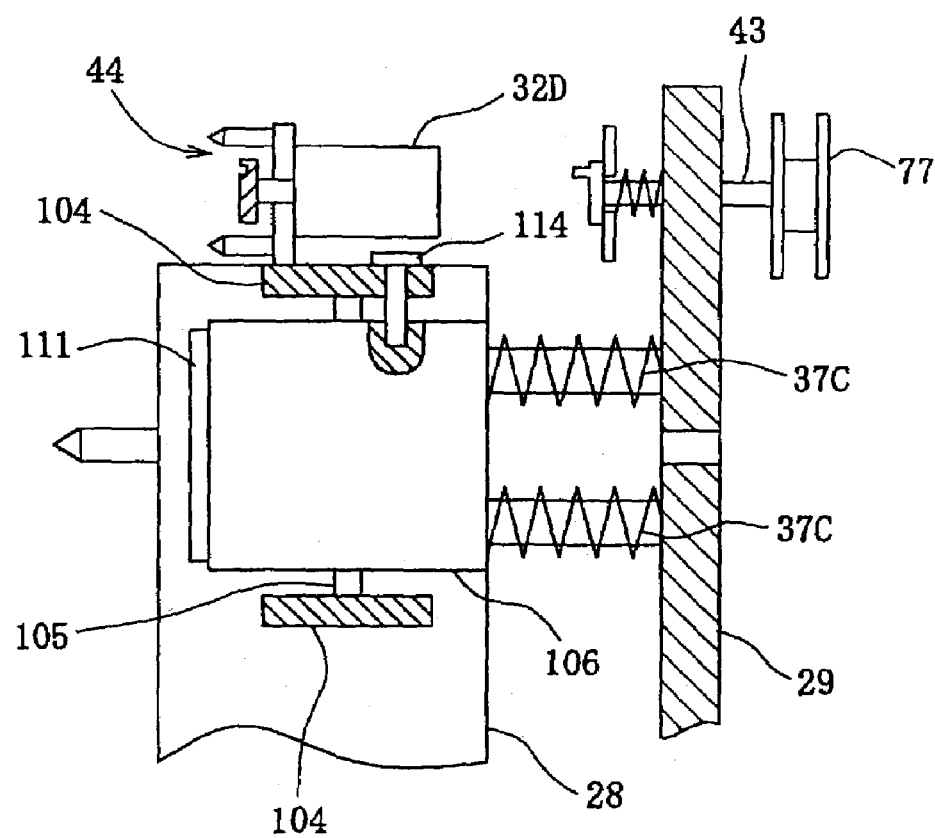
FIG. 11 is a right side view showing the ACF applying apparatus in a state wherein the movable section of the frame is turned with respect to the fixed section.

FIGS. 2A to 5 are front views of the ACF applying apparatus 14, FIGS. 6 to 8 are plan views of the ACF applying apparatus 14, and FIGS. 9 to 11 are right side views of the ACF applying apparatus 14. The ACF applying apparatus 14 is equipped with a stage 19 on which the PDP board 11 is mounted. This stage 19 can be moved up and down and can releasably hold the PDP board 11 on an upper face thereof by using a suction mechanism (not shown). A frame 20 disposed above this stage 19 is provided with a tool 21, a tool biasing section 22, an ACF tape supplying section 23, a cutting section 24, a stripping section 25, a protection tape supplying section 26 and a protection tape cooling section 27. The frame 20 is equipped with a fixed section 28 and a movable section 29, and the movable section 29 is rotatable horizontally with respect to the fixed section 28. On the fixed section 28, the tool 21, the tool biasing section 22, the cutting section 24 and the protection tape cooling section 27 are installed, and part of the ACF tape supplying section 23 and part of the protection tape supplying section 26 are also installed. On the other hand, on the movable section 29, a major part of the ACF tape supplying section 23 and a major part of the protection tape supplying section 26 are installed, and the stripping section 25 is also installed.

The tool 21 is a block having a shape of a rectangular parallelepiped, made of a metal and held at a lower end of a holding member 30. A surface of the tool 21 is not covered with a cover layer, but is exposed. In addition, the holding member 30 is equipped with a heater 31 for heating the tool 21. The tool biasing section 22 is equipped with a motor 32A installed on the fixed section 28 of the frame 20. An output shaft of this motor 32A is connected to a first ball screw 33 extending in a vertical direction. The first ball screw 33 is threadedly engaged with a nut section provided on an upper end section of a lifting block 34. Furthermore, a first air cylinder 35, having a rod extending downward in the vertical direction, is installed on the lifting block 34. The holding member 30 for the tool 21 is installed at a lower end of a pressurizing block 36, and an upper end of the pressurizing block 36 is connected to the lifting block 34 via a screw 37A. By using a biasing force of this screw 37A, the pressurizing block 36 is made to contact a lower end of the rod of the first air cylinder 35. When the first ball screw 33 is rotated by the motor 32A, the lifting block 34 is moved up or down depending on a rotational direction thereof, whereby the tool 21 is moved up or down together with the holding member 30. Moreover, when a rod of the first air cylinder 35 reaches its extended position, a downward biasing force is applied to the tool 21 via the pressurizing block 36. On the other hand, when the rod of the first air cylinder 35 reaches its withdrawn position, a downward biasing force applied to the tool 21 is released.

Figure 33:
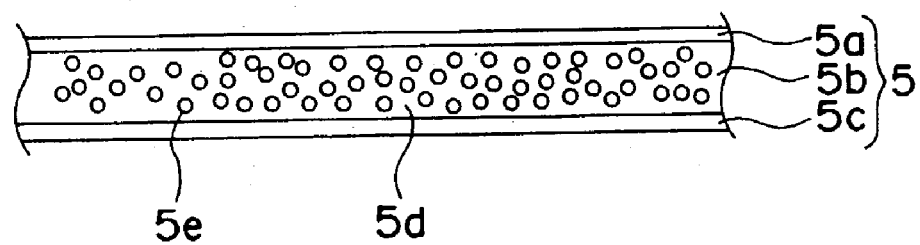
FIG. 33 is a side view showing an ACF tape.

The ACF tape supplying section 23 supplies an ACF tape 5 onto the stage 19 on which the PDP board 11 is held. As shown in FIG. 33, the ACF tape 5 comprises a base layer 5a, an anisotropic conductive film layer (ACF layer) 5b and a cover layer 5c. The ACF layer 5b has a binder 5d and a plurality of conductive particles 5e included in the binder 5d. The binder 5d becomes soft when heated and becomes hard when cooled, thereby being capable of connecting two members. In addition, the ACF layer 5b generates conductivity only in a direction of pressurizing owing to existence of the conductive particles 5e.

The ACF tape supplying section 23 comprises an ACF tape storage section 38 for storing the ACF tape 5 so that one end of the ACF tape 5 can be fed, and an ACF tape recovery section 39 for recovering another end of the ACF tape 5. In addition, the ACF tape supplying section 23 comprises an ACF tape guide section 40 for guiding the ACF tape 5 from the ACF tape storage section 38 to the ACF tape recovery section 39 through an upper side of the stage 19. This ACF tape guide section 40 guides the ACF tape 5 so that flow of the ACF tape 5 is approximately U-shaped when the ACF applying section 14 is viewed from a front thereof. Furthermore, the ACF tape supplying section 23 comprises an ACF tape feeding section 41 for feeding the ACF tape 5 from the ACF tape storage section 38 to the ACF tape recovery section 39 along the ACF tape guide section 40.

The ACF tape storage section 38 is equipped with an ACF tape reel 42 on which the ACF tape 5 is wound many times. As shown in FIG. 6, the ACF tape reel 42 is fixed at a front end of a reel shaft 43 rotatably supported on the movable section 29 of the frame 20. A base end side of this reel shaft 43 is connected to an output shaft of a motor 32B via a clutch 44. When the ACF tape reel 42 is rotated by the motor 32B in the direction indicated by an arrow in FIG. 2A, the ACF tape 5 is delivered from the ACF tape reel 42. In the vicinity of the ACF tape reel 42 of the movable section 29, a chuck 45A (shown in FIG. 2A), which is used when the ACF tape reel 42 is exchanged, is installed.

The ACF tape recovery section 39 is equipped with a suction tank 47 connected to a vacuum pump 46. A base end of a tube 49 is connected to a connection base 48 of this suction tank 47. In addition, a suction nozzle 50 is connected to a front end of the tube 49. The ACF tape 5 is drawn into the suction tank 47 by suction from the suction nozzle 50 to the suction tank 47 through the tube 49 and the connection base 48. Furthermore, in the vicinity of a front end of the suction nozzle 50, the ACF tape recovery section 39 is equipped with a pair of sensors 51A and 51B for detecting cutting of the ACF tape 5.

The ACF tape guide section 40 guides the ACF tape 5 so that the ACF layer 5b faces the PDP board 11 mounted on the stage 19. First, the ACF tape guide section 40 is equipped with fixed guide rollers 52A to 52H installed on the movable section 29 of the frame 20. Among these guide rollers 52A to 52H, five guide rollers 52A to 52E are used to guide the base layer 5a and the ACF layer 5b of the ACF tape 5, and the remaining three guide rollers 52F to 52H are used to guide the cover layer 5c stripped from the ACF layer 5b at a branch point 53.

In addition, the ACF tape guide section 40 is equipped with a movable arm 54A provided on a side of the ACF tape storage section 38 from the stage 19 in a feeding direction of the ACF tape 5, and is also equipped with a movable arm 54B provided on a side of the ACF tape recovery section 39 from the stage 19 in the feeding direction of the ACF tape 5. These movable arms 54A and 54B are movable with respect to the movable section 29 of the frame 20 in the vertical direction and connected respectively to the movable section 29 via springs. Furthermore, positioning pins 55 for positioning lower end positions of the movable arms 54A and 54B are installed in the movable section 29. These movable arms 54A and 54B are respectively equipped with guide rollers 52I to 52K. An upper end of the movable arm 54A is pushed down by a push rod 56A provided on the lifting block 34. The movable arm 54B is pushed down by an intermediate rod 57 installed at a lower end of a push rod 56B provided on the lifting block 34. Upper end sides of these push rods 56A and 56B are accommodated inside the lifting block 34 and biased elastically by springs downward in the vertical direction. The intermediate rod 57 is provided with a chuck 45B. This chuck 45B is provided to fix the ACF tape 5 on the side of the ACF tape recovery section 39 when the ACF layer 5b is pressurized against the PDP board 11.

The ACF tape guide section 40 is equipped with a tension mechanism 58. This tension mechanism 58 comprises a vertical guide groove 59A provided in the movable section 29 on a side of the ACF tape storage section 38 from the stage 19 in the feeding direction of the ACF tape 5, and a weight member 60A. This weight member 60A is provided with a guide roller 52L for guiding the base layer 5a and the ACF layer 5b, and a guide roller 52M for guiding the cover layer 5c. In addition, the weight member 60A is movable along the guide groove 59A and applies a vertical downward force owing to its own weight. The base layer 5a and the ACF layer 5b are guided by guide roller 52L of the weight member 60A so that a feeding direction thereof is reversed, and tension is applied thereto by the weight of the weight member 60A. The weight member 60A is equipped with a projection piece 61A extending in a horizontal direction. Furthermore, three sensors 51C–51E are disposed on the fixed section 28 of the frame 20 along the guide groove 59A. These sensors 51C–51E detect the projection piece 61A, whereby a position of the weight member 60A along the guide groove 59A is detected.

The cover layer 5c passes through guide roller 52M of the weight member 60A and fixed guide rollers 52G and 52H on the movable section 29, and is recovered by a cover layer recovery section 62. This cover layer recovery section 62 comprises a suction tank 63 connected to the vacuum pump 46, a tube 65, a base end of which is connected to a connection base 64 of this suction tank 63, and a suction nozzle 66 installed at a front end of the tube 65. The cover layer 5c separated from the base layer 5a and the ACF layer 5b is recovered from the suction nozzle 66 to the suction tank 63 through the tube 65 and the connection base 64.

The ACF tape feeding section 41 is equipped with a motor 32C installed on the fixed section 28 of the frame 20. An output shaft of this motor 32C is connected to a second ball screw 67 extending in the vertical direction. This second ball screw 67 is threadedly engaged with a nut section of a pull block 68 that is movable in the vertical direction with respect to the fixed section 28. This pull block 68 is provided with a chuck 45C that can be opened and closed.

Figure 14A:
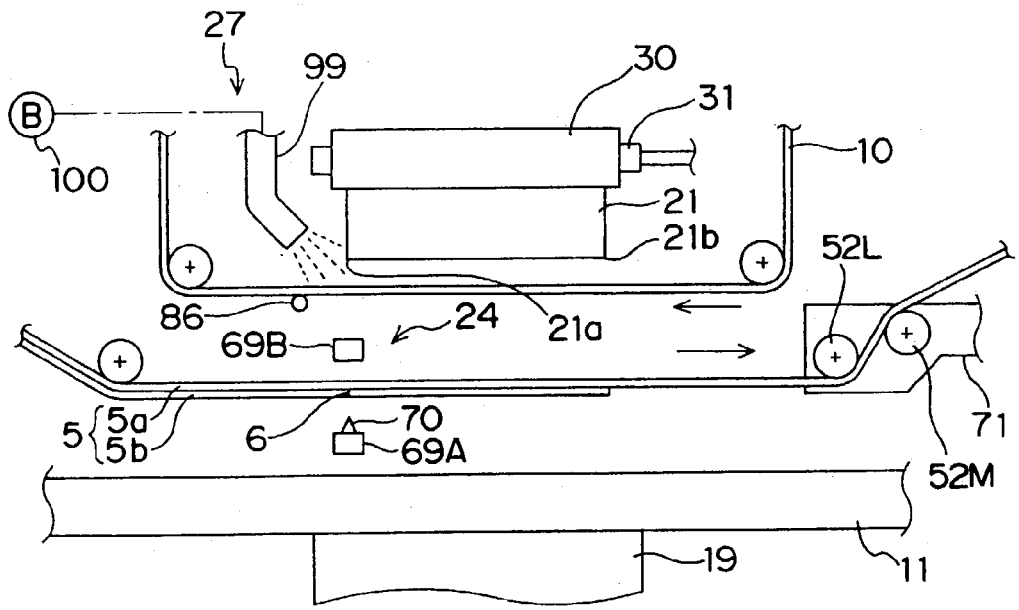
FIG. 14A is a partially enlarged front view showing the ACF applying apparatus at the time when the tool is at the position (the first position) away from the stage.

The cutting section 24 shown in detail in FIG. 14A is equipped with a pair of cutting arms 69A and 69B that can enter an upper region of the stage 19 and can be withdrawn therefrom, and that can be opened and closed. Although the cutting arm 69A on a lower side is equipped with a blade 70 for cutting the ACF layer 5b, the cutting arm 69B on an upper side is not equipped with the blade 70. When these cutting arms 69A and 69B are closed, the ACF layer 5b of the ACF tape 5 is cut by the blade 70, but the base layer 5 is not cut and remains uncut, and a cutting slit 6 is formed therein.

The stripping section 25 is equipped with a stripping arm 71 installed at a lower end of the movable arm 54B so as to be movable in the horizontal direction. A front end of this stripping arm 71 is provided with a pair of guide rollers 52L and 52M. On the other hand, a base end of the stripping arm 71 is connected to a second air cylinder 72. The stripping arm 71 moves in the horizontal direction depending on a position of the rod of this second air cylinder 72.

The protection tape supplying section 26 supplies a protection tape 10 to a lower side of the tool 21. The protection tape 10 is a tape member being excellent in terms of heat conductivity and heat resistance, and having elasticity. An insulated rubber sheet having high heat conductivity and containing, for example, silicone or Teflon®, can be used as the protection tape 10.

The protection tape supplying section 26 comprises a protection tape storage section 73 for storing the protection tape 10 so that one end of the protection tape 10 can be fed and a protection tape recovery section 74 for recovering another end of the protection tape 10. In addition, the protection tape supplying section 26 comprises a protection tape guide section 75 for guiding the protection tape 10 from the protection tape storage section 73 to the protection tape recovery section 74 through the upper side of the stage 19. This protection tape guide section 75 guides the protection tape 10 so that flow of the protection tape 10 is approximately U-shaped when the ACF applying section 14 is viewed from the front thereof, and so that the protection tape 10 is positioned between the PDP board 11 mounted on the stage 19 and the tool 21. Furthermore, the protection tape supplying section 26 comprises a protection tape feeding section 76 for feeding the protection tape 10 from the protection tape storage section 73 to the protection tape recovery section 74 along the protection tape guide section 75.

The protection tape storage section 73 is equipped with a protection tape reel 77 on which the protection tape 10 is wound many times. As shown in FIG. 6, the protection tape reel 77 is fixed at a front end of a reel shaft 43 rotatably supported by the movable section 29 of the frame 20. A base end side of this reel shaft 43 is connected to an output shaft of a motor 32D via a clutch 44. When the protection tape reel 77 is rotated by the motor 32D in the direction indicated by an arrow in FIG. 2A, the protection tape 10 is delivered from the protection tape reel 77. In the vicinity of the protection tape reel 77 of the movable section 29, a chuck 45D, which is used when the protection tape reel 77 is exchanged, is installed.

Figure 12:
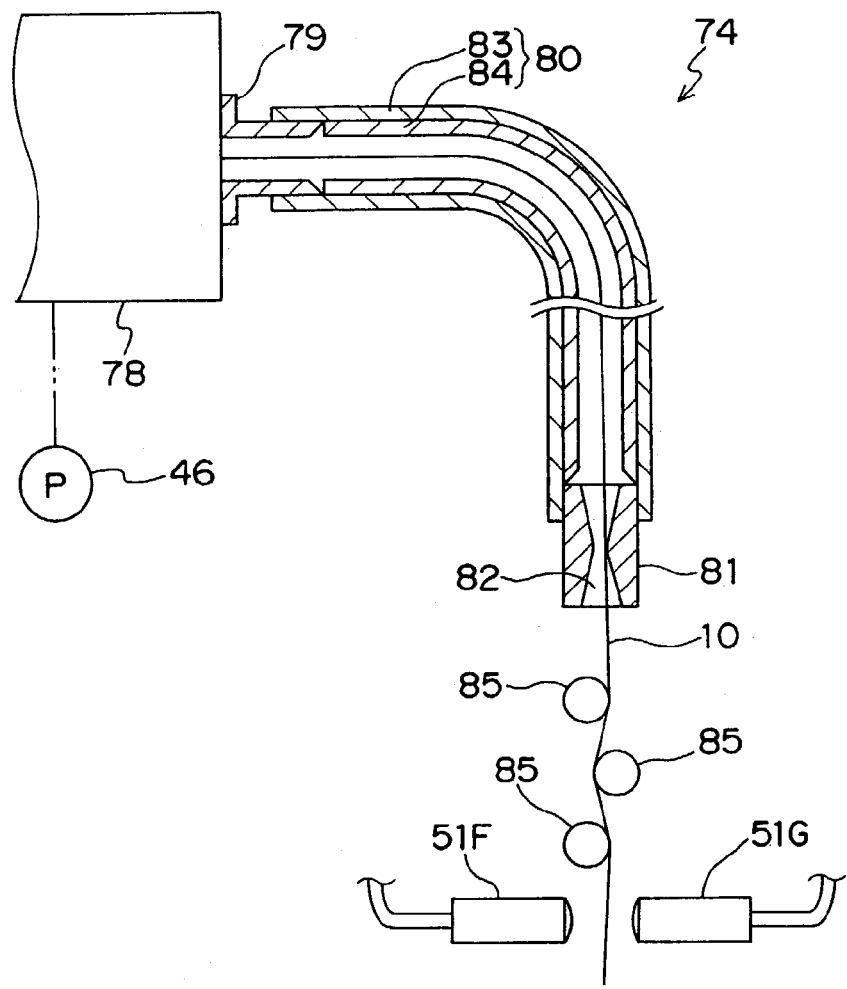
FIG. 12 is a partially sectional side view showing a protection tape recovery section.

As shown in detail in FIG. 12, the protection tape recovery section 74 is equipped with a suction tank 78 connected to the vacuum pump 46. A base end of a tube 80 (connection tube member) is connected to a connection base 79 of this suction tank 78. In addition, a suction nozzle 81 is connected to a front end of the tube 80. The protection tape 10 is drawn into the suction tank 78 from the suction nozzle 81 by suction through the tube 80 and the connection base 79. Furthermore, in the vicinity of the suction nozzle 81, the protection tape recovery section 74 is equipped with a pair of sensors 51F and 51G for detecting cutting of the protection tape 10.

The suction nozzle 81 is provided with a suction path 82, passing through from a base end to a front end thereof, for guiding the protection tape 10 into the suction tank 78. A diameter of this suction path 82 decreases continuously from the front end to a central portion thereof in a longitudinal direction and increases continuously from the central portion to the base end thereof in the longitudinal direction. This sectional shape reduces frictional resistance applied to the protection tape 10 in the vicinity of a front end of the suction nozzle 81 and in the central portion of the suction path 82. As a result, the protection tape 10 can be prevented from being cut when the protection tape 10 is drawn into the suction nozzle 81 by suction.

The tube 80 has a double structure composed of an outer layer 83 and an inner layer 84. The inner layer 84 is not provided in the vicinity of the front end of the tube 80, and the suction nozzle 81 is inserted into the outer layer 83. Similarly, the inner layer 84 is not provided in the vicinity of the base end of the tube 80, and the connection base 79 is inserted into the outer layer 83. In addition, an inside diameter of the inner layer 84 of the tube 80, an inside diameter of the connection base 79 and an inside diameter of the base end of the suction path 82 are the same. Furthermore, a portion in the vicinity of the front end of the inner layer 84 has a tapered shape wherein its diameter increases continuously toward its extreme end. Similarly, a portion in the vicinity of the front end of the connection base 79 has a tapered shape wherein the diameter increases continuously toward its extreme end. In this way, shapes and dimensions of inside cross-sections of the suction nozzle 81, the tube 80 and the connection base 79 are made constant, and bumps and dips are eliminated as much as possible, whereby frictional resistance applied to the protection tape 10 is reduced. As a result, the protection tape 10 can be prevented from being cut and from clogging an inside of the tube 80 when drawn into the suction tank 78 by suction.

In the vicinity of the front end of the suction nozzle 81, three pins 85 staggered in a feeding direction of the protection tape 10 are provided. The protection tape 10 is guided by these pins 85 and fed to the suction path 82 of the suction nozzle 81 while staggering. Hence, the protection tape 10 is prevented from vibrating and swinging in the vicinity of the front end of the suction nozzle 81, whereby the protection tape 10 is guided into the suction path 82 without interfering with the protection tape suction nozzle 81. As a result, the protection tape 10 can be prevented from being cut when drawn by suction.

The protection tape guide section 75 guides the protection tape 10 so that the protection tape 10 passes between the ACF tape 5 and the ACF tool 21 above the stage 19. First, the protection tape guide section 75 is equipped with fixed guide rollers 52N and 52P installed on the movable section 29 of the frame 20. In addition, the protection tape guide section 75 is equipped with a movable arm 54C provided on a side of the protection tape storage section 73 from the stage 19 in the feeding direction of the protection tape 10, and is also equipped with a movable arm 54D provided on a side of the protection tape recovery section 74 from the stage 19 in the feeding direction of the protection tape 10. Front ends of these movable arms 54C and 54D are also provided with guide rollers 52Q and 52R for guiding the protection tape 10. Furthermore, these movable arms 54C and 54D are movable in the vertical direction with respect to the movable section 29 of the frame 20, and connected respectively to the movable section 29 via springs. Furthermore, positioning pins 55 for positioning lower end positions of the movable arms 54C and 54D are installed in the movable section 29. Upper ends of the movable arms 54C and 54D are pushed down by push rods 56C and 56D provided on the lifting block 34. Upper end sides of the push rods 56C and 56D are accommodated inside the lifting block 34 and biased elastically by springs downward in the vertical direction.

Figure 14B:
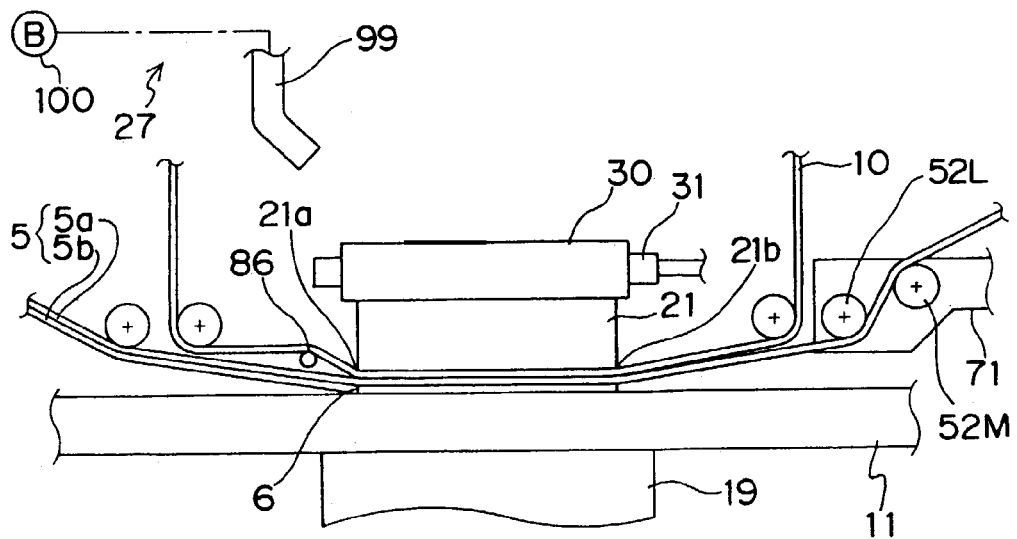
FIG. 14B is a partially enlarged front view showing the ACF applying apparatus at the time when the tool is at the biased position (the second position) toward the stage.

A pin 86 (protection sheet guide member) is fixed in the vicinity of a front end of the movable arm 54D. As described later, this pin 86 guides the protection tape 10 so that the protection tape 10 makes close contact with a left fringe 21a (as shown in FIG. 14B) of the tool 21 when the tool 21 pressurizes the ACF layer 5b against the PDP board 11 (see FIG. 14B).

The fixed section 28 is provided with a chuck 45E. This chuck 45E is used to fix the protection tape 10 on the side of the protection tape recovery section 74 when the ACF layer 5b is pressurized against the PDP board 11.

The protection tape guide section 75 is provided with a tension mechanism 87. This tension mechanism 87 comprises a vertical guide groove 59B formed in the movable section 29 on the side of the protection tape storage section 73 from the stage 19 in the feeding direction of the protection tape 10, and a weight member 60B. This weight member 60B is provided with a guide roller 52S for guiding the protection tape 10. In addition, the weight member 60B is movable along the guide groove 59B and applies a vertical downward force owing to its own weight. The protection tape 10 is guided by the guide roller 52S of the weight member 60B so that a feeding direction thereof is reversed from downward to upward, and tension is applied by the weight of the weight member 60B. The weight member 60B is equipped with a projection piece 61B extending in a horizontal direction. Furthermore, three sensors 51H–51J are disposed on the fixed section 28 of the frame 20 along the guide groove 59B. By these sensors 51H–51J, a position of the weight member 60B along the guide groove 59B can be detected.

Detection pieces 88 are provided along an outer circumference of the guide roller 52P at equiangular intervals. In addition, a sensor 51K is provided in the vicinity of this guide roller 52P. By counting a number of the detection pieces 88 passing through the sensor 51K in accordance with rotation of the guide roller 52P, a length of the protection tape 10 delivered from the protection tape storage section 73 is measured.

The protection tape feeding section 76 is equipped with a pinch roller mechanism 89 installed on the fixed section 28 of the frame 20. This pinch roller mechanism 89 comprises a drive roller 90 rotated by a motor (not shown) and a driven roller 91. A base end of the driven roller 91 is rotatably supported by the fixed section 28, and a front end thereof is installed on a rotary lever 92 elastically biased toward the drive roller 90 by a spring. Hence, the protection tape 10 is held between the drive roller 90 and the driven roller 91. When the drive roller 90 rotates in the direction indicated in FIG. 2A, the protection tape 10 is fed to the protection tape recovery section 74.

Furthermore, when the driven roller 91 is moved away from the drive roller 90 by turning the rotary lever 92 counterclockwise by using an actuator (not shown), the protection tape 10 can be extracted from the pinch roller mechanism 89. As indicated by arrows in FIG. 2A, the feeding direction of the ACF tape 5 by the ACF tape feeding section 41 and the feeding direction of the protection tape 10 by the protection tape feeding section 76 are opposite to each other.

A connection portion sensor 51L is disposed between the pinch roller mechanism 89 and the protection tape recovery section 74.

Figure 13:
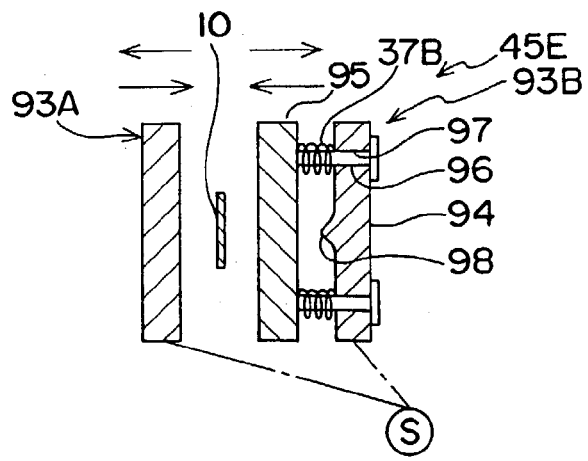
FIG. 13 is a side sectional view showing a chuck.

The above-mentioned chucks 45A to 45E will be described below referring to FIG. 13 by taking the chuck 45E provided on the protection tape guide section 75 as an example. The chuck 45E comprises jaws 93A and 93B so that they respectively face different faces of the protection tape 10. One of the jaws, that is, the jaw 93A, is formed of a single member and its face disposed so as to face the protection tape 10 defines a flat plane. The other jaw 93B comprises a base member 94 and a contact member 95. One end of a slide shaft 96 is fixed to the contact member 95, and another end of the slide shaft 96 is inserted into a slide hole 97 formed in the base member 94. In addition, springs 37B are provided between the base member 94 and the contact member 95. These springs 37B apply elastic biasing forces so that the contact member 95 is moved away from the base member 94 toward the protection tape 10. The base member 94 is provided with a projection portion 98 for making point contact with the contact member 95. The jaws 93A and 93B are driven by a driving mechanism including an air cylinder. These jaws are movable to a position wherein they are close to each other so as to hold the protection tape 10 therebetween, and to a position wherein they are away from each other so as to release the protection tape 10.

When the jaws 93A and 93B are moved so as to be close to each other, at first, the jaw 93A and the contact member 95 of the jaw 93B respectively make contact with the different faces of the protection tape 10. When the jaws 93A and 93B are moved so as to be closer to each other, the base member 94 becomes close to the contact member 95 against the elastic biasing forces of the springs 37B, whereby the projection portion 98 makes contact with the contact member 95. When the jaws 93A and 93B are moved so as to be further closer to each other, the protection tape 10 is placed between the jaw 93A and the contact member 95 pushed by the projection portion 98. Hence, the protection tape 10 is placed securely between the jaw 93A and the contact member 95 of the jaw 93B, and the protection tape 10 is held securely without sliding along the jaws 93A and 93B. However, structures of the chucks 45A to 45E are not limited to that shown in FIG. 13. Any structure that can releasably hold the ACF tape 5 and the protection tape 10 may be used. The chucks 45A and 45D for reel exchange may be manually openable and closable.

As shown in FIG. 14A, the protection tape cooling section 27 comprises a cooling nozzle 99 for ejecting cooling air to the protection tape 10, and a gas supplying section 100 provided with a blower for supplying air to the cooling nozzle 99. A position and direction of the cooling nozzle 99 are set as described below; that is, when the tool 21 faces the stage 19 with space provided therebetween, the cooling nozzle 99 is set so as to eject air toward the left fringe 21a (as shown in FIG. 14A) of the tool 21, in other words, toward a portion corresponding to the slit 6 of the ACF tape 5.

Figure 2A:
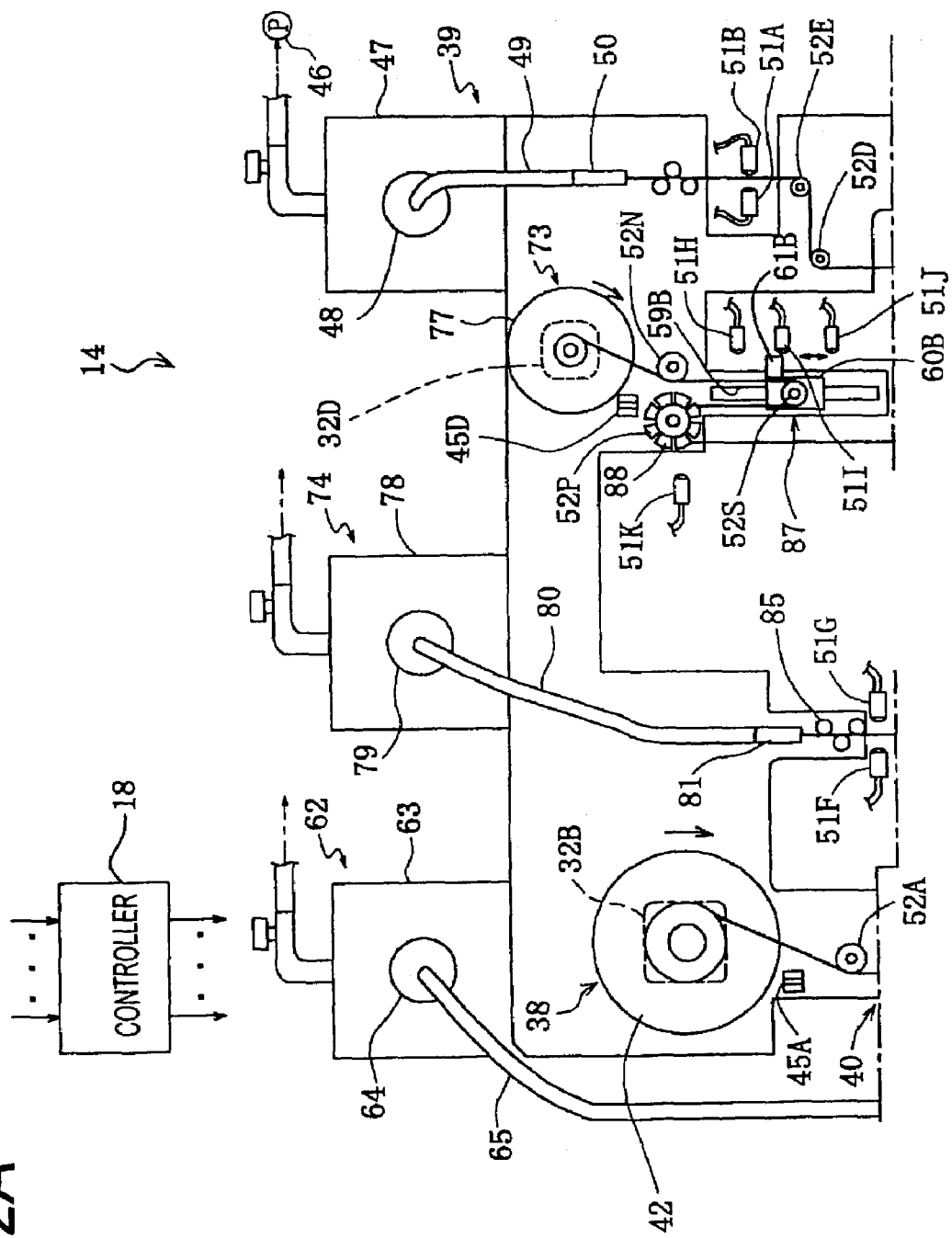
FIG. 2A is a partial front view showing an ACF applying apparatus at a time when a tool is at a position (first position) away from a stage.
Figure 2B:
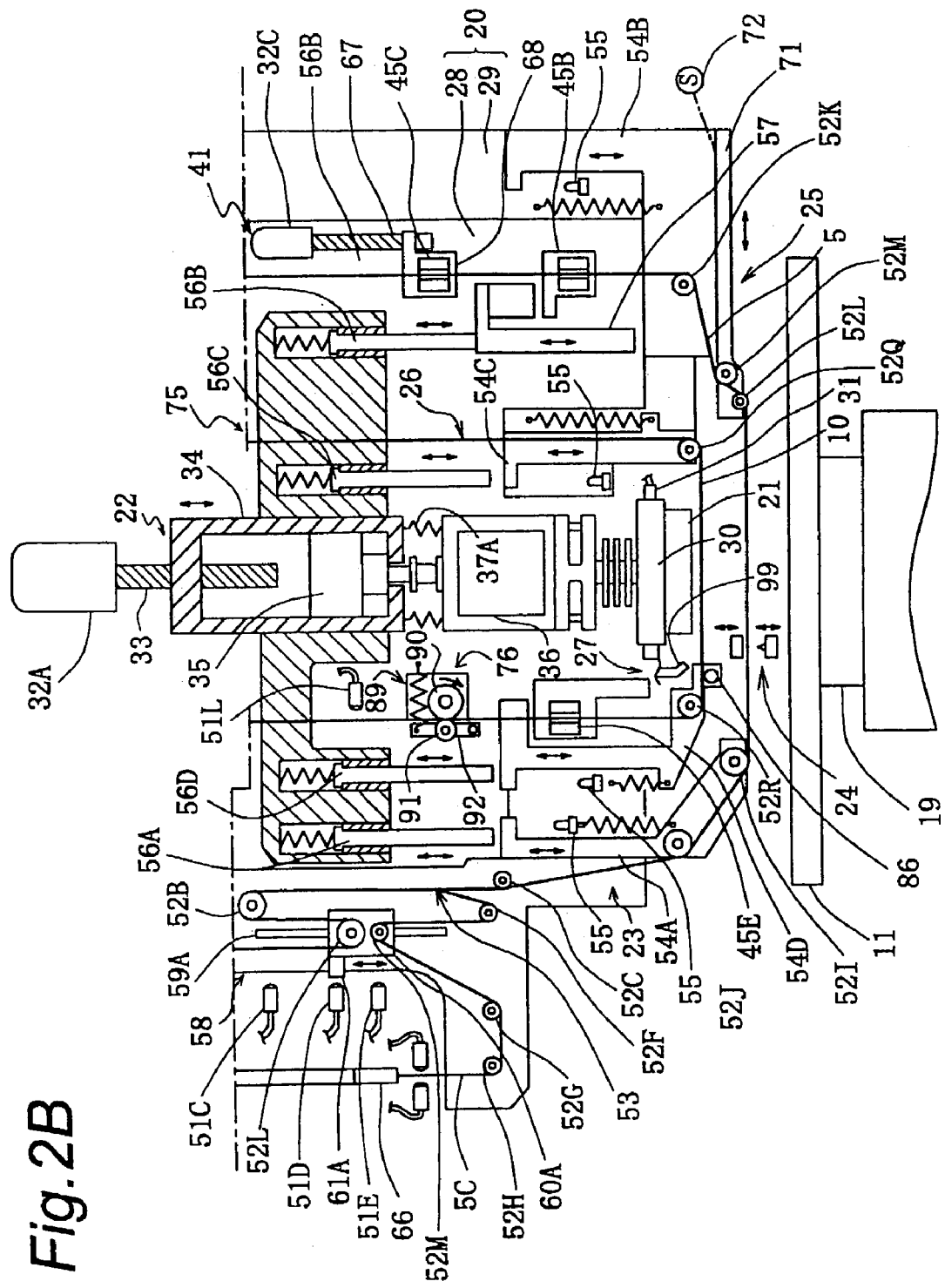
FIG. 2B is a partial front view showing the ACF applying apparatus at the time when the tool is at the position (first position) away from the stage.

Next, operation of the ACF applying section 14 will be described. FIGS. 2A, 2B and 14A show a state before the ACF layer 5b is pressurized against the PDP board 11 by the tool 21. The tool 21 is positioned above the stage 19, the PDP board 11 and the ACF tape 5 with space provided therefrom. The ACF tape feeding section 41 feeds the ACF tape 5 toward the ACF tape recovery section 39 so that a front end of the ACF layer 5b reaches a position corresponding to a right fringe 21b (as shown in FIG. 14A) of the tool 21. In addition, the chuck 45B closes to fix the ACF tape 5 (the base layer 5a), and the chuck 45E closes to fix the protection tape 10. The ACF layer 5b of the ACF tape 5 faces the PDP board 11 mounted on the stage 19 with space provided therebetween. The cutting arms 69A and 69B of the cutting section 24 advance above the stage 19 and operate to form slit 6.

The protection tape 10 is disposed above the ACF tape 5 with space provided therebetween. In addition, the protection tape 10 faces the tool 21 positioned above the tape with space provided therebetween and does not make contact with the ACF tape 5. By providing the space between the tool 21 and the protection tape 10, heat transfer from the tool 21 to the protection tape 10 is prevented. In addition, by providing this space, the protection tape 10 is naturally cooled by heat exchange with surrounding air, whereby a temperature of the protection tape 10 is prevented from rising excessively. When the tool 21 is positioned away from the stage 19 as shown in FIGS. 2A, 2B and 14A, heating by heater 31 is stopped. This also reduces heat transfer from the ACF tool 21 to the protection tape 10, whereby the temperature of the protection tape 10 is prevented from rising. Furthermore, the cooling nozzle 99 of the protection tape cooling section 27 ejects air to the protection tape 10. This air ejection further promotes heat exchange between the protection tape 10 and the surrounding air and prevents the temperature of the protection tape 10 from rising.

Figure 3:
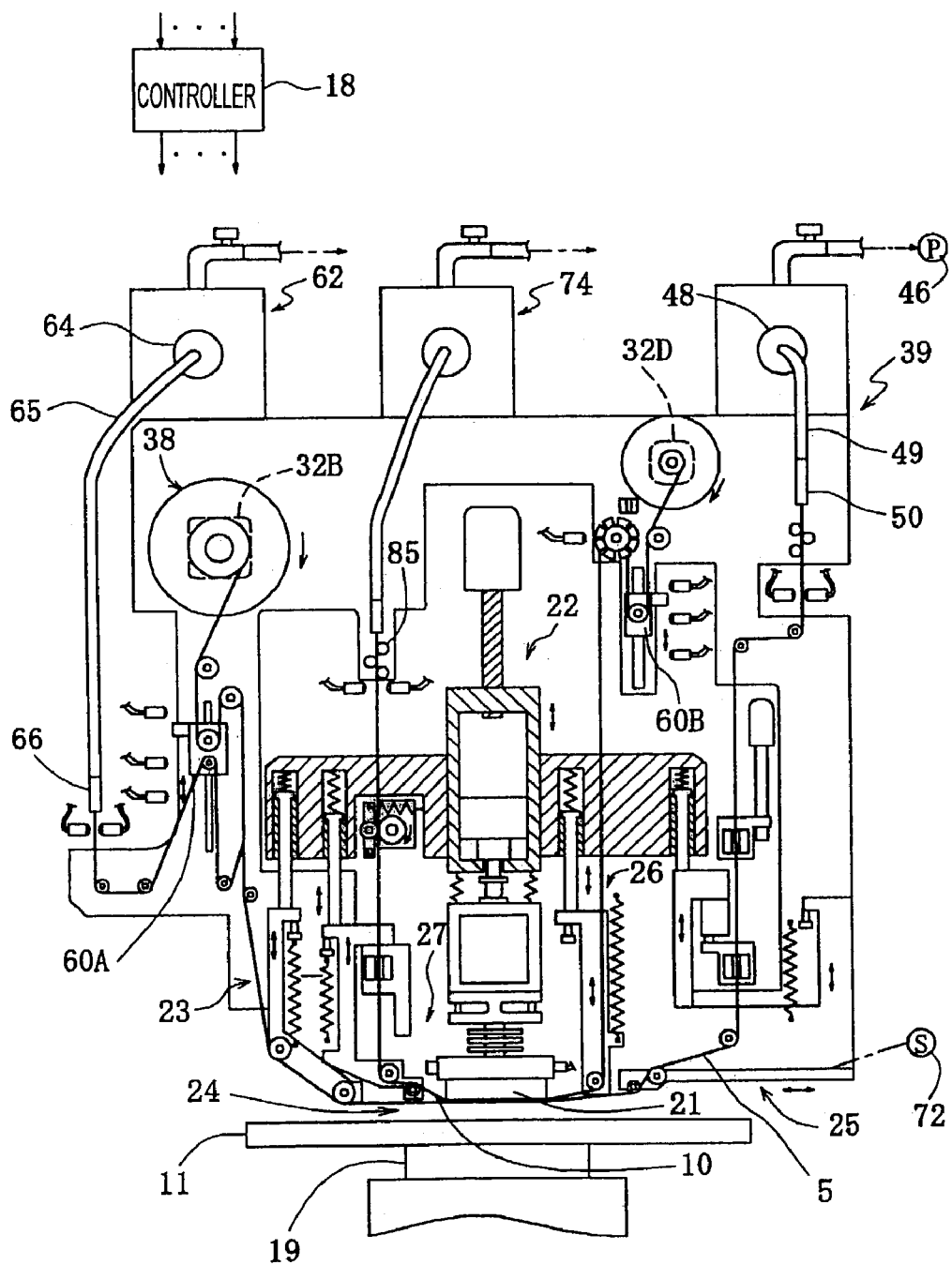
FIG. 3 is a front view showing the ACF applying apparatus at a time when the tool is at a biased position (a second position) toward the stage.

Next, the first ball screw 33 is rotated by the motor 32A, whereby the lifting block 34 is moved downward. In addition, the rod of the first air cylinder 36 reaches its extended position, and the tool 21 is moved downward to the PDP board 11. Furthermore, as the lifting block 34 is moved downward, the movable arms 54A to 54D are pushed down by the push rods 56A to 56D against the biasing forces of the springs, whereby both the ACF tape 5 and the protection tape 10 are moved downward to the PDP board 11 mounted on the stage 19. Hence, as shown in FIGS. 3 and 14B, the tool 21 is biased toward the stage 19, and the ACF layer 5b of the ACF tape 5 is pressurized against the PDP board 11 by the tool 21. The protection tape 10 having elasticity is placed between the tool 21 and the ACF tape 5. Hence, a uniformly distributed pressurizing force is applied from the tool 21 to the ACF layer 5b, whereby the ACF layer 5b can be applied accurately to the PDP board 11. A pressurizing force applied by the tool 21 is 50 to 100 N/cm$^2$, for example, and a temperature during pressurizing is 60 to 70° C., for example.

At the left fringe 21a (as shown in FIG. 14B) of the tool 21, corresponding to the slit 6 of the ACF layer 5b, the pin 86 guides the protection tape 10 in a direction away from the stage 19 (upward in FIG. 14B), whereby the protection tape 10 is made to closely contact the fringe 21a. Hence, distribution of the pressurizing force applied from the ACF tool 21 to the ACF layer 5b is uniform even in the vicinity of the slit 6, whereby problems, such as cutting of the ACF layer 5b, can be prevented.

The right side (as shown in FIG. 2B) of the ACF tape 5 is held by the chuck 45B, and the left side thereof is guided by the guide roller 52L provided on the weight member 60A that is movable up and down. Hence, as the tool 21 is moved downward, the ACF tape 5 is fed rightward as indicated by a right arrow in FIG. 14A. On the other hand, the left side (as shown in FIG. 2B) of the protection tape 10 is held by the chuck 45E, and the right side thereof is guided by the guide roller 52S provided on the weight member 60B that is movable up and down. Hence, as the tool 21 is moved downward, the protection tape 10 is fed leftward as indicated by a left arrow in FIG. 14A. If a feeding direction of the ACF tape 5 and a feeding direction of the protection tape 10 are the same when the tool 21 is moved downward, the ACF tape 5 is pulled more than necessary by the protection tape 10 owing to a frictional force between the ACF tape 5 and the protection tape 10, whereby positions of the front end and the slit 6 of the ACF layer 5b with respect to the PDP board 11 are in danger of being displaced. However, since the feeding direction of the ACF tape 5 and the feeding direction of the protection tape 10 are opposite to each other in this embodiment, the ACF tape 5 is prevented from being pulled more than necessary by the protection tape 10 when the tool 21 is moved downward. Hence, positions of the front end and the slit 6 of the ACF layer 5b with respect to the PDP board 11 can be prevented from being displaced.

Figure 14C:
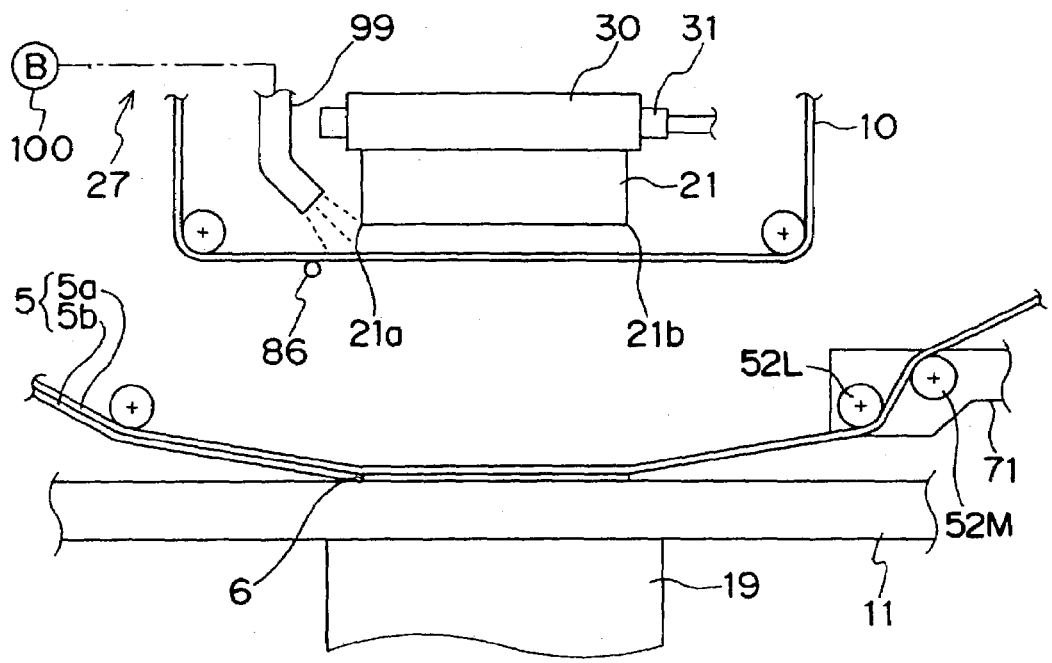
FIG. 14C is a partially enlarged front view showing the ACF applying apparatus at the time when the ACF layer is applied to the PDP board.

Next, the rod of the first air cylinder 36 reaches its withdrawn position, and the first ball screw 33 is rotated by the motor 32A, whereby the lifting block 34 is moved upward. As a result, as shown in FIGS. 4 and 14C, the tool 21 is moved upward away from the stage 19. In addition, as the lifting block 34 is moved upward, forces for pushing the movable arms 54C and 54D downward are reduced. Hence, the movable arms 54C and 54D are moved upward, and the protection tape 10 is also moved away from the stage 19. On the other hand, since the ACF layer 5b has been applied to the PDP board 11, the movable arms 54A and 54B are not moved upward, even though the lifting block 34 is moved upward, whereby the ACF tape 5 is held on the PDP board 11.

When the tool 21 is moved upward away from the stage 19, heating by the heater 31 is stopped. In addition, after the tool 21 is moved away from the stage 19, air ejection from the cooling nozzle 99 is started. When the ACF layer 5b is pressurized against the PDP board 11, stress concentration occurs at the fringe 21a of the tool 21 corresponding to the slit 6 of the ACF layer 5b. Hence, a portion of the protection tape 10 corresponding to the tool 21 is subjected to high pressure in comparison with other portions, thereby being apt to deteriorate. On the other hand, in this embodiment, air is ejected from the cooling nozzle 99 to the portion of the protection tape 10 corresponding to the fringe 21a of the tool 21, whereby deterioration of the protection tape 10 at this portion can be prevented effectively.

Figure 14D:
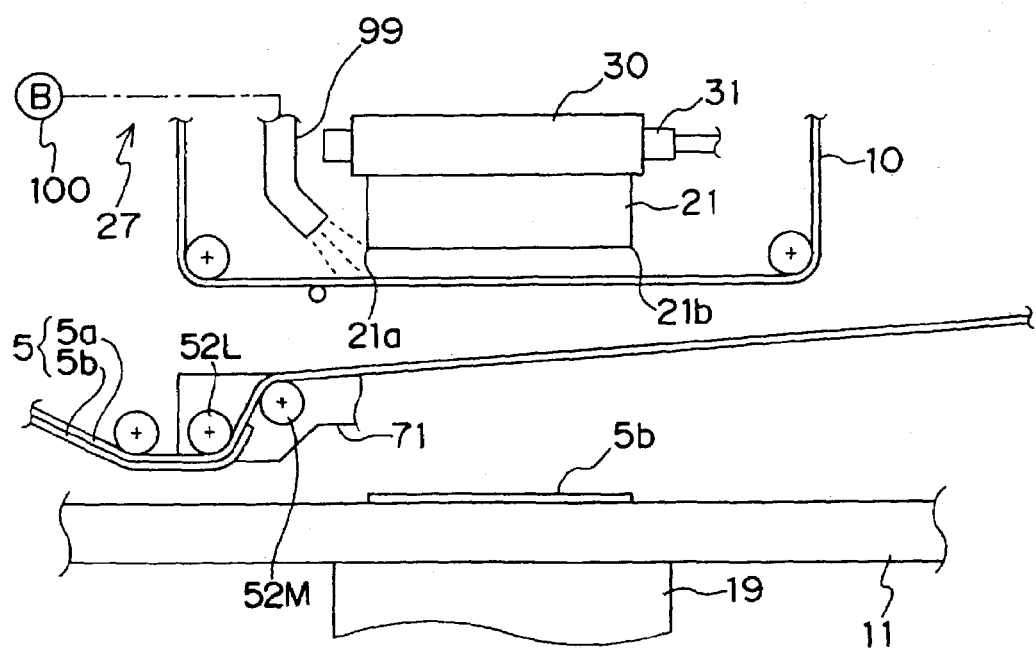
FIG. 14D is a partially enlarged front view showing the ACF applying apparatus at the time when the base layer is stripped from the PDP board.

Next, the rod of the second air cylinder 72 reaches its extended position, whereby as shown in FIGS. 5 and 14D stripping arm 71 is moved leftward (as shown in these figures) in the horizontal direction. Hence, only the base layer 5a of the ACF tape 5 is stripped from the PDP board 11 by the guide rollers 52L and 52M installed at the front end of the stripping arm 71. As a result, a portion corresponding to a range from the front end to the slit 6 of the ACF layer 5b is left on the PDP board 11. The lifting block 34 is then moved upward and returns to its initial position shown in FIGS. 2A, 2B and 14A, whereby application of the ACF layer 5b to the PDP board 11 is completed. The ACF applying section 14 repeatedly performs the above-mentioned operation.

In order to newly perform application of the ACF layer 5b, it is necessary to feed the ACF tape 5. This feeding of the ACF tape 5 is performed as described below. First, the chuck 45C holds the ACF tape 5. On the other hand, the chuck 45B releases the ACF tape 5. Next, the ACF tape reel 42 is rotated by the motor 32B, whereby the ACF tape 5 is fed by a constant length. This feeding length of the ACF tape 5 is set by positioning the front end of the ACF layer 5b (the slit 6 formed at a time of a previous application of the ACF layer 5b) in the vicinity of the fringe 21b of the tool 21. Next, the second ball screw 67 is rotated by the motor 32C, whereby pull block 68 is moved upward. As the pull block 68 is moved upward, the ACF tape 5 is fed to the ACF tape recovery section 39 and recovered into the suction tank 47.

The controller 18 counts a number of times the ACF applying section 14 has performed application of the ACF layer 5b to the PDP board 11; that is, the number of times the tool 21 biased toward the stage 19 has pressurized the ACF layer 5b against the PDP board 11. In addition, when the controller 18 detects that this number of the application times has reached a predetermined number of times (a limit number of times), the protection tape supplying section 26 supplies the protection tape 10 from the protection tape storage section 73 to the protection tape recovery section 74, whereby an unused portion of the protection tape 10 is supplied to the tool 21.

The protection tape 10 is fed when the tool 21 is positioned away from the stage 19 as shown in FIGS. 2A, 2B and 14D. First, the chuck 45E releases the protection tape 10. Next, the protection tape reel 77 is rotated by the motor 32D, whereby the protection tape 10 is fed by a predetermined length. This length of the protection tape 10 to be fed is set so that the lower end face of the tool 21 faces an unused portion of the protection tape 10 when one feeding operation is performed. The length of the protection tape 10 fed from the protection tape reel 77 is measured by a number of the detection pieces 88 passing through the sensor 51K. Next, the drive roller 90 of the pinch roller mechanism 89 rotates to feed the protection tape 10 to the protection tape recovery section 74. The protection tape 10 fed to the protection tape recovery section 74 is recovered into the suction tank 78.

Figure 35:
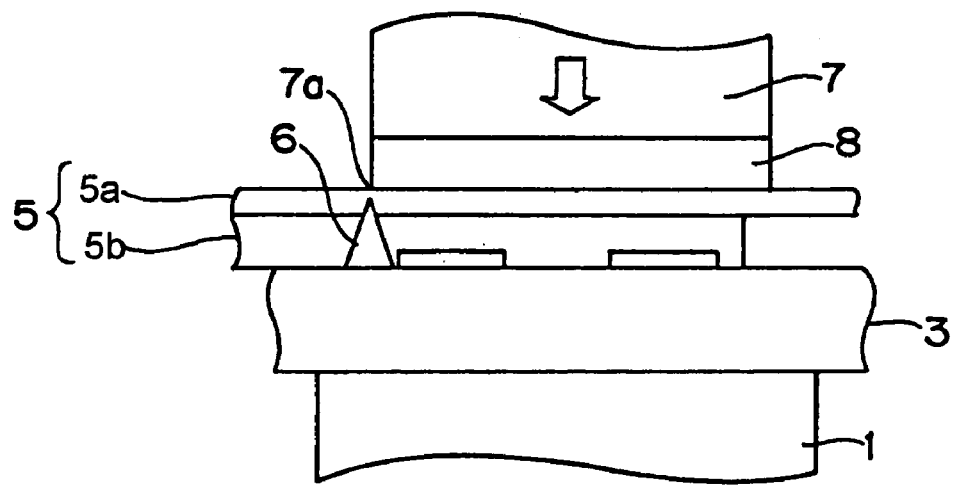
FIG. 35 is a partially front view showing an example of a conventional ACF applying apparatus.
Figure 36:
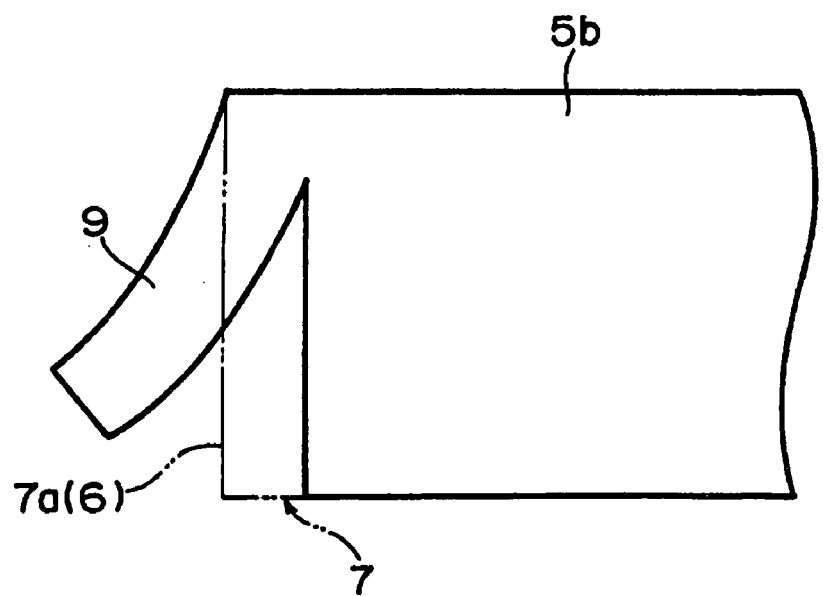
FIG. 36 is a partially schematic plan view illustrating a problem in the conventional ACF applying apparatus.

In this embodiment, an unused portion of the protection tape 10 is fed to the tool 21 each time the limit number of times is reached as described above. Hence, application of the ACF layer 5b can be performed by using the protection tape 10 free from advanced deterioration due to influence of heat and pressure. Therefore, accurate application of the ACF layer 5b can be repeated stably. In addition, in comparison with a case (see FIG. 35) wherein the tool is provided with a cover layer, it is not necessary to exchange the tool 21, or a frequency of exchange is reduced significantly, whereby maintainability and production efficiency are improved remarkably.

Each time application of the ACF layer 5b is performed as described above until the limit number of times is reached, a new portion of the protection tape 10 is fed from the protection tape reel 77. When the protection tape 10 on one protection tape reel 77 is used up, the protection tape reel 77 is exchanged with a new reel in accordance with a procedure described below.

Figure 15A:
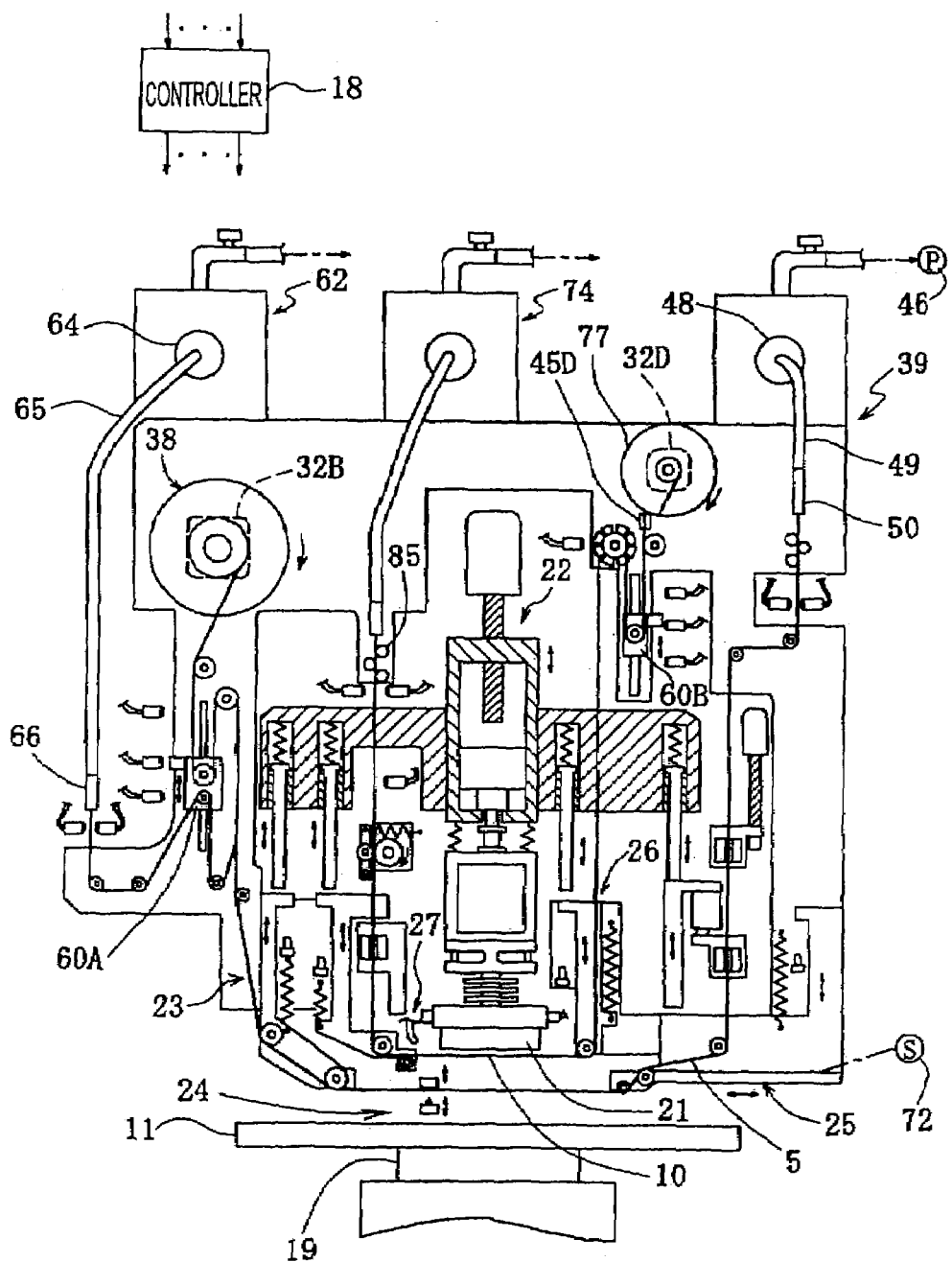
FIG. 15A is a front view showing the ACF applying apparatus and illustrating exchange work of a protection tape.
Figure 15B:
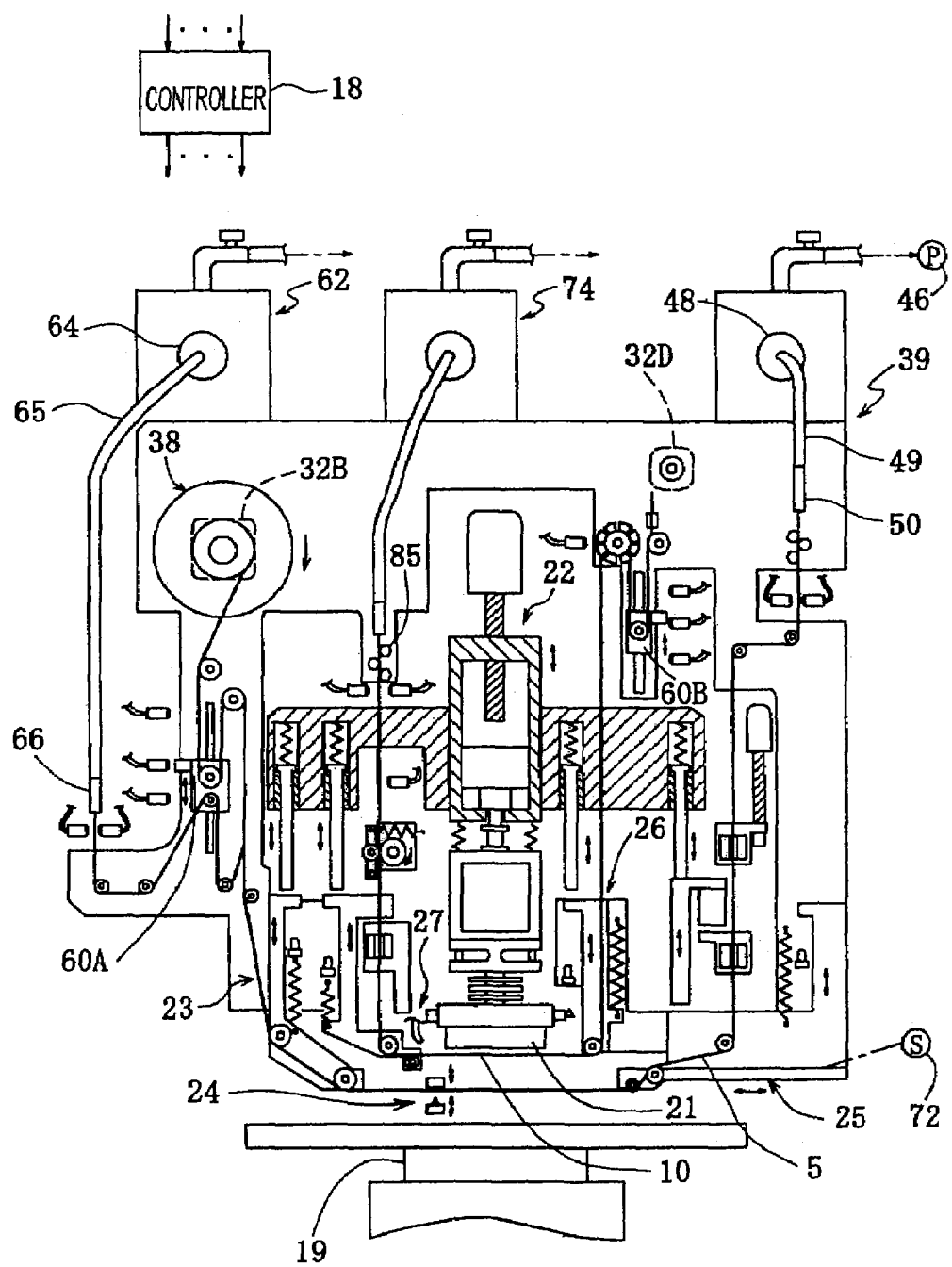
FIG. 15B is a front view showing the ACF applying apparatus and illustrating the exchange work of the protection tape.
Figure 15C:
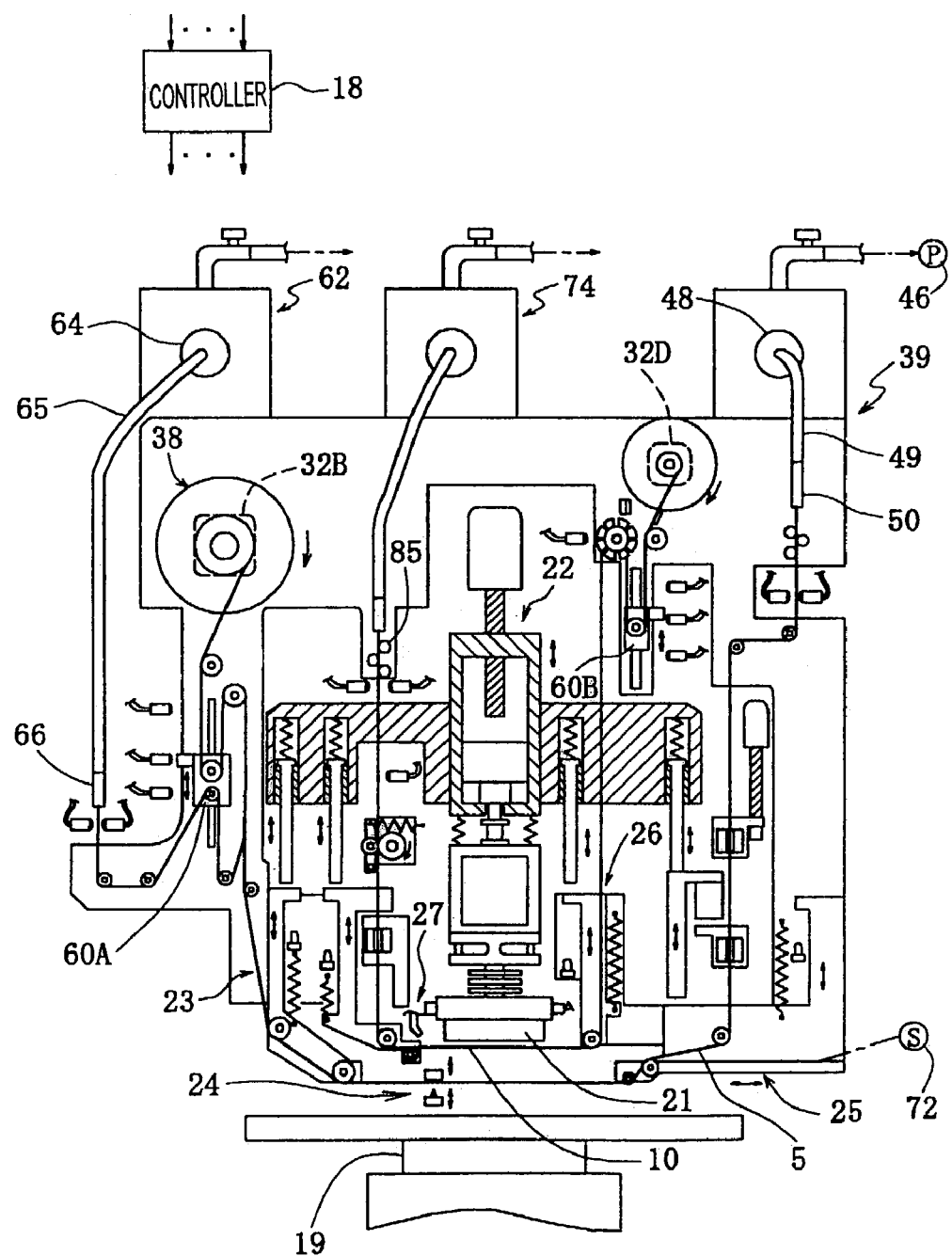
FIG. 15C is a front view showing the ACF applying apparatus and illustrating the exchange work of the protection tape.
Figure 16A:
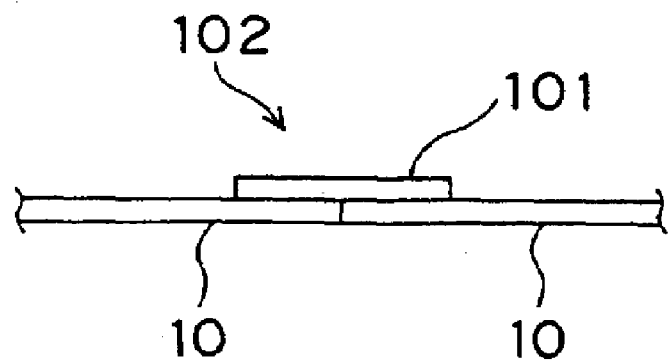
FIG. 16A is a partial side view showing an example of the connection of a protection tape.
Figure 16B:
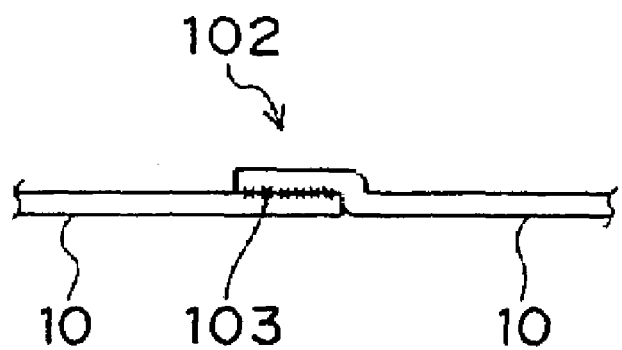
FIG. 16B is a partial side view showing another example of the connection of a protection tape.

First, as shown in FIG. 15A, the protection tape 10 is held by the chuck 45D, and the protection tape 10 is cut in the vicinity of the protection tape reel 77. Next, as shown in FIG. 15B, the protection tape reel 77 is removed from the ACF applying section 14. Furthermore, as shown in FIG. 15C, a new protection tape reel 77 is installed, and a front end of the protection tape 10 wound on this protection tape reel 77 is connected to an end of the protection tape 10 delivered from a previous protection tape reel 77 and being held with the chuck 45D. Various methods are available as a method for connecting these protection tapes 10. For example, as shown in FIG. 16A, a short connection tape 101 is used to bond two protection tapes 10, whereby a connection portion 102 can be formed. In addition, as shown in FIG. 16B, connection portion 102 of the two protection tapes 10 can be formed by ultrasonic welding 103.

It is preferable that the connection portion 102 of the two protection tapes 10 is not used for pressurizing the ACF layer 5b. If the ACF layer 5b is pressurized by the tool 21 while the connection portion 102 is involved, it is difficult to make a pressurizing force applied to the ACF layer 5b uniform owing to unevenness on the connection portion 102. For this reason, in a case when the protection tape reel 77 is exchanged, before resuming application of the ACF layer 5b, it is necessary to feed the protection tape 10 toward the protection tape recovery section 74 until at least the connection portion 102 passes the upper face of the stage 19.

In this embodiment, the protection tape feeding section 76 feeds the protection tape 10 toward the protection tape recovery section 74 until the connection portion 102 is detected by the connection portion sensor 51L. As the connection portion sensor 51L, a sensor capable of detecting magnetism, colors or steps can be used. In a case when the sensor 51L detects magnetism, a magnetic tape should only be used as the connection tape 101 (see FIG. 16A). In a case when the sensor 51L detects colors, the connection tape 101 should only be colored so as to have a color different from a color of the protection tape 10, or a portion subjected to the ultrasonic welding 103 (see FIG. 16B) should only be colored so as to have a color different from the color of the protection tape 10. Furthermore, in a case where the sensor 51L can detect steps, the sensor 51L detects a step formed by the connection tape 101 and the protection tape 10, and also detects a step at a portion wherein two protection tapes 10 are overlaid for the ultrasonic welding 103.

Structure of the frame 20 will be described referring to FIGS. 6 and 9. First, the fixed section 28 is equipped with a pair of brackets 104 facing each other with space provided therebetween in the vertical direction. A rotary shaft 105 extending in the vertical direction is fixed to these brackets 104. A rotary block 106 is rotatably supported by the rotary shaft 105. Two support shafts 107 pass through the rotary block 106. The movable section 29 is fixed to front ends of these support shafts 107. Springs 37C are disposed between the rotary block 106 and the movable section 29. These springs 37C elastically bias the rotary block 106 and the movable section 29 so that they are away from each other. The rotary block 106 is provided with a cam 109 that can be operated by a handle 108. A cam follower 110 (roller) mated with this cam 109 is installed on a drive arm 112 extending from a detachment prevention plate 111 fixed to base ends of the support shafts 107. In addition, the rotary block 106 is also provided with an engagement pin 114 passing through bracket 104 and inserted into pin hole 113 in the rotary block 106.

Next, an inversion procedure of the frame 20 will be described below. First, in the state shown in FIGS. 6 and 9, the cam 109 is rotated by operating the handle 108. Since the cam follower 110 follows a face of the cam 109, the movable section 29 is moved horizontally by biasing forces of the springs 37C, whereby the movable section 29 is moved away from the fixed section 28 as shown in FIGS. 7 and 10. Next, the engagement pin 114 is extracted from the pin hole 113, and connection between the bracket 104 and the rotary block 106 is cancelled. Then, as shown in FIGS. 8 and 11, the movable section 29 is rotated 180° about its support shaft in a plane view. As schematically shown in FIG. 1, the ACF tape supplying section 23 and the protection tape supplying section 26 usually face the guide rails 13. However, when the movable section 29 is rotated and inverted, these sections face outside of the component mounting apparatus. Hence, operator M can perform exchange work of the ACF tape reel 42 and the protection tape reel 77 without entering the component mounting apparatus.

Next, the pre-press bonding section 15 will be described below. The pre-press bonding section 15 positions an FPC board 12 supplied from an FPC supplying section 115 with respect to the PDP board 11 to which the ACF layer 5b has already been applied by the ACF applying section 14. In addition, after this positioning, the pre-press bonding section 15 pressurizes the FPC board 12 in a heated state against the PDP board 11, and the FPC board 12 is pre-press bonded against the PDP board 11 by using the ACF layer 5b. A pressurizing force for this pre-press bonding is 50 to 100 N/cm$^2$, for example, and a temperature during this pressurizing is about 60 to 70° C., for example.

Figure 17:
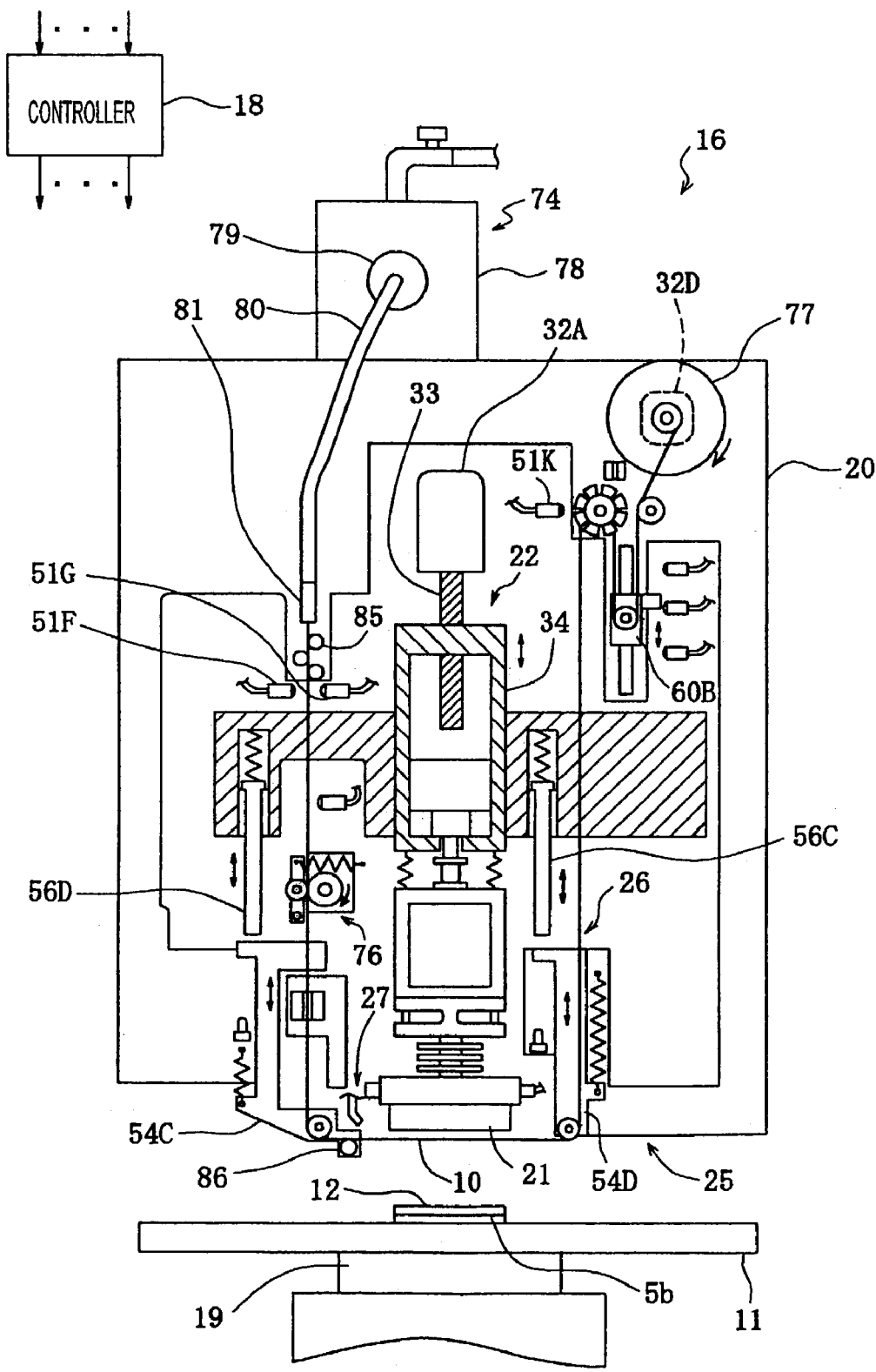
FIG. 17 is a front view showing a final-press bonding apparatus.

Next, the final-press bonding section 16 will be described below. As shown in FIG. 17, the final-press bonding section 16 is provided with a stage 19 on which the PDP board 11 with the FPC board 12, having already been pre-press bonded thereon by the pre-press bonding section 15, is mounted. This stage 19 can be moved up and down and can releasably hold the PDP board 11 on an upper face thereof by using a suction mechanism (not shown). Frame 20 disposed above this stage 19 is provided with a tool 21, a tool biasing section 22, a protection tape supplying section 26 and a protection tape cooling section 27. The structure of the final-press bonding section 16 is the same as that of the ACF applying section 14 except that the final-press bonding section 16 has no ACF tape supplying section. The same components shown in FIG. 17 as those shown in FIGS. 2A and 2B are designated by the same numerals.

As shown in FIG. 17, when the tool 21 is positioned away from the stage 19 with space provided therebetween, the PDP board 11, on which FPC boards 12 have already been pre-press bonded, is supplied from the pre-press bonding section 15 to the stage 19. Next, the tool 21 is moved downward by the tool biasing section 22, and is thereby biased toward the stage 19. In addition, when the movable arms 54C and 54D are moved downward by the push rods 56C and 56D, the protection tape 10 is also moved downward together with the tool 21. The FPC board 12 is pressurized in a heated state against the ACF layer 5b applied to the PDP board 11 by the tool 21 biased toward the stage 19. The protection tape 10 having elasticity is placed between the tool 21 and the FPC board 12. Hence, a uniformly distributed pressurizing force is applied from the tool 21 to the FPC board 12, whereby the FPC board 12 can be fixed to the PDP board 11 by using the ACF layer 5b. A pressurizing force applied by press-bonding tool 21 is 300 to 400 N/cm$^2$, for example, and a temperature during this pressurizing is 180 to 200° C., for example.

The controller 18 counts a number of times the final-press bonding section 16 has performed final-press bonding of the FPC board 12 to the PDP board 11. When the controller 18 detects that the number of times has reached a limit number of times, the protection tape feeding section 76 supplies the protection tape 10 from the protection tape storage section 73 to the protection tape recovery section 74, whereby an unused portion of the protection tape 10 is supplied to the tool 21. Hence, final-press bonding can be performed by using a protection tape 10 free from advanced deterioration due to influence of heat and pressure. Furthermore, unlike a case wherein the tool is provided with the cover layer, it is not necessary to exchange the tool 21, whereby maintainability and production efficiency are improved remarkably. Other operations of the final-press bonding section 16 are similar to those of the ACF applying section 14.

Second Embodiment

FIGS. 18 to 21 show an ACF applying apparatus in accordance with a second embodiment of the present invention.

This ACF applying apparatus comprises a stage 19, an ACF tape supplying section 23, a tool 21, a stripping section 124, a cutting section 126 and an ACF tape cooling section 127. This ACF applying apparatus is used to apply ACF tape 5 to an LCD board 129 (object) in this embodiment.

Figure 34:
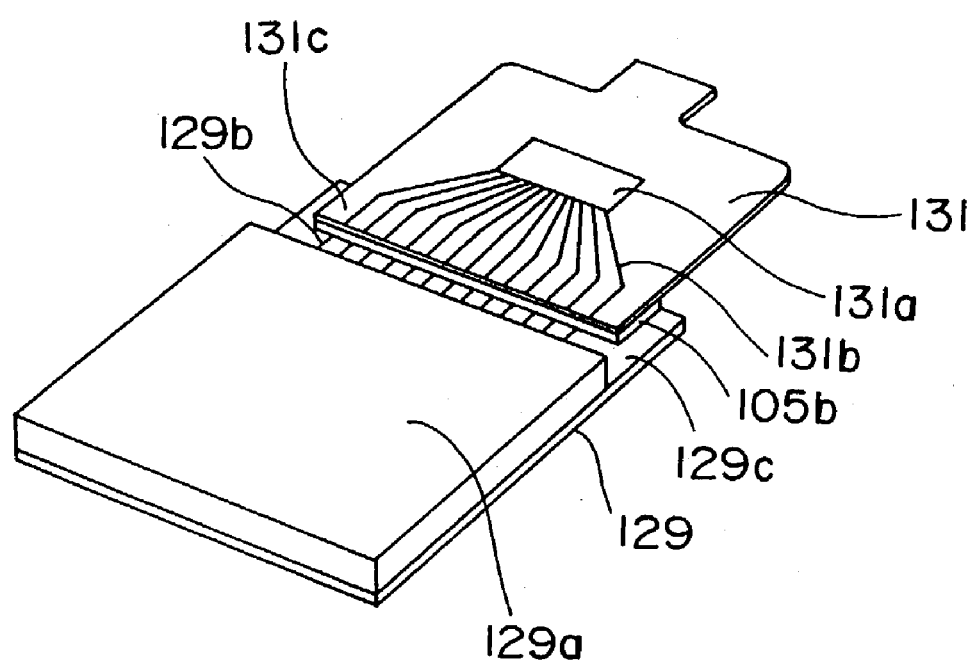
FIG. 34 is a perspective view showing an LCD board.

As shown in FIG. 34, the LCD board 129 comprises a liquid crystal display section 129a and an electrode section 129c, wherein ends of a plurality of driver voltage supply lines 129b are disposed linearly. ACF layer 5b of ACF tape 5 is applied to this electrode section 129c, and an FPC board 131 is joined by this ACF layer 5b having been applied. The FPC board 131 comprises a driver circuit 131a formed of IC chips and the like, and an electrode section 131c, wherein the driver voltage supply lines 131b of the driver circuit 131a are disposed linearly. At this electrode section 131c, the FPC board 131 is joined to the LCD board 129.

The above-mentioned stage 19 has a plurality of suction holes (not shown) on an upper face thereof. The LCD board 129 can be held by suction by performing vacuum suction through the suction holes.

The ACF tape supplying section 23 comprises an ACF tape storage section 38 for storing the ACF tape 5 in a wound state, and an ACF tape feeding section 41 for feeding the ACF tape 5 by a predetermined length at a time.

Figure 19:
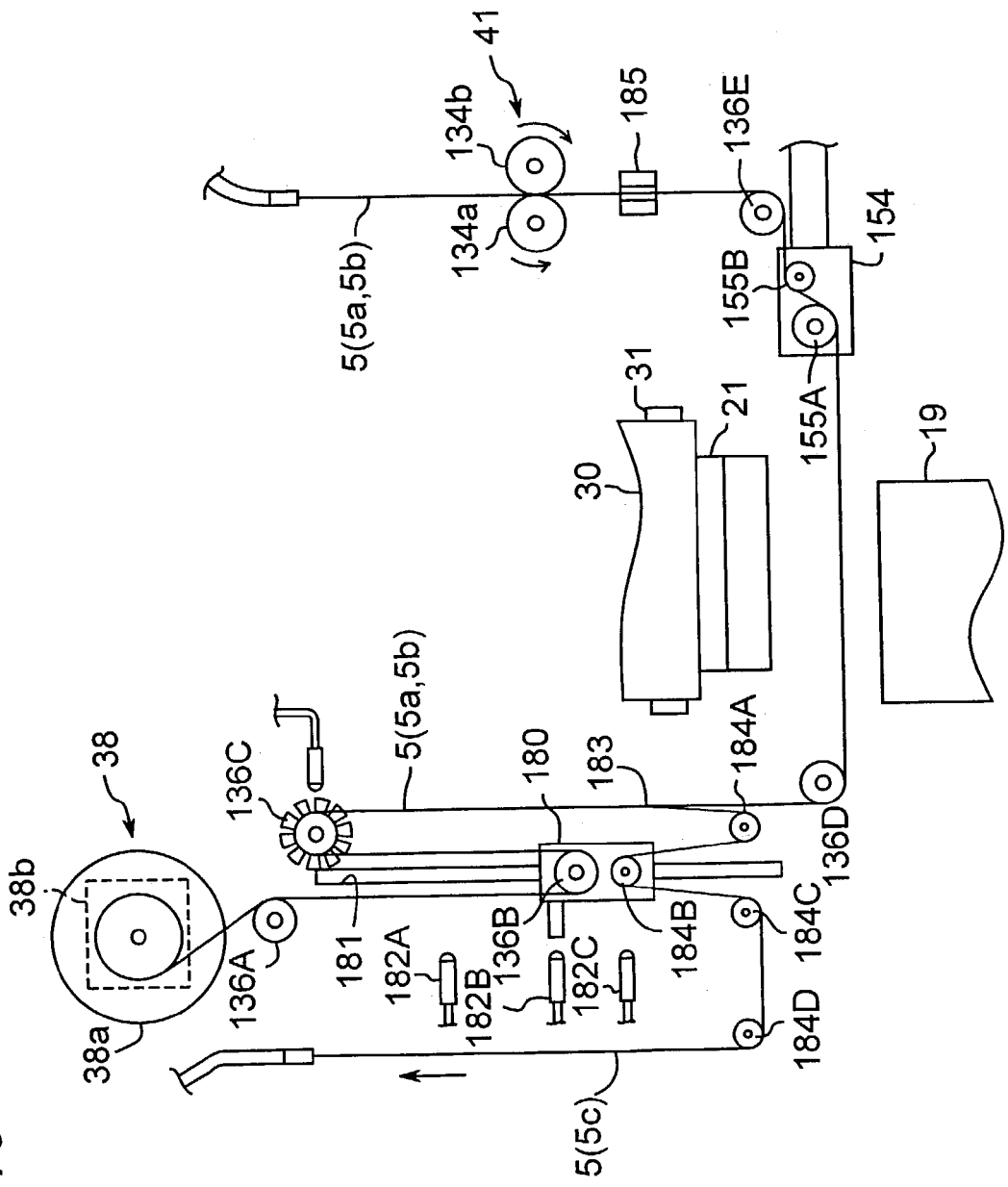
FIG. 19 is a schematic front view showing the ACF applying apparatus in accordance with the second embodiment of the present invention.

As shown in FIG. 19, the ACF tape storage section 38 comprises a reel 38a on which the ACF tape 5 is wound many times, and a motor 38b for rotating the reel 38a to deliver the ACF tape 5. In addition, rotatable guide rollers 136A to 136E are provided to guide the ACF tape 5 delivered from the ACF tape storage section 38. Among these guide rollers 136A to 136E, the guide rollers 136D and 136E are used to control a position of the ACF tape 5 in a vertical direction (Z direction) so that the ACF tape 5 is extended in a horizontal direction (X direction) above the electrode section 129c of the LCD board 129 being held by suction on the stage 19. Furthermore, the ACF tape 5 is supported by the guide rollers 136A and 136B so that the ACF layer 5b is directed downward and faces the stage 19, and so that the base layer 5a is directed upward. The guide roller 136B is installed on a weight member 180 for applying tension to the ACF tape 5. This weight member 180 is movable along a guide groove 181 extending in the vertical direction. Weight of the weight member 180 is used as tension applied to the ACF tape 5. A position of the weight member 180 is detected by sensors 182A to 182C. Cover layer 5c stripped from the ACF layer 5b at a branch point 183 is recovered into a vacuum suction tank (not shown) via guide rollers 184A to 184D.

As shown in FIG. 19, the ACF tape feeding section 41 comprises a pinch roller mechanism comprising a pair of rollers 134a and 134b. The rollers 134a and 134b are movable to a first position wherein the ACF tape 5 is held therebetween, and a second position wherein the ACF tape 5 is released. The rollers 134a and 134b are rotated at the first position, whereby the ACF tape 5 (the base layer 5a) is fed from the ACF tape storage section 38 to a vacuum suction tank (not shown). A chuck 185 for fixing the ACF tape 5 at a time of application of the ACF layer 5b is disposed between the ACF tape feeding section 41 and the guide roller 136E.

The tool 21 is fixed to a lower end of holding member 30 equipped with a heater 31 so as to face the electrode section 129c of the LCD board 129 mounted on the stage 19. The tool 21 can be moved in upward and downward directions (+Z and −Z directions) by a driving mechanism 139.

The driving mechanism 139 will be described below. The mechanism is provided with a guide rail 141 extending in the vertical direction. Two guide blocks 142A and 142B are slidably disposed on the guide rail 141.

A block 143 is fixed to lower guide block 142A, and the holding member 30 is fixed to a lower end of the block 143. In addition, a spring support bracket 144A is fixed to a side of the block 143.

On the other hand, a pressurizing air cylinder 146 is fixed to upper guide block 142B so that its rod 146a is directed downward. In addition, a spring support bracket 144B is fixed on one side of the pressurizing air cylinder 146. Ends of a self weight canceling spring 147 are hooked to the spring support bracket 144B and the spring support bracket 144A of the block 143, respectively. This spring 147 has a function of pulling the lower guide block 142A together with the block 143, the holding member 30 and the tool 21 upward to the upper guide block 142B. In addition, a nut fixing bracket 149 to which a nut 148a for a ball screw 148 is fixed is installed on another side of the air cylinder 146. This nut 148a is engaged with the ball screw 148 extending in the vertical direction. An upper end of the ball screw 148 is connected to an output shaft of a servomotor 152 via a coupling 151. Rotation of the servomotor 152 is converted into upward or downward movement of the nut 148a by the ball screw 148. The tool 21 is moved up or down by the upward or downward movement of the nut 148a as described later.

The stripping section 124 comprises an air cylinder 153. A base end of a bracket 154 is connected to a front end of rod 153a, extending in the horizontal direction, of the air cylinder 153. The bracket 154 is movable in the horizontal direction (+X and −X directions). Rotatable guide rollers 155A and 155B are disposed on the bracket 154. Among these guide rollers 155A and 155B, the guide roller 155A disposed on a front end of the bracket 154, just like the guide rollers 136A and 136B of the ACF tape supplying section 23, is configured so that the ACF tape 5 is wound around on a lower side thereof. However, the guide roller 155B disposed on the base end side of the bracket 154 is configured so that the ACF tape 5 is wound around on an upper side thereof. For this reason, when the bracket 154 is moved leftward (in the −X direction) in FIG. 19, a portion of the ACF tape 5 passing through the bracket 154 is moved upward (in the +Z direction). On the other hand, when the bracket 154 is moved rightward (in the +X direction) in FIG. 19, the portion of the ACF tape 5 passing through the bracket 154 is moved downward (in the −Z direction).

The cutting section 126 comprises a main body 126a movable forward and backward in a horizontal direction (+Y and −Y directions) orthogonal to a feeding direction of the ACF tape 5, and a pair of arms 126b, base ends of which are installed on the main body 126a, and which are disposed so as to face each other in the vertical direction. Lower arm 126b is equipped with a blade 126c for cutting the ACF tape 5 at a front end thereof. These arms 126b are driven so as to be moved close to or away from each other by a driving mechanism accommodated in the main body 126a. Movement ranges of the arms 126b are set so that the blade 126c cuts only the ACF layer 5b of the ACF tape 5 when the arms become closest to each other.

Figure 18:
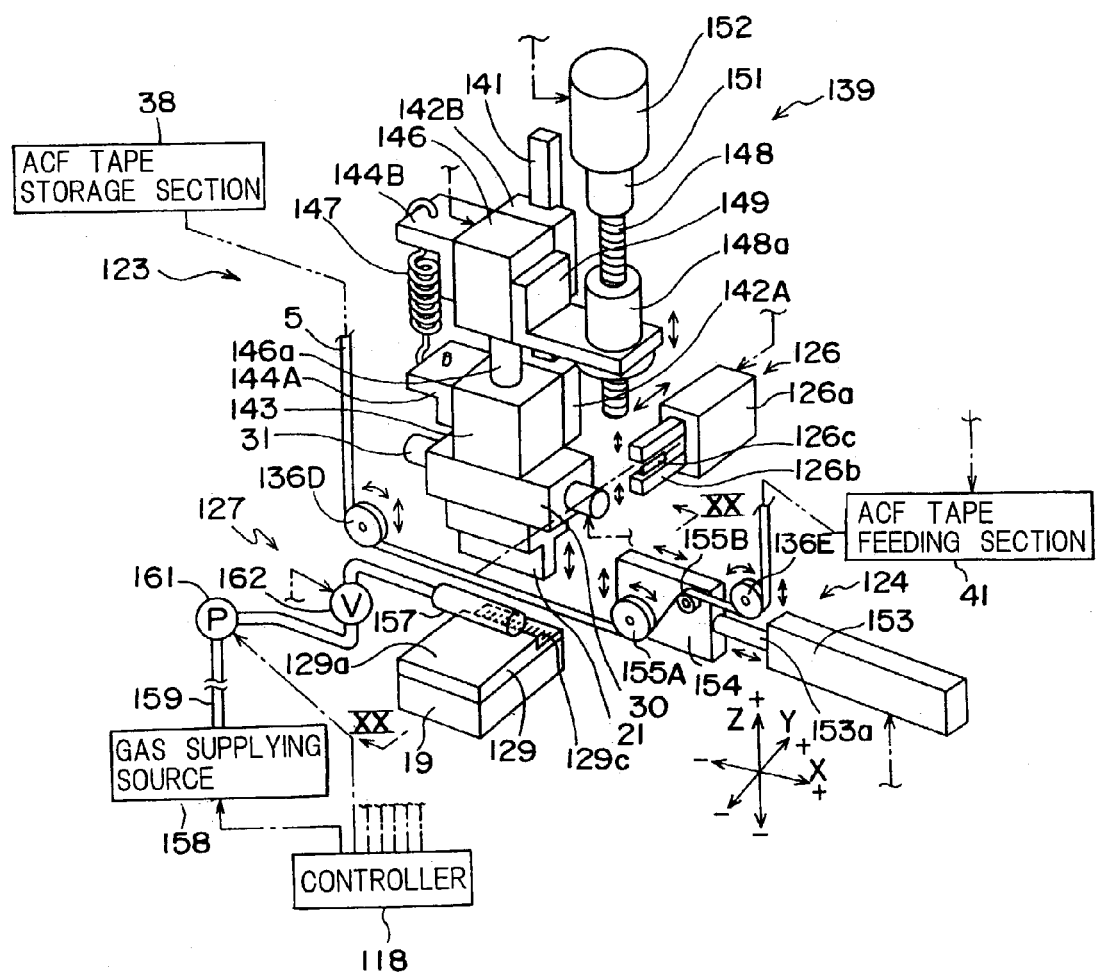
FIG. 18 is a perspective view showing an ACF applying apparatus in accordance with a second embodiment of the present invention.

As shown in FIG. 18, the ACF tape cooling section 127 comprises a gas ejection nozzle 157 (gas ejection device) and a gas supplying section 158 for supplying cooling gas to the nozzle 157. A pipe 159 for connection between the nozzle 157 and the gas supplying section 158 is provided with a valve 162 for controlling supply and shutoff of gas from the gas supplying section 158 to the nozzle 157, and a pump 161 for adjusting pressure of the gas supplied to the nozzle 157.

Figure 20:
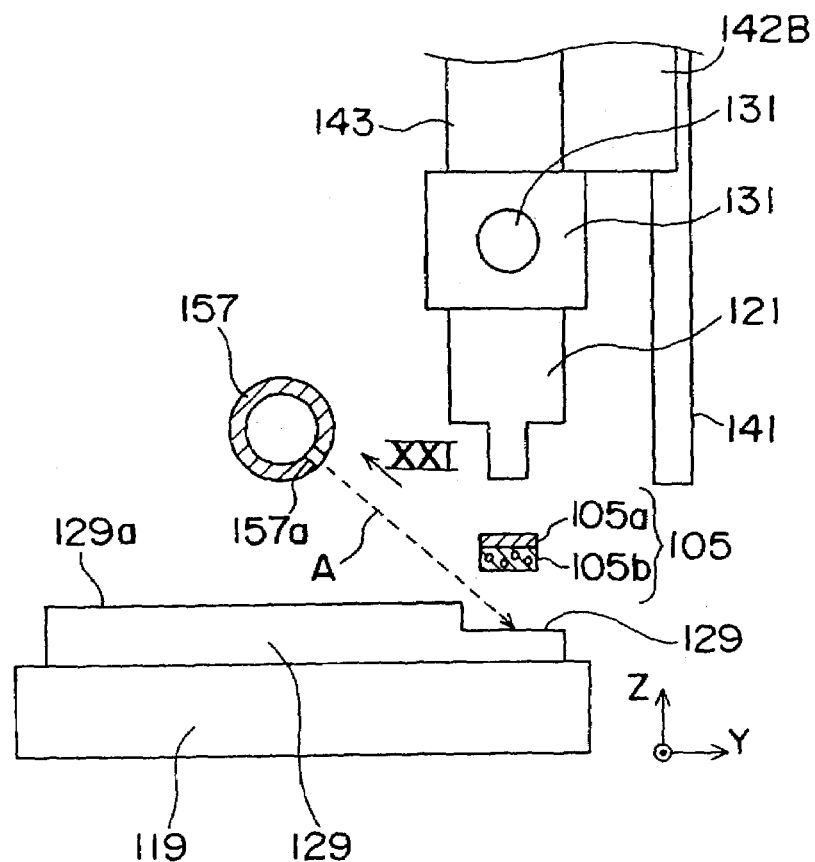
FIG. 20 is an enlarged sectional view taken on line XX—XX of FIG. 18.
Figure 21:
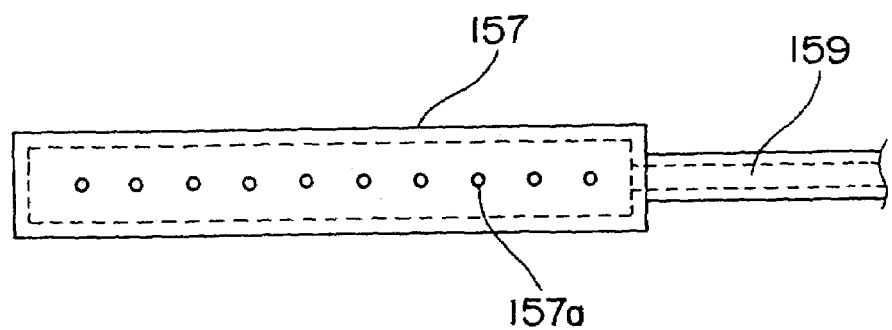
FIG. 21 is a view showing a nozzle in a direction of arrow XXI of FIG. 20.

As shown in FIGS. 20 and 21, the nozzle 157 is formed of a slender hollow cylinder with both ends closed. Gas ejection holes 157a, i.e., round small-diameter holes, are formed at equal intervals in a longitudinal direction of the nozzle. In addition, one end of the nozzle 157 is connected to the pipe 159.

As shown in FIGS. 18 and 20, the nozzle 157 is disposed so as to extend in parallel with the electrode section 129c of the LCD board 129 mounted on the stage 19, and so as not to interfere with the tool 21. In addition, a position of the nozzle 157 and an angular position around an axis thereof are set so that gas is sprayed, as indicated by a dotted line A in FIG. 20, from the liquid crystal display section 129a to the electrode section 129c of the LCD board 129; that is, from the ends of the driver voltage supply lines 129b on the side of the liquid crystal display section 129a to an end of the electrode section 129c of the LCD board 129.

As gas to be supplied from the gas supplying section 158 to the nozzle 157, air is available, for example. Ions may be included in the gas to be supplied from the gas supplying section 158 to the nozzle 157. In this case, static electricity is eliminated from the LCD board 129 by action of the ions, whereby static damage to the LCD board 129 can be prevented. As cooling gas, air (atmospheric air), clean air, nitrogen gas, and the like can be used. In addition, for example, equal amounts of plus ions and minus ions should only be included in the gas. Furthermore, a temperature of this cooling gas should only be set at room temperature, or more, and less than a temperature of the ACF tape 5 that is heated by the tool 21.

The controller 18 shown in FIG. 18 controls operations of the apparatus in its entirety including the ACF tape feeding section 41, the air cylinders 146 and 153, the servomotor 152, and the valve 162 and the pump 161 of the ACF tape cooling section 127, on basis of input signals from control boards and various sensors not shown.

Figure 22:
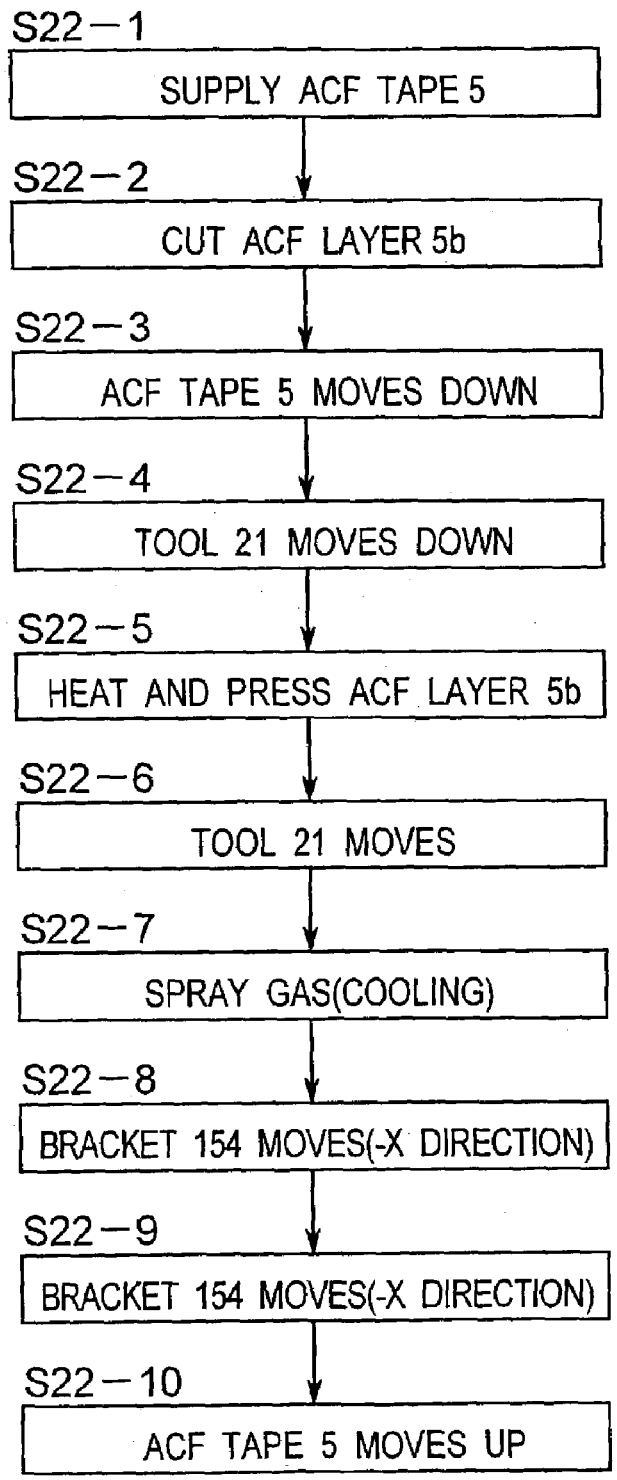
FIG. 22 is a flowchart for explaining operation of the ACF applying apparatus in accordance with the second embodiment.
Figure 23A:
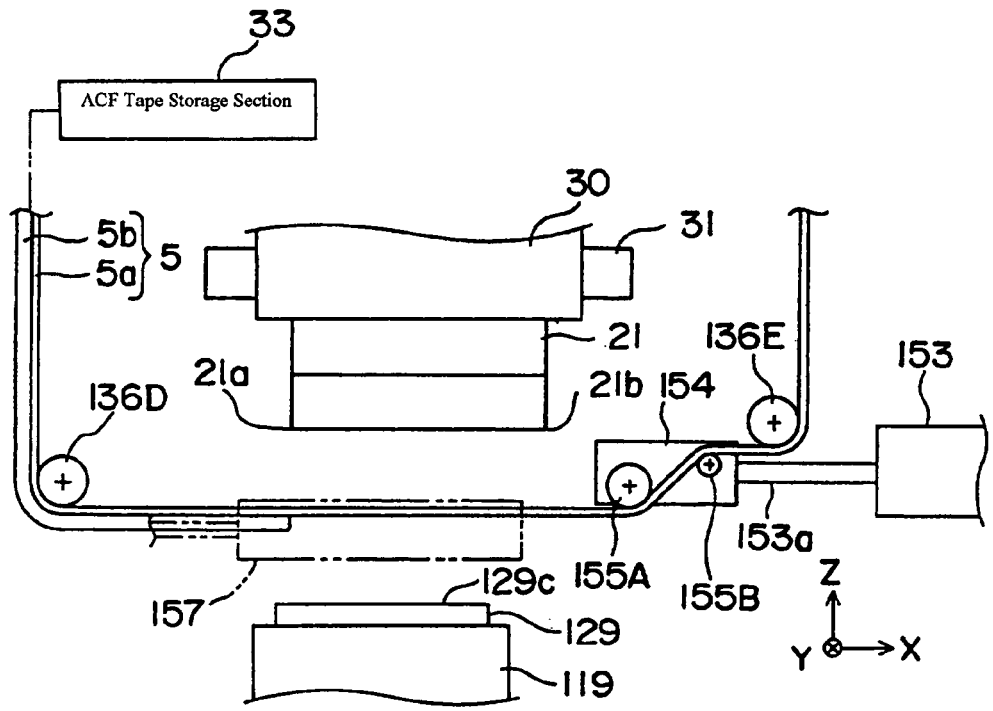
FIGS. 23A to 23E are partially enlarged front views showing the ACF applying apparatus in accordance with the second embodiment.
Figure 23B:
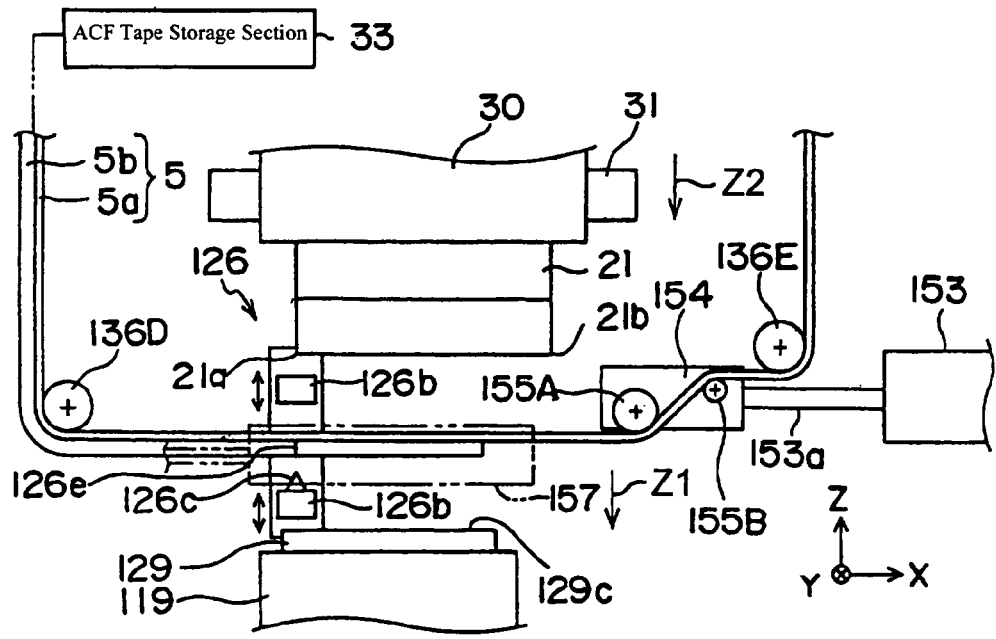

Next, an operation of the bonding sheet applying section in accordance with the second embodiment will be described referring to the flowchart of FIG. 22. First, at step S22-1, the ACF tape 5 is supplied by the ACF tape supplying section 23. As shown in FIG. 23A, before the ACF tape 5 is supplied, a front end of the ACF layer 5b is aligned with left fringe 21a (as shown in FIG. 23A) of the tool 21. From this state, as shown in FIG. 23B, the ACF tape 5 is fed in the +X direction until an end of the ACF layer 5b becomes close to another end of the LCD board 129. In addition, at step S22-2, the ACF layer 5b is cut and a slit 6 is formed. More specifically, after the main body 126a of the cutting section 126 advanced in the −Z direction, as shown in FIG. 23B, the two arms 126b become close to each other, and only the ACF layer 5b of the ACF tape 5 is cut at only one position by the blade 126c. A position of the slit 6 coincides with the left fringe 21a (as shown in FIG. 14A) of the tool 21.

Figure 23C:
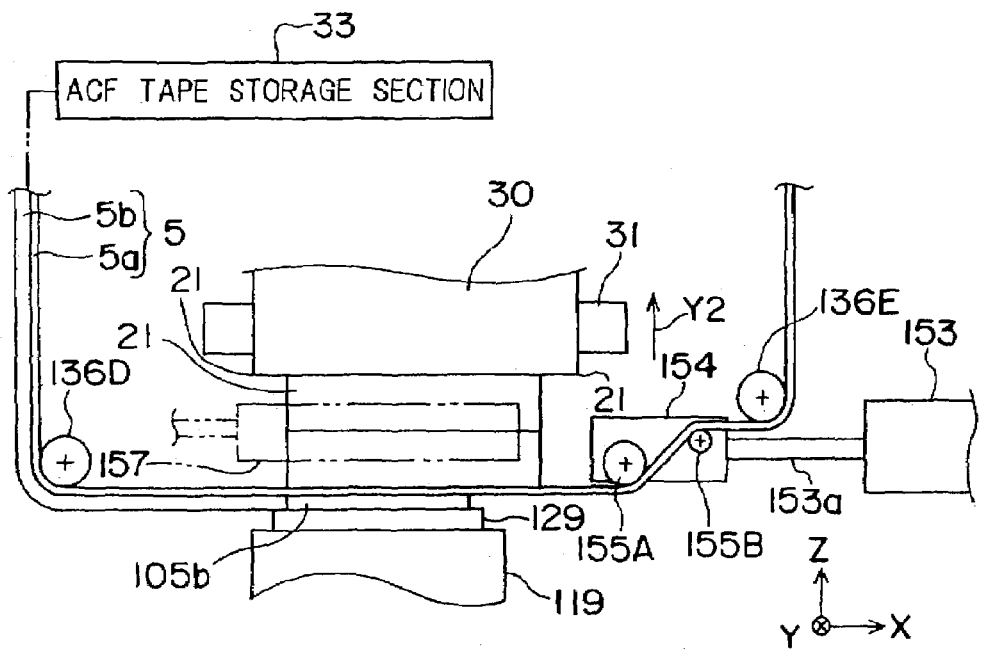

Next, at step S22-3, as indicated by the arrow Z1 of FIG. 23B, the ACF tape supplying section 23 and the stripping section 124 are moved downward. As shown in FIG. 23C, the ACF tape supplying section 23 and the stripping section 124 are moved downward until the ACF layer 5b makes contact with the electrode section 129c of the LCD board 129.

In addition, at step S22-4, as indicated by the arrow Z2 of FIG. 23B, the tool 21 is moved downward. As shown in FIG. 23C, the tool 21 is moved downward until it makes contact with the base layer 5a of the ACF tape 5. Operation of the driving mechanism 139 at the time when the tool 21 is moved downward will be described below in detail. First, when the tool 21 is moved downward, rod 146a of the pressurizing air cylinder 146 extends against force of the spring 147, and a front end of the rod 146a makes contact with an upper portion of the block 143 fixed to the lower guide block 142A. When the servomotor 152 rotates in its predetermined direction, this rotation is transmitted to the ball screw 148 via the coupling 151. When the ball screw 148 is rotated, the nut 148a is moved downward. Since the nut 148a is connected to the upper guide block 142B equipped with the pressurizing air cylinder 146, when the nut 148a is moved downward, the pressurizing air cylinder 146 is moved downward together with the guide block 142B, whereby the block 143 is pushed downward by the front end of the rod 146a. As a result, the holding member 30 and the tool 21 are moved downward together with the guide block 142A.

Figure 23D:
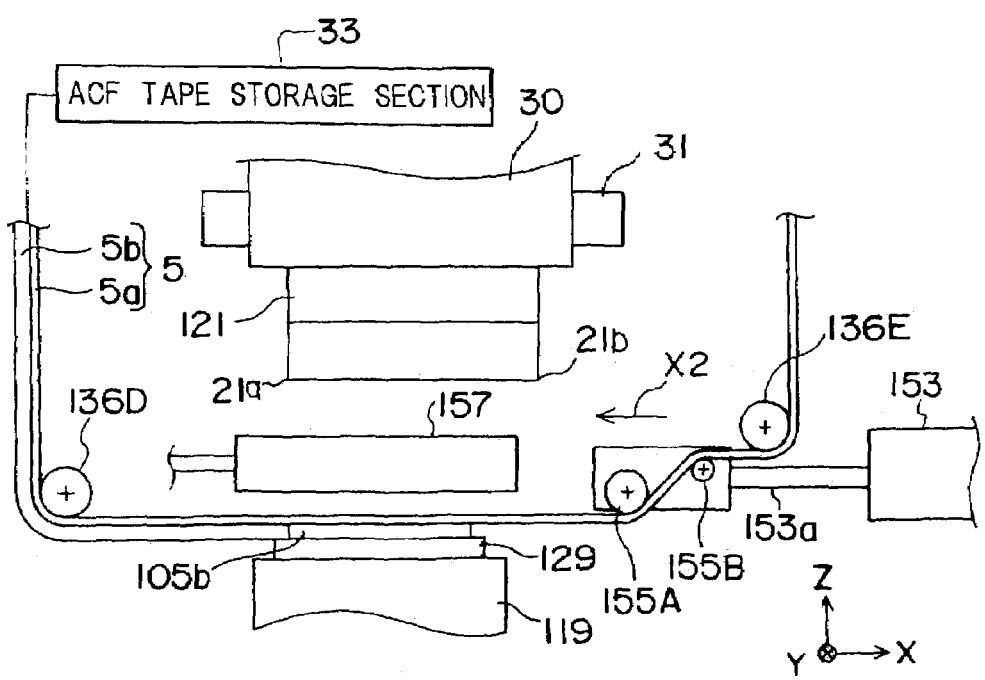

Next, at step S22-5, the ACF layer 5b is pressurized and heated by the tool 21. First, the pressurizing air cylinder 146 is moved downward. Since the tool 21 has already made contact with the ACF tape 5 placed on the electrode section 129c of the LCD board 129 at this time, the tool 21 cannot be moved downward further. Hence, the rod 146a is pushed into the pressurizing air cylinder 146, whereby the pressurizing air cylinder 146 is moved downward. Therefore, the tool 21 is pushed against the electrode section 129c of the LCD board 129 by the rod 146a of the pressurizing air cylinder 146, and the ACF tape 5 is pushed against the electrode section 129c by the tool 21. In addition, since the tool 21 is heated by the heater 31, the ACF tape 5 is heated while being pushed to the electrode section 129c of the LCD board 129 as described above. This pressurizing and heating continue for a predetermined time, and the ACF layer 5b having already been cut by the cutting section 126 is joined to the electrode section 129c of the LCD board 129. Since the ACF tape 5 on the side of the ACF tape feeding section 41 is held by the chuck 185 during pressurizing and heating, tension is applied to the ACF tape 5. After this pressurizing and heating, at step S22-6, the tool 21 is moved upward as indicated by the arrow Z2 of FIG. 23C by operation of the driving mechanism 139, which is the reverse of its operation during the downward movement. Hence, the tool 21 returns to its initial position as shown in FIG. 23D.

Next, at step S22-7, cooling gas is sprayed from the nozzle 157 to the ACF tape 5 placed on the electrode section 129c of the LCD board 129. In other words, the valve 162 is opened and the pump 161 is driven, whereby gas supplied from the gas supplying section 158 is ejected from the gas injection holes 157a of the nozzle 157 to the ACF tape 5 placed on the electrode section 129c of the LCD board 129. Since the plural gas injection holes 157a are formed in an axial direction of the nozzle 157, cooling air is sprayed to a portion of the ACF tape 5 corresponding to a length between both fringes 21a and 21b of the tool 21, in other words, a portion of the ACF tape 5 corresponding to a length from a front end of the ACF layer 5b joined to the electrode section 129c of the LCD board 129 to the slit 6. As a result, only the ACF layer 5b having already been cut and making contact with the electrode section 129c is cooled, whereby a joining strength between the ACF layer 5b having already been cut and the electrode section 129c increases.

Figure 24:
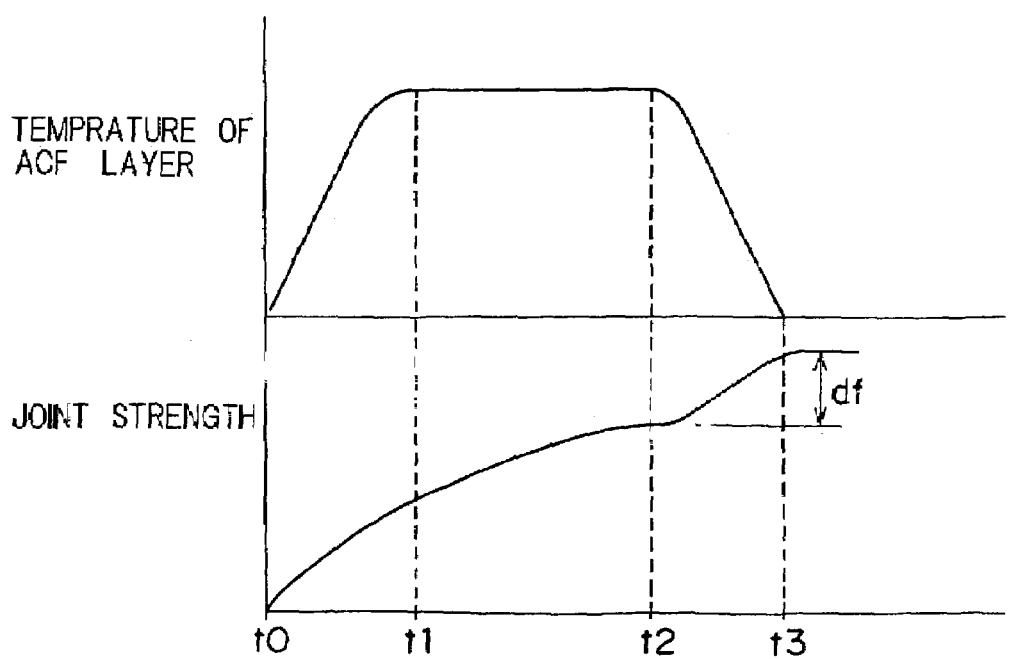
FIG. 24 is a graph showing change of temperature and joining strength of the ACF layer.

FIG. 24 shows a change of temperature of the ACF layer 5b having already been cut, and a change of a joining strength between the ACF layer 5b having already been cut and the electrode section 129c, with respect to time. In FIG. 24, time t0 is the time when heating by the tool 21 starts (at step S22-5 of FIG. 22). Both temperature and joining strength of the ACF layer 5b rise in a period from time to t0 time t1. At time t1, the temperature of the ACF layer 5b reaches an equilibrium temperature, whereby the temperature of the ACF layer 5b is nearly constant in a period from time t1 to time t2. On the other hand, the joining strength increases continuously until time t2. However, a rate of this increase gradually decreases. At time t2, the tool 21 is moved upward away from the electrode section 129c of the LCD board 129 (at step S22-6 of FIG. 22). When air spraying starts from the nozzle 157, the temperature of the ACF layer 5b lowers and returns to the temperature attained at the time before the start of the heating at time t3. On the other hand, the increase of the joining strength in the period from time t2 to time t3 is enhanced when cooling is performed by gas spraying. Hence, a rate of the increase of the joining strength in the period from time t2 to time t3 is higher than the rate of the increase of the joining strength in the heating period from time t0 to time t2. The amount indicated by df in FIG. 24 corresponds to the joining strength increased by the cooling.

In a case when the ACF tape 5 was not cooled, a defective fraction of the application of the ACF layer 5b was about 5%. On the other hand, when gas was ejected from the nozzle 157 to the ACF tape 5 for less than 5 seconds to lower the temperature of the ACF layer 5b by about 10 to 30° C., the defective fraction of the application of the ACF layer 5b was almost 0.

As described above, the position of the nozzle 157 and the angular position around the axis thereof are set so that gas is sprayed from the liquid crystal display section 129a to the electrode section 129c of the LCD board 129. Hence, waste generated from the ACF tape 5, glass chips generated from the LCD board 129 and other waste being present on the LCD board 129 are blown off by the gas sprayed for the cooling, thereby being eliminated from an upper face of the LCD board 129.

In addition, since this embodiment is configured so that the gas is ejected from the gas injection holes 157a formed in the longitudinal direction of the nozzle 157 formed of a slender hollow cylinder, slender electrode section 129c of the LCD board 129 can be cooled uniformly with a relatively small amount of gas consumption.

Furthermore, in a case when ions are included in the gas to be supplied from the gas supplying section 158 to the nozzle 157, static electricity is eliminated from the LCD board 129 by action of the ions, whereby static damage to the LCD board 129 can be prevented.

The valve 162 and the pump 161 are controlled by the controller 18 as described above. By controlling the valve 162 and the pump 161, a flow rate and spraying timing of the gas to be sprayed from the nozzle 157 to the LCD board 129 can be adjusted. By changing the flow rate and the spraying timing of the gas depending on dimensions and the like of the LCD board 129, a consumption amount of the gas can be reduced, and tact time can be made shorter.

Figure 23E:
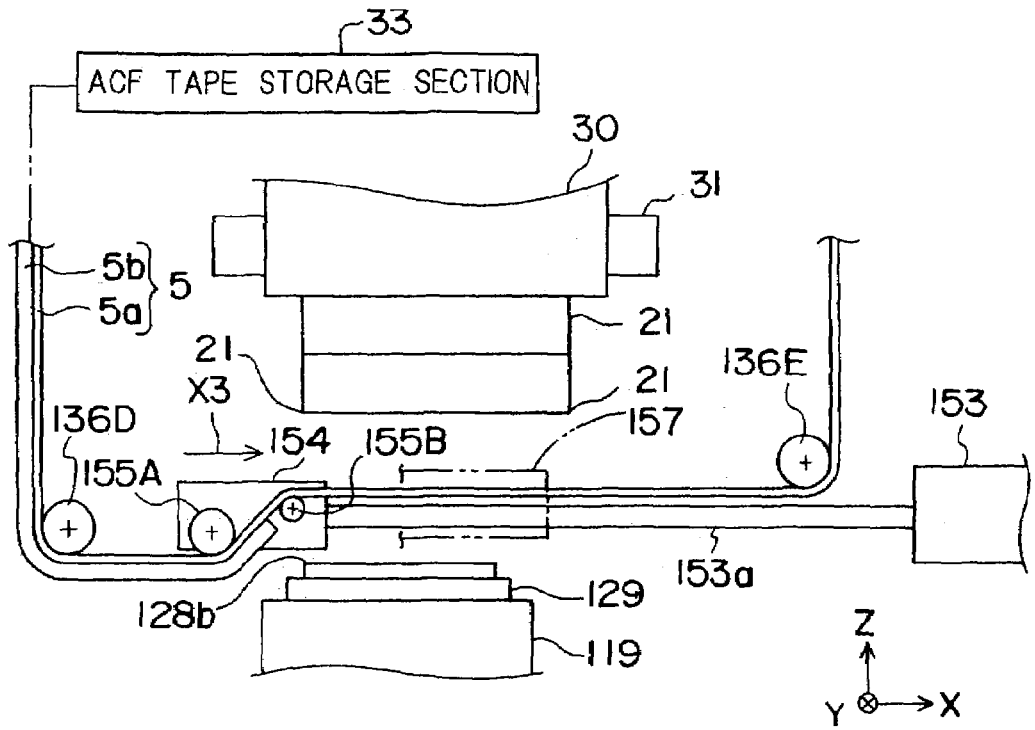

After spraying of the gas, at step S22-8, as indicated by the arrow X2 of FIG. 23D, the bracket 154 of the stripping section 124 moves leftward (as shown in this figure) in the horizontal direction (the −X direction). As shown in FIG. 23E, the bracket 154 moves the LCD board 129 mounted on the stage 19 crosswise from one end to another end. By this horizontal movement, the base layer 5a is stripped from the ACF layer 5b joined to the LCD board 129, whereby only the ACF layer 5b having already been cut remains on the LCD board 129.

Next, at step S22-9, as indicated by the arrow X3 of FIG. 23E, the bracket 154 of the stripping section 124 moves rightward (as shown in this figure) in the horizontal direction (the +X direction) and returns to its initial position (see FIG. 23D). In addition, at step S22-10, the ACF tape 5 is moved upward away from the LCD board 129 by upward movement of the ACF tape supplying section 23 and the stripping section 124, thereby returning to its initial position (see FIG. 23A).

Third Embodiment

Figure 25:
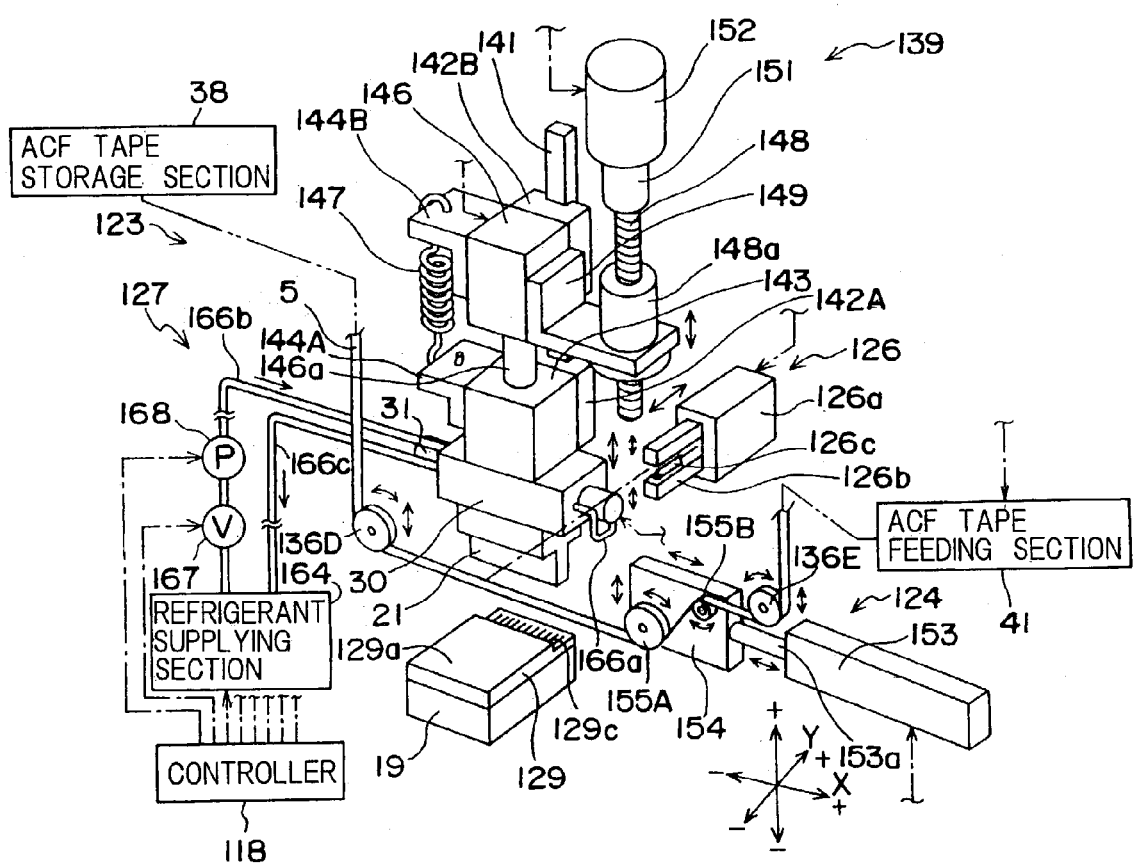
FIG. 25 is a perspective view showing an ACF applying apparatus in accordance with a third embodiment of the present invention.
Figure 26:
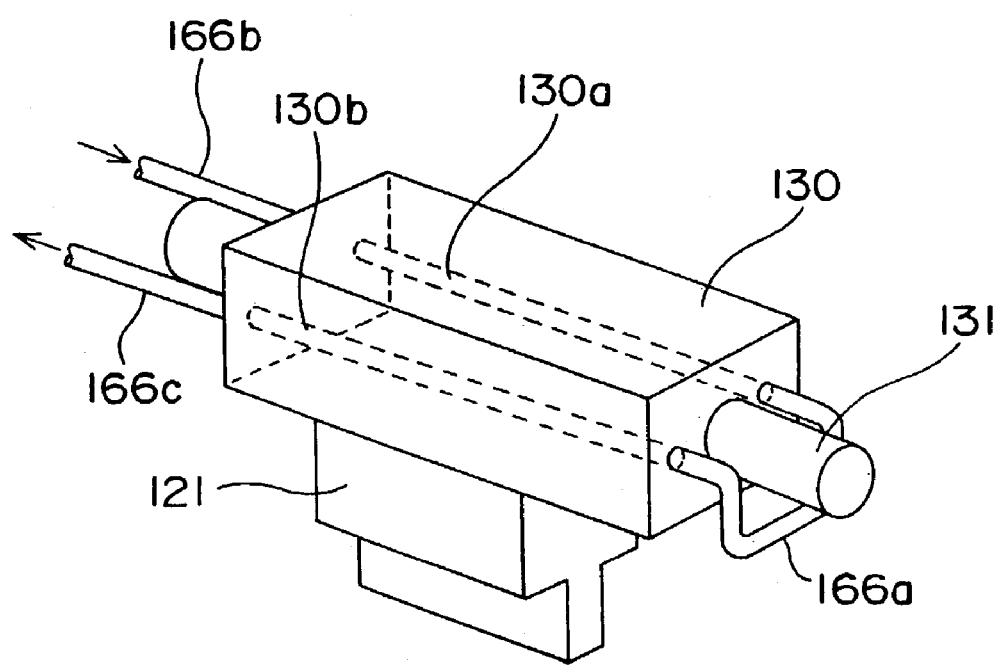
FIG. 26 is a perspective view showing a tool and a holder.

A mechanism of ACF tape cooling section 127 of a bonding sheet applying section in accordance with a third embodiment of the present invention shown in FIGS. 25 and 26 is different from that of the second embodiment. In other words, the ACF tape cooling section 127 comprises refrigerant passages 130a and 130b provided in a holding member 130, and a refrigerant supplying section 164 for supplying a refrigerant to the refrigerant passages 130a and 130b. The refrigerant passages 130a and 130b are provided so as to pass through the holding member 130 in parallel with heater 131. In addition, one end of the refrigerant passage 130a is connected to one end of the refrigerant passage 130b via a pipe 166a. Furthermore, other ends of the refrigerant passages 130a and 130b are connected to the refrigerant supplying section 164 via separate pipes 166b and 166c, respectively. One of the pipes, i.e., the pipe 166b, is provided with a valve 167 for controlling supply and shutoff of the refrigerant from the refrigerant supplying section 164 to the refrigerant passages 138a and 138b, and is also provided with a pump 168 for adjusting supply pressure of the refrigerant. The valve 167 and the pump 168 are controlled by the controller 18. The refrigerant may be liquid or gas. For example, air (atmospheric air), water and the like are suited for the refrigerant. Furthermore, a temperature of the refrigerant should only be room temperature (atmospheric temperature). However, the temperature may be less than room temperature to enhance an effect of cooling. In this case, it is necessary to provide a temperature controller for adjusting the temperature of the refrigerant.

In the third embodiment, the refrigerant passages 130a and 130b are not necessarily required to be installed in the holding member 130. Cooling passages may be formed in the tool 21 itself.

Other structures of the third embodiment are similar to those of the second embodiment, and same components are designated by same numerals.

Figure 27:
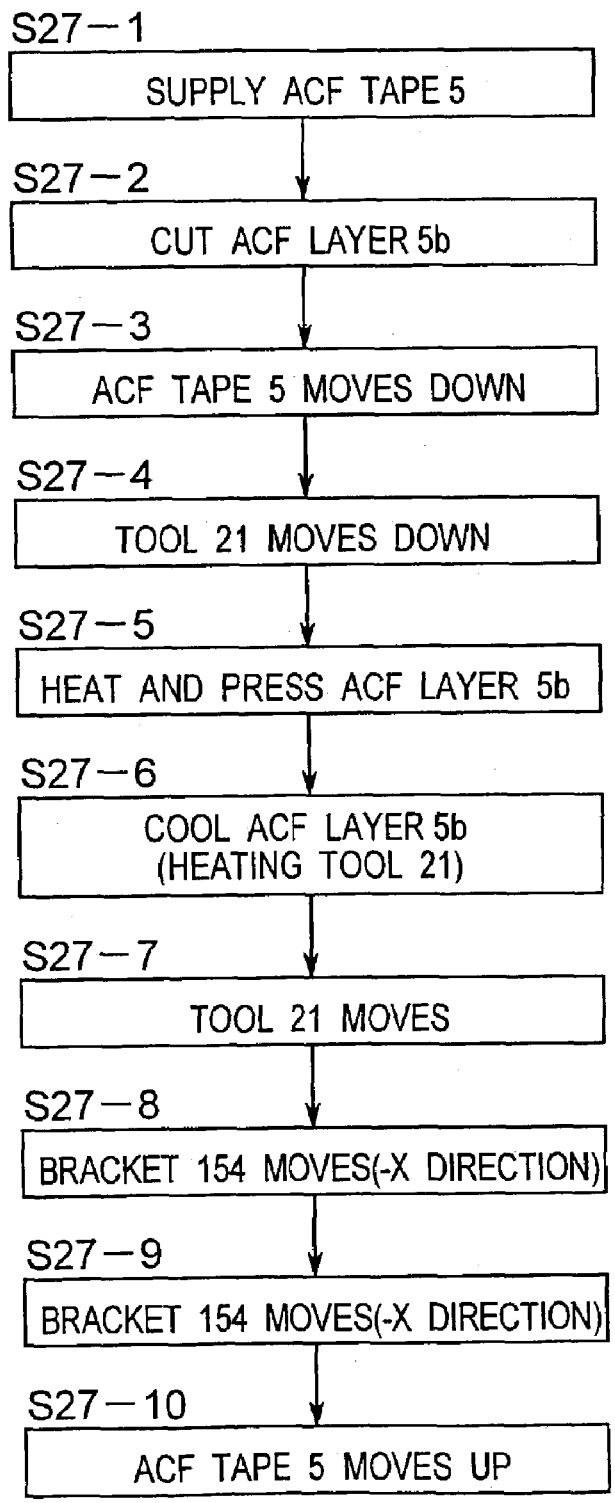
FIG. 27 is a flowchart for explaining operation of the ACF applying apparatus in accordance with the third embodiment.

Next, operation of the bonding sheet applying apparatus in accordance with the third embodiment will be described referring to the flowchart of FIG. 27. Operation from step S27-1 to step S27-5 is similar to that in the second embodiment. In other words, first, ACF tape 5 is supplied to electrode section 129c of LCD board 129 mounted on stage 19 (at step S27-1), ACF layer 5b is cut (at step S27-2), and the ACF tape 5 is moved downward and makes contact with electrode section 129c (at step S27-3). Then, the tool 21 is moved downward to the electrode section 129c (at step S27-4), and the ACF layer 5b having already been cut is pressurized and heated (at step S27-S).

Next, at step S27-6, the ACF layer 5b is cooled. While the ACF layer 5b is cooled, the tool 21 makes contact with the ACF tape 5 placed on the electrode section 129c, unlike the case of the second embodiment.

When the ACF layer 5b is cooled, the valve 167 is opened and the pump 168 is driven, whereby refrigerant is supplied from the refrigerant supplying section 164 to the refrigerant passages 130a and 130b. In other words, the refrigerant supplied from the refrigerant supplying section 164 passes through the pipe 166b, the refrigerant passage 130a, the pipe 166a, the refrigerant passage 130b and the pipe 166c, and returns to the refrigerant supplying section 164. In addition, while the refrigerant is supplied, the heater 31 is made inoperative.

The holding member 130 and the tool 21 are cooled to low temperature by the refrigerant supplied to the refrigerant passages 130a and 130b. Hence, the ACF tape 5 making contact with the tool 21 is cooled, whereby a temperature of the ACF layer 5b having already been cut and joined to the electrode section 129c of the LCD board 129 is lowered. When the ACF layer 5b having already been cut is cooled and its temperature is lowered, a joining strength of the ACF layer 5b to the electrode section 129c increases, just as in the case of the second embodiment. In addition, since the heater 31 is made inoperative as described above while the refrigerant is supplied, the holding member 130, the tool 21 and the ACF tape 5 can be cooled efficiently, whereby a cooling speed of the ACF layer 5b can be enhanced.

Operation after cooling of the ACF layer 5b is also similar to that in the second embodiment. In other words, the tool 21 is moved upward away from the electrode section 129c of the LCD board 129 (at step S27-7). Bracket 154 of stripping section 124 is reciprocated in the horizontal direction, whereby base layer 5a is stripped from the ACF layer 5b having already been cut and joined to the electrode section 129c (at steps S27-8 and S27-9). Then, the ACF tape 5 is moved upward away from the electrode section 129c of the LCD board 129 by upward movement of the ACF tape supplying section 23 and the stripping section 124, thereby returning to its initial position.

Fourth Embodiment

Figure 28:
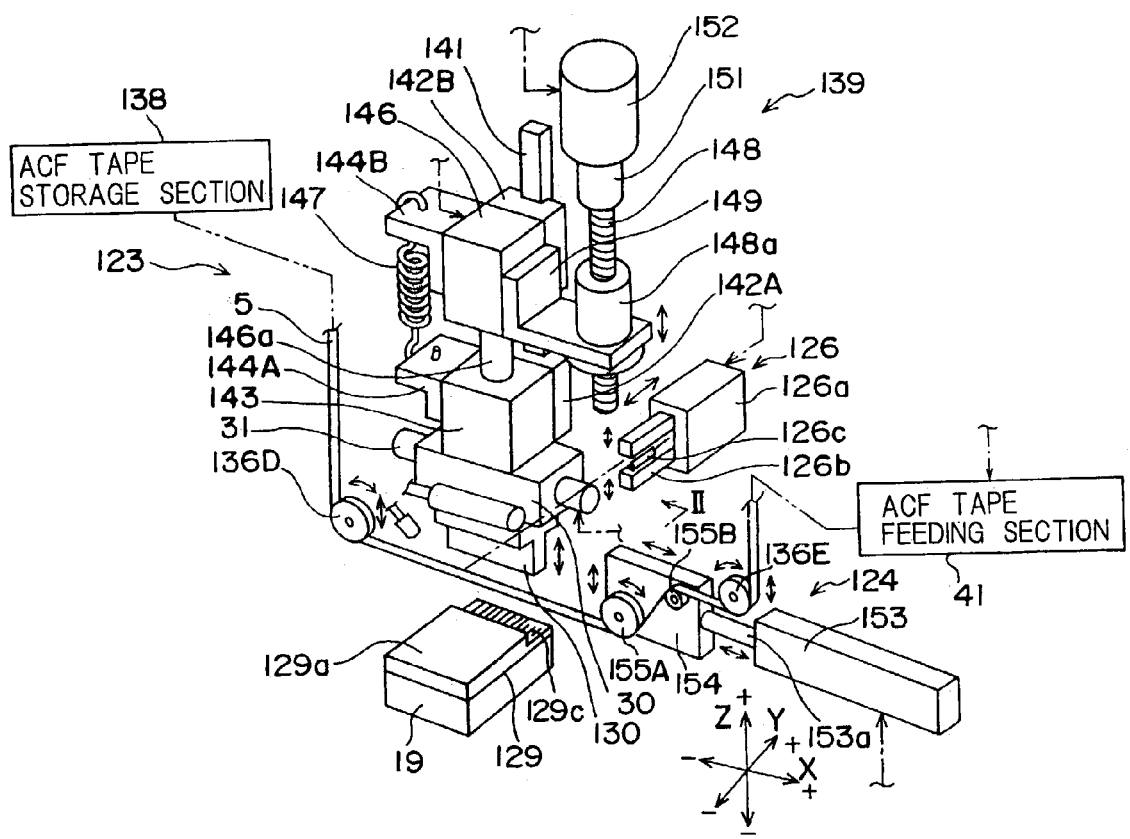
FIG. 28 is a perspective view showing an ACF applying apparatus in accordance with a fourth embodiment of the present invention.
Figure 29:
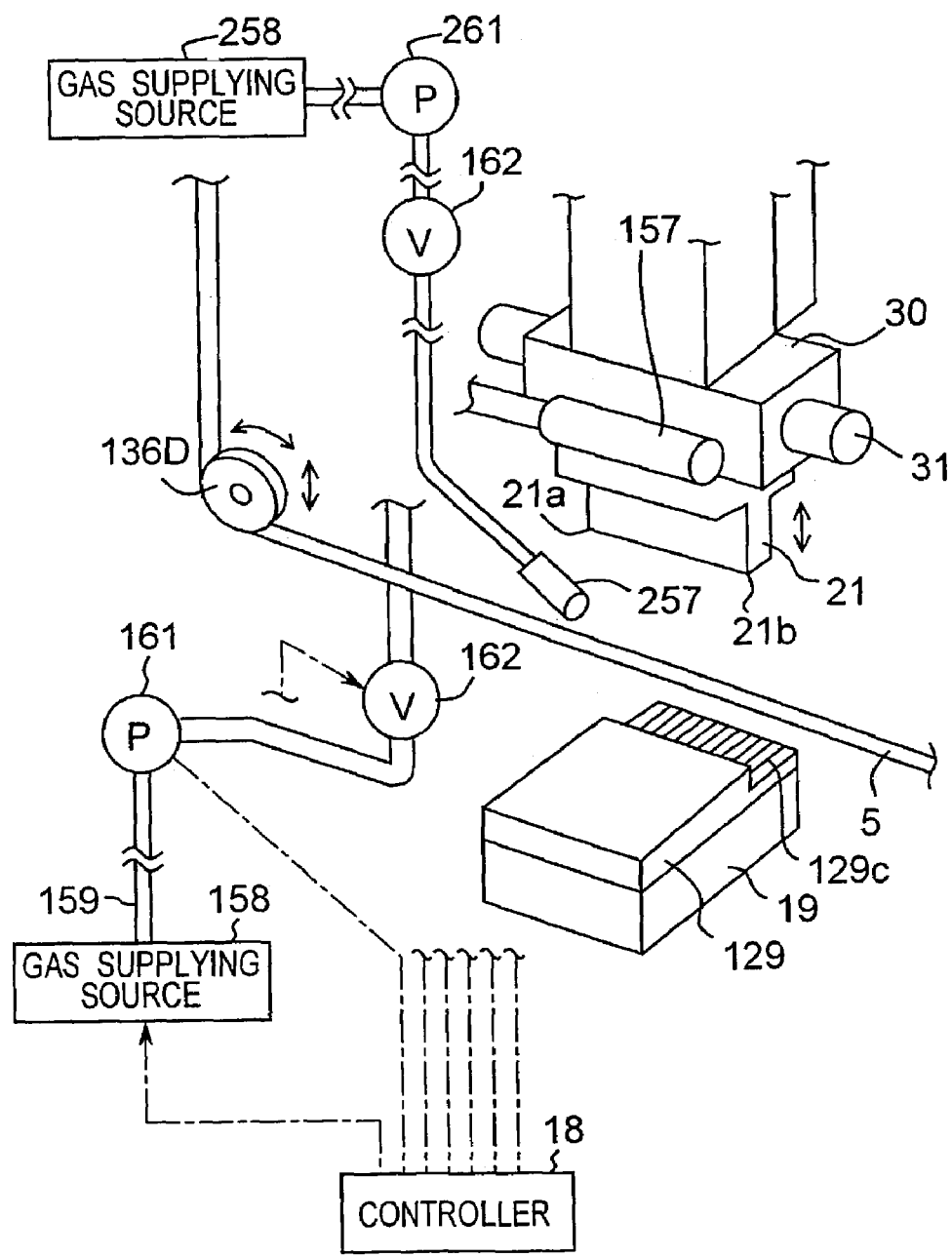
FIG. 29 is a partially enlarged perspective view showing an ACF applying apparatus in accordance with the fourth embodiment of the present invention.

Next, a bonding sheet applying apparatus in accordance with a fourth embodiment of the present invention will be described below referring to FIGS. 28 to 30.

Just as in the case of the second embodiment, this bonding sheet applying apparatus comprises a gas supplying section 158 and a nozzle 157 for spraying cooling air to a portion of ACF tape 5 corresponding to a range between fringes 21a and 21b of tool 21. The nozzle 157 is fixed to holding member 30 and is moved upward together with the tool 21.

Figure 30A:
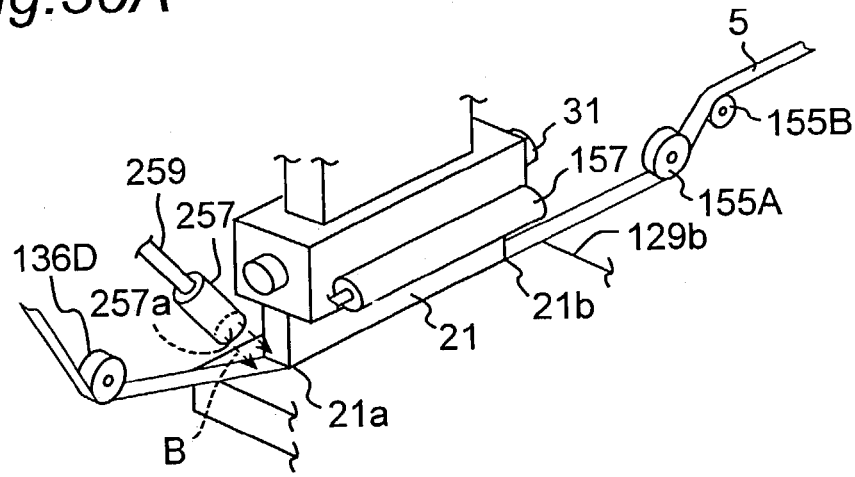

Furthermore, the bonding sheet applying apparatus comprises a nozzle 257 for locally spraying cooling air to a portion of slit 6 of the ACF tape 5. This nozzle 257 has a single ejection hole 257a at a front end thereof, and a base end thereof is connected to a gas supplying section 258 via a pipe 259. The pipe 259 is provided with a valve 262 for controlling supply and shutoff of gas from the gas supplying section 258 to the nozzle 257, and is also equipped with a pump 261 for adjusting supply pressure of the gas supplied to the nozzle 257. The nozzle 257 is disposed on the left side (as shown in FIG. 29) of the tool 21. The gas ejection hole 257a is directed rightward and obliquely downward (as shown in FIG. 30A). Gas ejected from the gas ejection hole 257a is sprayed to the portion of the slit 6 of the ACF tape 5 locally and intensively as described later.

As cooling gas to be supplied from the gas supplying section 258 to the nozzle 257, air (atmospheric air), clean air, nitrogen gas, and the like may be used. In addition, ions may be included in the cooling gas to eliminate static electricity from the LCD board 129. Furthermore, a temperature of the cooling gas should only be set at room temperature, or more, and less than a temperature of the ACF tape 5 that is heated by heating tool 21.

Controller 18 adjusts a flow rate of gas to be supplied from the gas supplying sections 158 and 258 and ejected from the nozzles 157 and 257, respectively, and also adjusts spraying timing of the gas to be sprayed to the ACF tape 5.

Figure 31:
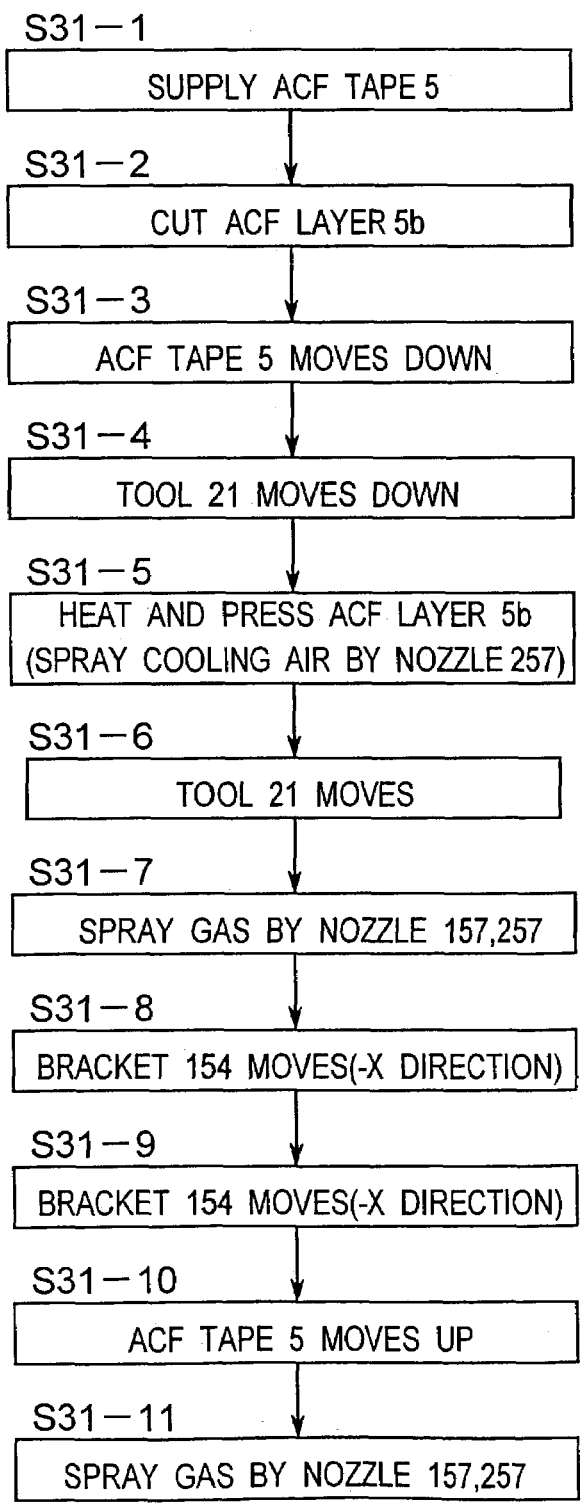
FIG. 31 is a flowchart for explaining operation of the ACF applying apparatus in accordance with the fourth embodiment.

Next, operation of the bonding sheet applying apparatus in accordance with the fourth embodiment will be described referring to the flowchart of FIG. 31. Operation from step S31-1 to step S31-4 is similar to that in the second embodiment. In other words, first, the ACF tape 5 is supplied to electrode section 129c of LCD board 129 mounted on stage 19 (at step S31-1), ACF layer 5b is cut to form a slit 6 (at step S31-2), and the ACF tape 5 is moved downward and makes contact with the electrode section 129c (at step S31-3). Then, the heating tool 21 is moved downward to the electrode section 129c (at step S31-4).

At step S31-5, as shown in FIG. 30A, the ACF layer 5b having already been cut by the tool 21 is pressurized against the electrode section 129c of the LCD board 129 and heated. While the ACF layer 5b is pressurized and heated by the tool 21, cooling gas is sprayed from the nozzle 157 to a portion of the slit 6 of the ACF tape 5 making contact with fringe 21a of the tool 21. In other words, valve 262 is opened and pump 261 is driven, whereby the gas supplied from the gas supplying section 258 is sprayed from the gas ejection hole 257a of the nozzle 257 to the portion of the slit 6 of the ACF tape 5 as indicated by dotted lines B.

Since the ACF tape 5 on the side of ACF tape feeding section 41 is held by chuck 185 during pressurizing and heating by the tool 21, high tension is applied to the ACF tape 5. Hence, if a temperature of a portion in the vicinity of the slit 6 rises excessively, the ACF tape 5 becomes longer, whereby a position of the slit 6 changes. Owing to this change in the position of the slit 6, a position of a front end of the ACF layer 5b changes at the time of a next application thereof. Hence, the ACF layer 5b cannot be applied to a predetermined accurate position with respect to the LCD board 129. However, by intensively cooling the portion of the slit 6 of the ACF tape 5 by using the gas ejected from the nozzle 157 during pressurizing and heating by the tool 21, the temperature of the portion is prevented from rising excessively. Hence, a change in the position of the slit 6 owing to elongation of the ACF tape 5 is prevented, whereby the ACF layer 5b can be applied to a predetermined accurate position with respect to the LCD board 129.

Figure 30B:
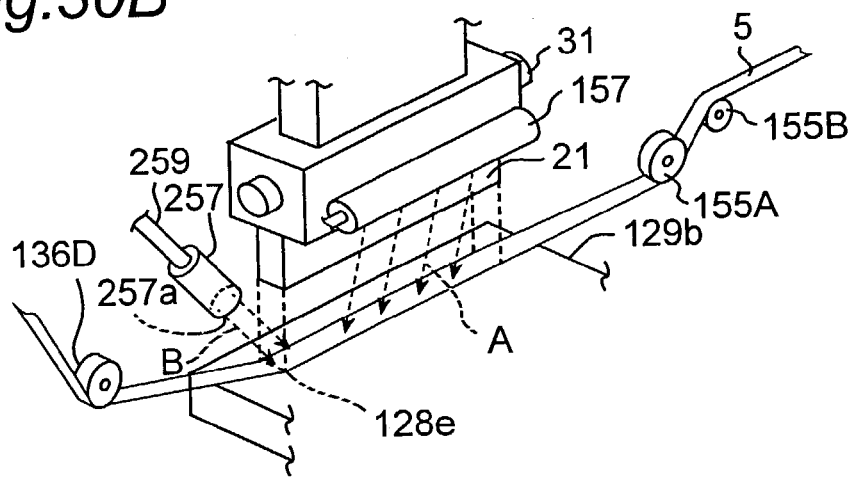

After this pressurizing and heating, the tool 21 is moved upward and returns to its initial position at step S31-5. At this time, as shown in FIG. 30B, the ACF layer 5b having already been cut at the slit 6 is joined to the electrode section 129c of the LCD board 129. Next, gas is sprayed from both nozzles 157 and 257 to the ACF tape 5.

First, cooling air is sprayed as indicated by dotted lines A from the nozzle 157 to a portion of the ACF tape 5 corresponding to a length between both fringes 21a and 21b of the tool 21, in other words, a portion of the ACF tape 5 corresponding to a length from a front end of the ACF layer 5b joined to the electrode section 129c of the LCD board 129 to the slit 6. By this spraying of the gas from the nozzle 157, the ACF layer 5b having already been cut and making contact with the electrode section 129c is cooled, whereby a joining strength between the ACF layer 5b having already been cut and the electrode section 129c increases.

In addition, air is sprayed to the portion corresponding to the slit 6 of the ACF tape 5 locally and intensively. Since the slit 6 corresponds to the fringe 21a of the tool 21, a pressurizing force applied by the tool 21 is insufficient at the portion of the slit 6, whereby it is difficult to sufficiently increase a joining strength between a bonding layer and an object. However, by intensively cooling the portion of the slit 6 by using the gas ejected from the nozzle 257, the joining strength between the ACF layer 5b and the LCD board 129 can be increased effectively.

The bracket 154 of the stripping section 124 is reciprocated in the horizontal direction, whereby the base layer 5a is stripped from the ACF layer 5b having already been cut and joined to the electrode section 129c, thereby completing application (at steps S31-8 and S31-9). Since the joining strength of the ACF layer 5b is increased by cooling the ACF tape 5 by using the gas sprayed from the nozzles 157 and 257 as described above, the ACF layer 5b having already been cut can be prevented from being stripped from the electrode section 129c when the base layer 5a is stripped. Since the portion of the slit 6 is cooled intensively in particular, stripping and tearing of the ACF layer 5b can be prevented securely at this portion. Since stripping and tearing of the ACF layer 5b can be prevented, a movement speed of the bracket 154 in the –X direction at step S31-8, i.e., a speed of the stripping of the base layer 5a, can be increased.

Figure 30C:
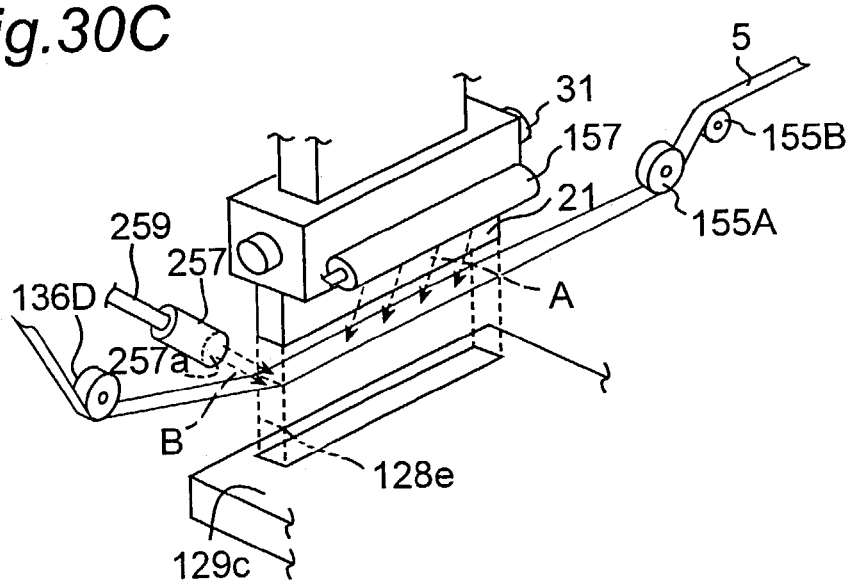

After application of the ACF layer 5b is completed, at step S31-10, the ACF tape 5 is moved upward by the upward movement of the ACF tape supplying section 23 and the stripping section 124, thereby returning to its initial position as shown in FIG. 30C. Next, the gas is sprayed from both the nozzles 157 and 257 to the ACF tape 5. Even after application of the ACF layer 5b is completed, the gas is sprayed from both the nozzles 157 and 257 in order to cool the ACF tape 5, whereby excessive temperature rise of the ACF layer 5b can be prevented securely. In particular, the portion of the slit 6, in other words, the portion of the ACF layer 5b that is used as the front end of the ACF layer 5b at the time of a next application thereof, is intensively cooled by the gas sprayed from the nozzle 257, whereby temperature rise at this portion can be prevented securely.

Configurations and placement positions of the nozzles 157 and 257 are not limited particularly. The nozzle 157 should only be able to spray gas efficiently to a portion of the ACF tape 5 corresponding to the tool 21. In addition, the nozzle 257 should only be able to spray gas efficiently to the portion of the slit 6 of the ACF tape 5.

The apparatuses and methods in accordance with the present invention are also applicable to components other than the PDP board 11 and the LCD board 129, for example, electroluminescence devices (EL devices) and ordinary printed circuit boards. More particularly, the apparatuses and methods can be used to pressurize and apply various bonding sheets other than ACF tape to the above-mentioned components. In addition, the apparatuses and methods can also be used to pressurize and fix components, such as electronic and optical components, to the above-mentioned components. Furthermore, the apparatuses and methods can be used to apply ACF layers for joining bare-chip type IC chips having metallic bumps serving as electrodes, for example, to circuit boards.

While the invention has been described fully referring to the accompanying drawings, it is obvious that changes and modifications can be made by those skilled in the art. It is therefore construed that such changes and modifications are included in the invention without departing from the spirit and scope of the invention.

The invention claimed is:

1. A method for pressurizing a second component against a first component, comprising:
   arranging a tool, protective sheet, first component, and second component relative to one another such that at a first position of said tool,
   (i) said protective sheet and said second component are between said tool and said first component,
   (ii) said tool is spaced from said protective sheet, and
   (iii) said protective sheet is spaced from said second component;
   causing said tool and said first component to relatively approach one another such that at a second position of said tool,
   (i) said tool and said protective sheet contact one another,
   (ii) said protective sheet and said another second component contact one another, and
   (iii) said first component and said second component contact one another, whereby said tool presses said second component against said first component by way of said protective sheet;
   causing said tool and said first component to relatively move away from one another in a first direction such that said tool returns to said first position;
   moving said protective sheet in a second direction perpendicular to said first direction; and
   moving said second component in a third direction opposite to said second direction.

2. The method according to claim 1, further comprising:
   guarding said protective sheet by a pin when said tool is at said second position such that said protective sheet makes close contact with a fringe of said tool.

3. The method according to claim 1, wherein
   arranging a tool, protective sheet, first component, and second component relative to one another comprises arranging said tool, an elastic protective sheet, said first component, and a bonding sheet having at least a base layer and a bonding layer relative to one another.

4. A method for pressurizing a second component against a first component, comprising:
   arranging a tool, protective sheet, first component, and second component relative to one another such that at a first position of said tool,
   (i) said protective sheet and said second component are between said tool and said first component,
   (ii) said tool is spaced from said protective sheet,
   (iii) said protective sheet is spaced from said second component, and
   (iv) said second component is in contact with said first component;
   causing said tool and said first component to relatively approach one another such that at a second position of said tool,
   (i) said tool and said protective sheet contact one another, and
   (ii) said protective sheet and said second component contact one another,
   whereby said tool presses said second component against said first component by way of said protective sheet with a force of from 300 N/cm² to 400 N/cm²;
   causing said tool and said first component to relatively move away from one another in a first direction such that said tool returns to said first position; after said tool returns to said first position, and with said tool, said protective sheet, said first component, and another second component arranged relative to one another such that
   (i) said protective sheet and said another second component are between said tool and said first component,
   (ii) said tool is spaced from said protective sheet,
   (iii) said protective sheet is spaced from said another second component, and
   (iv) said another second component is in contact with said first component,
   causing said tool and said first component to relatively approach one another such that at said second position of said tool,
   (i) said tool and said protective sheet contact one another, and
   (ii) said protective sheet and said another second component contact one another,
   whereby said tool presses said another second component against said first component by way of said protective sheet with a force of from 300 N/cm² to 400 N/cm²; then
   causing said tool and said first component to relatively move away from one another in said first direction such that said tool returns to said first position;
   counting a number of times said tool and said first component have relatively approached one another; and
   moving said protective sheet in a second direction perpendicular to said first direction after said number of times reaches a predetermined value.

5. The method according to claim 4, further comprising:
   guiding said protective sheet by a pin when said tool is at said second position such that said protective sheet makes close contact with a fringe of said tool.

6. The method according to claim 4, wherein
   arranging a tool, protective sheet, first component, and second component relative to one another comprises arranging said tool, an elastic protective sheet, said first component, and said second component relative to one another.

7. The method according to claim 4, wherein
   said tool presses said second component and said another second component against said first component, by way of said protective sheet, at a temperature of from 180° C. to 200° C.

8. The method according to claim 7, further comprising:
   spraying a cooling gas to a portion of said protective sheet corresponding to a fringe of said tool when said tool is at said first position.

9. The method according to claim 8, wherein
   said protective sheet is wound on a reel such that moving said protective sheet in said second direction comprises unwinding said protective sheet from said reel.

10. A method for pressurizing a second component against a first component, comprising:
    arranging a tool, protective sheet, first component, and second component relative to one another such that at a first position of said tool,
    (i) said protective sheet and said second component are between said tool and said first component,
    (ii) said tool is spaced from said protective sheet,
    (iii) said protective sheet is spaced from said second component, and
    (iv) said second component is spaced from said first component;

causing said tool and said first component to relatively approach one another such that at a second position of said tool,
- (i) said tool and said protective sheet contact one another,
- (ii) said protective sheet and said second component contact one another, and
- (iii) said second component and said first component contact one another, whereby said tool presses said second component against said first component by way of said protective sheet with a force of from 50 N/cm² to 100 N/cm²;

causing said tool and said first component to relatively move away from one another in a first direction such that said tool returns to said first position;

after said tool returns to said first position, and with said tool, said protective sheet, said first component, and another second component arranged relative to one another such that
- (i) said protective sheet and said another second component are between said tool and said first component,
- (ii) said tool is spaced from said protective sheet,
- (iii) said protective sheet is spaced from said another second component, and
- (iv) said another second component is spaced from said first component, causing said tool and said first component to relatively approach one another such that at said second position of said tool,
  - (i) said tool and said protective sheet contact one another,
  - (ii) said protective sheet and said another second component contact one another, and
  - (iii) said another second component and said first component contact one another, whereby said tool presses said another second component against said first component by way of said protective sheet with a force of from 50 N/cm² to 100 N/cm²; then causing said tool and said first component to relatively move away from one another in said first direction such that said tool returns to said first position;

counting a number of times said tool and said first component have relatively approached one another; and moving said protective sheet in a second direction perpendicular to said first direction after said number of times reaches a predetermined value.

11. The method according to claim 10, further comprising:
guiding said protective sheet by a pin when said tool is at said second position such that said protective sheet makes close contact with a fringe of said tool.

12. The method according to claim 10, wherein
arranging a tool, protective sheet, first component, and second component relative to one another comprises arranging said tool, an elastic protective sheet, said first component, and said second component relative to one another.

13. The method according to claim 10, wherein
said tool presses said second component and said another second component against said first component, by way of said protective sheet, at a temperature of from 60° C. to 70° C.

14. The method according to claim 13, further comprising:
spraying a cooling gas to a portion of said protective sheet corresponding to a fringe of said tool when said tool is at said first position.

15. The method according to claim 14, wherein said second component and said another second component correspond to different portions of a member wound on a reel, and further comprising:
feeding said second component and said another second component, in a third direction, to a position between said tool and said first component by unwinding said member from said reel.

16. The method according to claim 15, wherein
said protective sheet is wound on another reel such that moving said protective sheet in said second direction comprises unwinding said protective sheet from said another reel,
with said second direction being opposite to said third direction.

* * * * *